US012765360B2

(12) United States Patent
Su

(10) Patent No.: US 12,765,360 B2
(45) Date of Patent: Oct. 13, 2026

(54) SEMICONDUCTOR DEVICE WITH LINER STRUCTURE AND METHOD FOR FABRICATING THE SAME

(71) Applicant: NANYA TECHNOLOGY CORPORATION, New Taipei City (TW)

(72) Inventor: Kuo-Hui Su, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 365 days.

(21) Appl. No.: 18/585,484

(22) Filed: Feb. 23, 2024

(65) Prior Publication Data

US 2025/0246542 A1 Jul. 31, 2025

Related U.S. Application Data

(62) Division of application No. 18/425,115, filed on Jan. 29, 2024.

(51) Int. Cl.

| | |
|---|---|
| ***H10W 20/43*** | (2026.01) |
| ***H10B 12/00*** | (2023.01) |
| ***H10W 20/00*** | (2026.01) |
| ***H10W 20/46*** | (2026.01) |

(52) U.S. Cl.

CPC ........ *H10W 20/43* (2026.01); *H10B 12/0335* (2023.02); *H10B 12/482* (2023.02); *H10W 20/063* (2026.01); *H10W 20/072* (2026.01); *H10W 20/098* (2026.01); *H10W 20/46* (2026.01)

(58) Field of Classification Search

None

See application file for complete search history.

(56) References Cited

U.S. PATENT DOCUMENTS

2019/0378909 A1* 12/2019 Cheng .................. H10D 64/017
2021/0265267 A1 8/2021 Wu
2021/0335792 A1* 10/2021 Su ...................... H10B 12/0335

(Continued)

FOREIGN PATENT DOCUMENTS

TW 201911538 A 3/2019
TW 202107660 A 2/2021
TW 202123461 A 6/2021

(Continued)

OTHER PUBLICATIONS

Office Action and and the search report mailed on Dec. 24, 2024 related to Taiwanese Application No. 113111710.

(Continued)

*Primary Examiner* — Daniel Whalen
(74) *Attorney, Agent, or Firm* — Xuan Zhang

(57) ABSTRACT

The present application discloses a semiconductor device including a substrate, a contact, a landing pad, a bit line, and an air gap. The contact is disposed over the substrate. The landing pad is disposed over the contact. The landing pad includes a plug, a first spacer, and a second spacer. The plug is disposed over and in contact with the contact. The first spacer is disposed over the plug. The second spacer is sandwiching a protruding portion of the plug. The bit line is disposed over the substrate. The air gap is disposed between the contact and the bit line.

12 Claims, 62 Drawing Sheets

(56) References Cited

U.S. PATENT DOCUMENTS

2021/0351187 A1* 11/2021 Chen .................. H10B 12/0335

FOREIGN PATENT DOCUMENTS

| | | | |
|---|---|---|---|
| TW | 202139408 | A | 10/2021 |
| TW | 202141733 | A | 11/2021 |
| TW | 202141736 | A | 11/2021 |
| TW | 202213740 | A | 4/2022 |

OTHER PUBLICATIONS

Office Action and and the search report mailed on Dec. 11, 2025 related to Taiwanese Application No. 113145013.

Summary translation of Office Action and and the search report mailed on Dec. 11, 2025 related to Taiwanese Application No. 113145013.

* cited by examiner

SEMICONDUCTOR DEVICE WITH LINER STRUCTURE AND METHOD FOR FABRICATING THE SAME

CROSS-REFERENCE TO RELATED APPLICATION

This application is a divisional application of U.S. Non-Provisional application Ser. No. 18/425,115 filed Jan. 29, 2024, which is incorporated herein by reference in its entirety.

TECHNICAL FIELD

The present disclosure relates to a semiconductor device and a method for fabricating the same, and more particularly, to a semiconductor device with liner structures and a method for fabricating the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device, including a substrate, a contact, a landing pad, a bit line, and an air gap. The contact is disposed over the substrate. The landing pad is disposed over the contact. The landing pad includes a plug, a first spacer, and a second spacer. The plug is disposed over and in contact with the contact. The first spacer is disposed over the plug. The second spacer is sandwiching a protruding portion of the plug. The bit line is disposed over the substrate. The air gap is disposed between the contact and the bit line.

Another aspect of the present disclosure provides a semiconductor device, including a substrate, an etch stop layer, a first lower plug, a second lower plug, a first upper plug, a second upper plug, and an air gap. The etch stop layer is disposed over the substrate. The first lower plug and a second lower plug are disposed over the substrate and protruding from a top surface of the etch stop layer. The first upper plug and a second upper plug are disposed over the first lower plug and the second lower plug, respectively. The air gap is disposed between the first upper plug and the second upper plug. A top surface of the first lower plug is rounded. The first upper plug is in contact with a first sidewall of the first lower plug.

Another aspect of the present disclosure provides a method for fabricating a semiconductor device, including: providing a substrate; forming a contact over the substrate; forming a bit line over the substrate; forming a liner structure enclosing an air gap, wherein the liner structure is formed between the contact and the bit line; and forming a landing pad over the contact, comprising: forming a barrier layer; forming a plug in contact with the contact; and forming a first spacer and a second spacer over the plug. The first spacer is disposed over the plug, and the second spacer sandwiches a protruding portion of the plug.

Embodiments of a semiconductor device structure and method for preparing the same are provided in the disclosure. In some embodiments, the semiconductor device structure includes a first dielectric liner portion disposed adjacent to a first interconnect structure, and a second dielectric liner portion disposed adjacent to a second interconnect structure. The semiconductor device structure also includes a filling portion surrounded by the second dielectric liner portion, and an air gap is enclosed in the first dielectric liner portion, which helps to reduce the capacitive coupling between adjacent interconnect structures, and resistance-capacitance (RC) delay can be decreased. As a result, performance (e.g., operation speed) and reliability of the semiconductor device structure can be improved.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
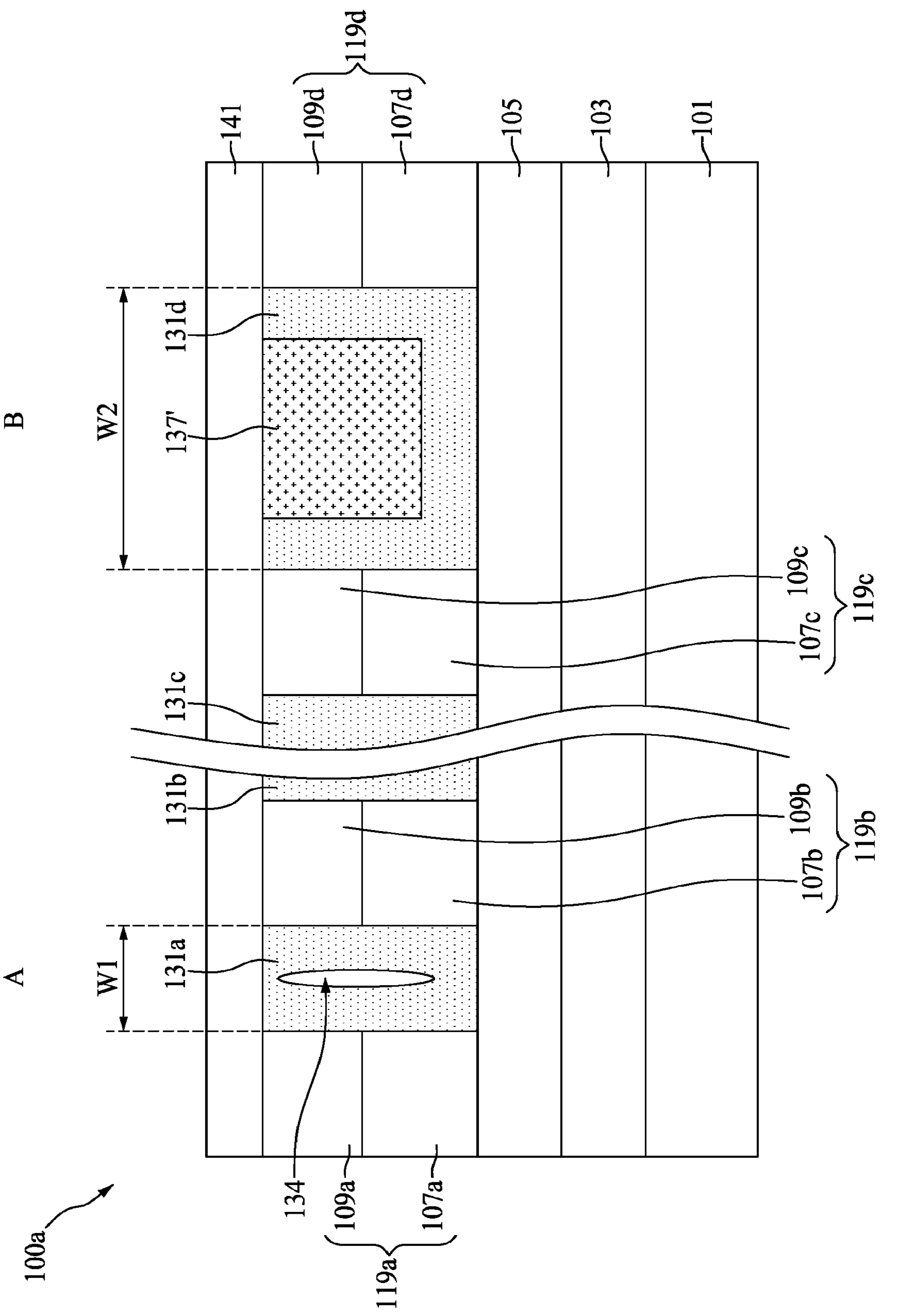
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100*a*, in accordance with some embodiments. As shown in FIG. 1, the semiconductor device structure 100*a* includes a semiconductor substrate 101, a first dielectric layer 103 disposed over the semiconductor substrate 101, and a second dielectric layer 105 disposed over the first dielectric layer 103, in accordance with some embodiments. In some embodiments, the semiconductor device structure 100*a* also includes a plurality of interconnect structures 119*a*, 119*b*, 119*c*, and 119*d* disposed over the second dielectric layer 105.

In some embodiments, the interconnect structures 119*a*, 119*b*, 119*c*, and 119*d* are separated from each other. Each of the interconnect structures 119*a*, 119*b*, 119*c*, and 119*d* includes a first conductive portion and a second conductive portion disposed over the first conductive portion. For example, the interconnect structure 119*a* includes a first conductive portion 107*a* and a second conductive portion 109*a*, the interconnect structure 119*b* includes a first conductive portion 107*b* and a second conductive portion 109*b*, the interconnect structure 119*c* includes a first conductive portion 107*c* and a second conductive portion 109*c*, and the interconnect structure 119*d* includes a first conductive portion 107*d* and a second conductive portion 109*d*.

In some embodiments, the semiconductor device structure 100*a* includes dielectric liner portions 131*a*, 131*b*, 131*c*, and 131*d* disposed over the second dielectric layer 105. Each of the dielectric liner portions 131*a*, 131*b*, 131*c*, and 131*d* is disposed between two adjacent interconnect structures. In some embodiments, each of the dielectric liner portions 131*a*, 131*b*, 131*c*, and 131*d* is in direct contact with the first conductive portions and the second conductive portions of the two adjacent interconnect structures. In some embodiments, an air gap 134 is enclosed in the dielectric liner portion 131*a*, and a filling portion 137' is surrounded by the dielectric liner portion 131*d*.

In some embodiments, the filling portion 137' is separated from the second dielectric layer 105 by the dielectric liner portion 131*d*. In some embodiments, the filling portion 137' is separated from the two adjacent interconnect structures 119*c* and 119*d* by the dielectric liner portion 131*d*. In addition, the semiconductor device structure 100*a* includes a cover layer 141 disposed over the interconnect structures 119*a*, 119*b*, 119*c*, 119*d*, the dielectric liner portions 131*a*, 131*b*, 131*c*, 131*d*, and the filling portion 137'. In some embodiments, the cover layer 141 is in direct contact with the top surfaces of the interconnect structures 119*a*, 119*b*, 119*c*, 119*d* (i.e., the top surfaces of the second conductive portions 109*a*, 109*b*, 109*c*, 109*d*), the top surfaces of the dielectric liner portions 131*a*, 131*b*, 131*c*, 131*d*, and the top surface of the filling portion 137'.

Moreover, the semiconductor device structure 100*a* has a first region A and a second region B. In some embodiments, the interconnect structures 119*a* and 119*b*, the dielectric liner portions 131*a* and 131*b*, and the air gap 134 are in the first region A. In some embodiments, the interconnect structures 119*c* and 119*d*, the dielectric liner portions 131*c* and 131*d*, and the filling portion 137' are in the second region B.

As shown in FIG. 1, the space between the interconnect structures 119*a* and 119*b* is occupied by the dielectric liner portion 131*a* and the air gap 134, and the space between the interconnect structures 119*c* and 119*d* is occupied by the dielectric liner portion 131*d* and the filling portion 137', in accordance with some embodiments. Since the space occupied by the dielectric liner portion 131*a* and the air gap 134 is smaller than the space occupied by the dielectric liner portion 131*d* and the filling portion 137', the first region A is also referred to as a small gap-fill region, and the second region B is also referred to as a large gap-fill region.

In some embodiments, in the cross-sectional view of FIG. 1, the space occupied by the dielectric liner portion 131*a* and the air gap 134 has a width W1, and the space occupied by the dielectric liner portion 131*d* and the filling portion 137' has a width W2, and the width W2 is greater than the width W1. The width W1 is also referred to as the bottom width of the dielectric liner portion 131*a*, and the width W2 is also referred to as the bottom width of the dielectric liner portion 131*d*. In some embodiments, the bottom width W2 of the dielectric liner portion 131*d* in the large gap-fill region B is greater than the bottom width W1 of the dielectric liner portion 131*a* in the small gap-fill region A.

In FIG. 1, four interconnect structures 119*a*, 119*b*, 119*c*, 119*d* and four dielectric liner portions 131*a*, 131*b*, 131*c*, 131*d* are illustrated. However, the numbers are not limited thereto. In some other embodiments, the numbers of the interconnect structures and the dielectric liner portions may be adjusted based on design requirement. Similarly, in FIG. 1, one air gap 134 is illustrated in the small gap-fill region A, and one filling portion 137' is illustrated in the large gap-fill region B. It should be noted that the numbers are not limited thereto. For example, in some other embodiments, the number of the air gap in the small gap-fill region A and the number of the filling portion in the large gap-fill region B may be adjusted based on design requirement.

Figure 2:
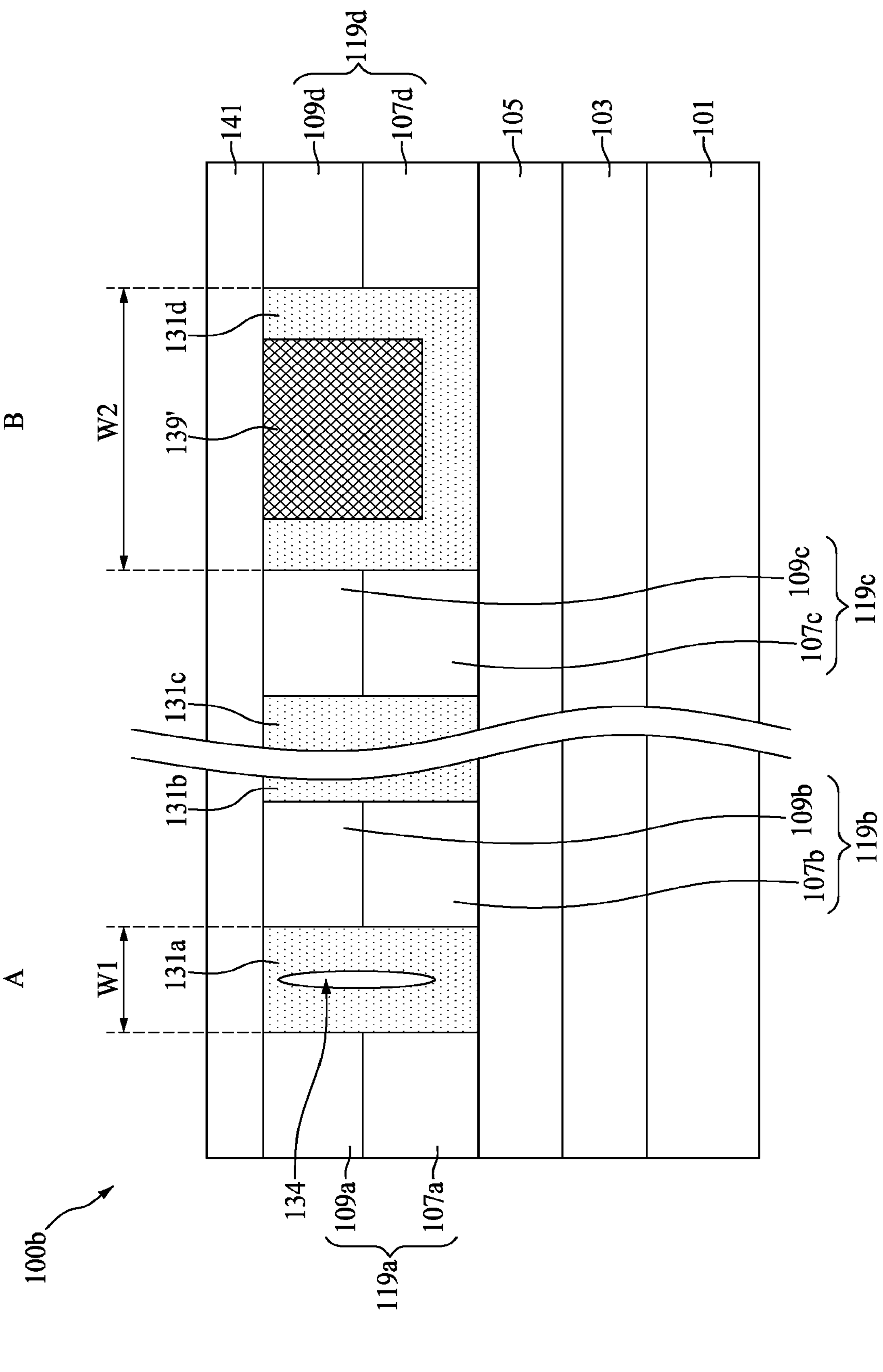
FIG. 2 is a cross-sectional view illustrating a semiconductor device structure, in accordance with some embodiments.

FIG. 2 is a cross-sectional view illustrating a semiconductor device structure 100*b*, in accordance with some embodiments. The semiconductor device structure 100*b* is similar to the semiconductor device structure 100*a*. However, in the semiconductor device structure 100*b*, the filling portion 137' is replaced by another filling portion 139', and the materials of the filling portions 137' and 139' are different, in accordance with some embodiments.

In some embodiments, the filling portion 137' of the semiconductor device structure 100*a* includes a low-k dielectric material, and the filling portion 139' of the semiconductor device structure 100*b* includes an energy removable material. In some embodiments, the filling portion 139' including the energy removable material is surrounded by the dielectric liner portion 131*d*. Details regarding this embodiment that are similar to those for the previously described embodiment will not be repeated herein.

Figure 3:
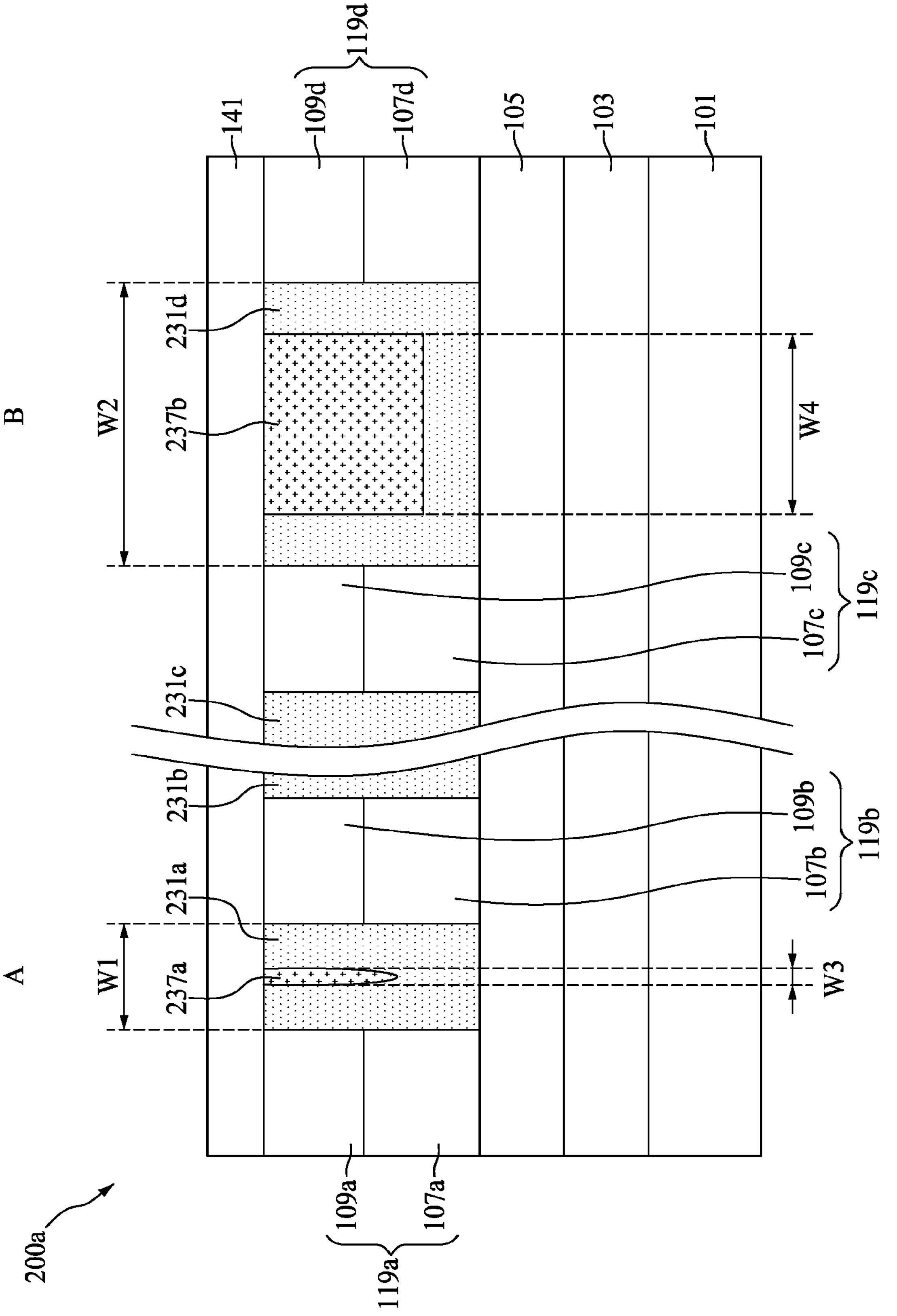
FIG. 3 is a cross-sectional view illustrating a semiconductor device structure, in accordance with some embodiments.

FIG. 3 is a cross-sectional view illustrating a semiconductor device structure 200*a*, in accordance with some embodiments. The semiconductor device structure 200*a* is similar to the semiconductor device structure 100*a*. However, in the semiconductor device structure 200*a*, dielectric liner portions 231*a* and 231*b* are formed in the first region A (i.e., the small gap-fill region), dielectric liner portions 231*c* and 231*d* are formed in the second region B (i.e., the large gap-fill region), a filling portion 237*a* is surrounded by the dielectric liner portion 231*a*, and a filling portion 237*b* is surrounded by the dielectric liner portion 231*d*. In the semiconductor device structure 200*a*, there is no air gap in the dielectric liner portion 231*a* of the first region A.

Similar to the semiconductor device structure 100*a*, the bottom width W2 of the dielectric liner portion 231*d* is greater than the bottom width W1 of the dielectric liner portion 231*a*, in accordance with some embodiments. Moreover, in some embodiments, the materials of the filling portions 237*a* and 237*b* are the same. For example, the filling portions 237*a* and 237*b* include a low-k dielectric material.

In some embodiments, the filling portion 237*a* in the first region A has a width W3, the filling portion 237*b* in the second region B has a width W4, and the width W4 is greater than the width W3. In some embodiments, the cover layer 141 is in direct contact with the top surfaces of the filling portions 237*a* and 237*b*. Details regarding this embodiment that are similar to those for the previously described embodiment will not be repeated herein.

Figure 4:
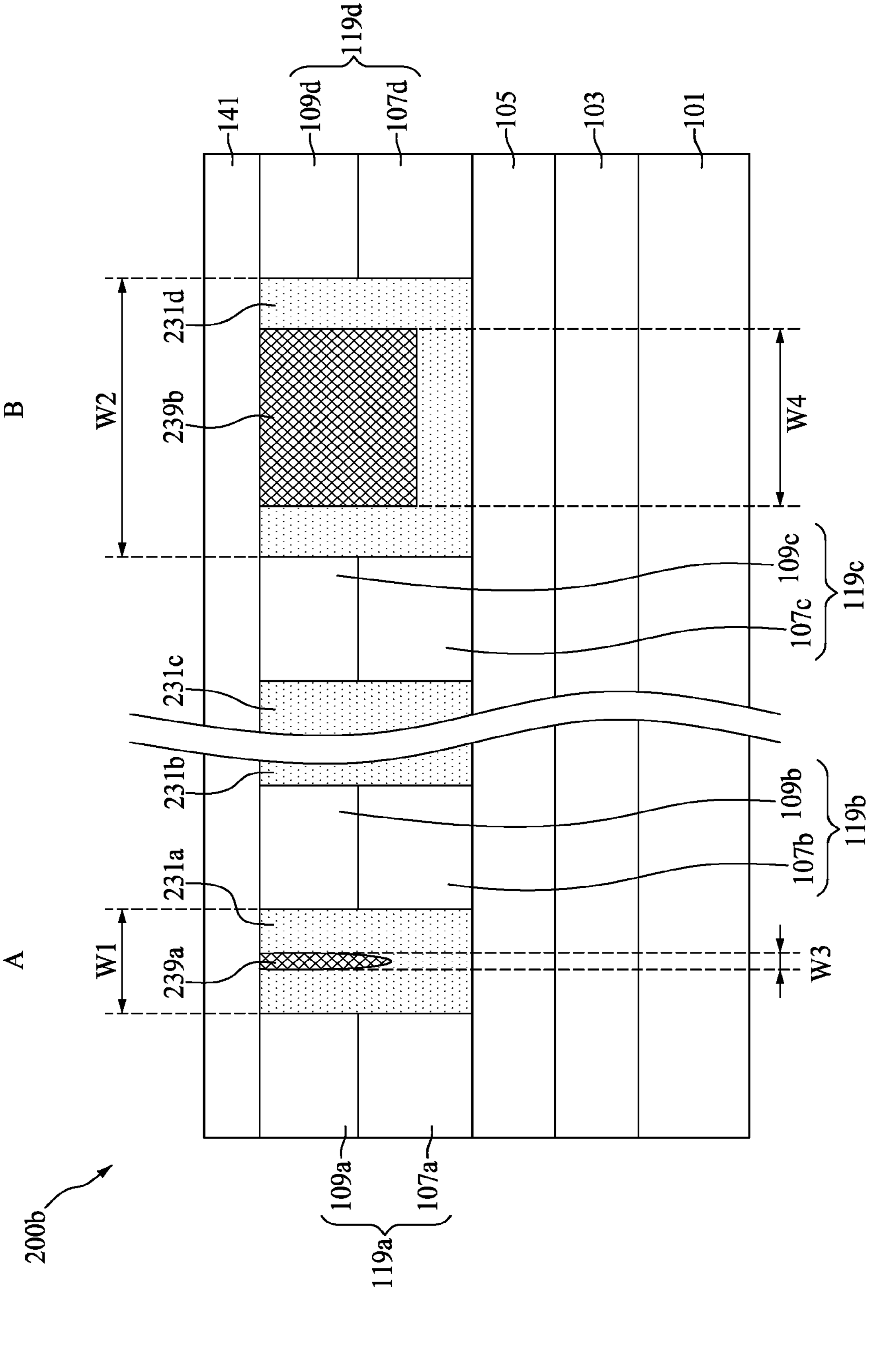
FIG. 4 is a cross-sectional view illustrating a semiconductor device structure, in accordance with some embodiments.

FIG. 4 is a cross-sectional view illustrating a semiconductor device structure 200*b*, in accordance with some embodiments. The semiconductor device structure 200*b* is similar to the semiconductor device structure 200*a*. However, in the semiconductor device structure 200*b*, the filling portions 237*a* and 237*b* are replaced by filling portions 239*a* and 239*b*, respectively. The materials of the filling portions 239*a* and 239*b* are the same, but different from that of the filling portions 237*a* and 237*b* in the semiconductor device structure 200*a*, in accordance with some embodiments.

In some embodiments, the filling portions 237*a* and 237*b* of the semiconductor device structure 200*a* include a low-k dielectric material, and the filling portions 239*a* and 239*b* of the semiconductor device structure 200*b* include an energy removable material. Details regarding this embodiment that are similar to those for the previously described embodiment will not be repeated herein.

Figure 5:
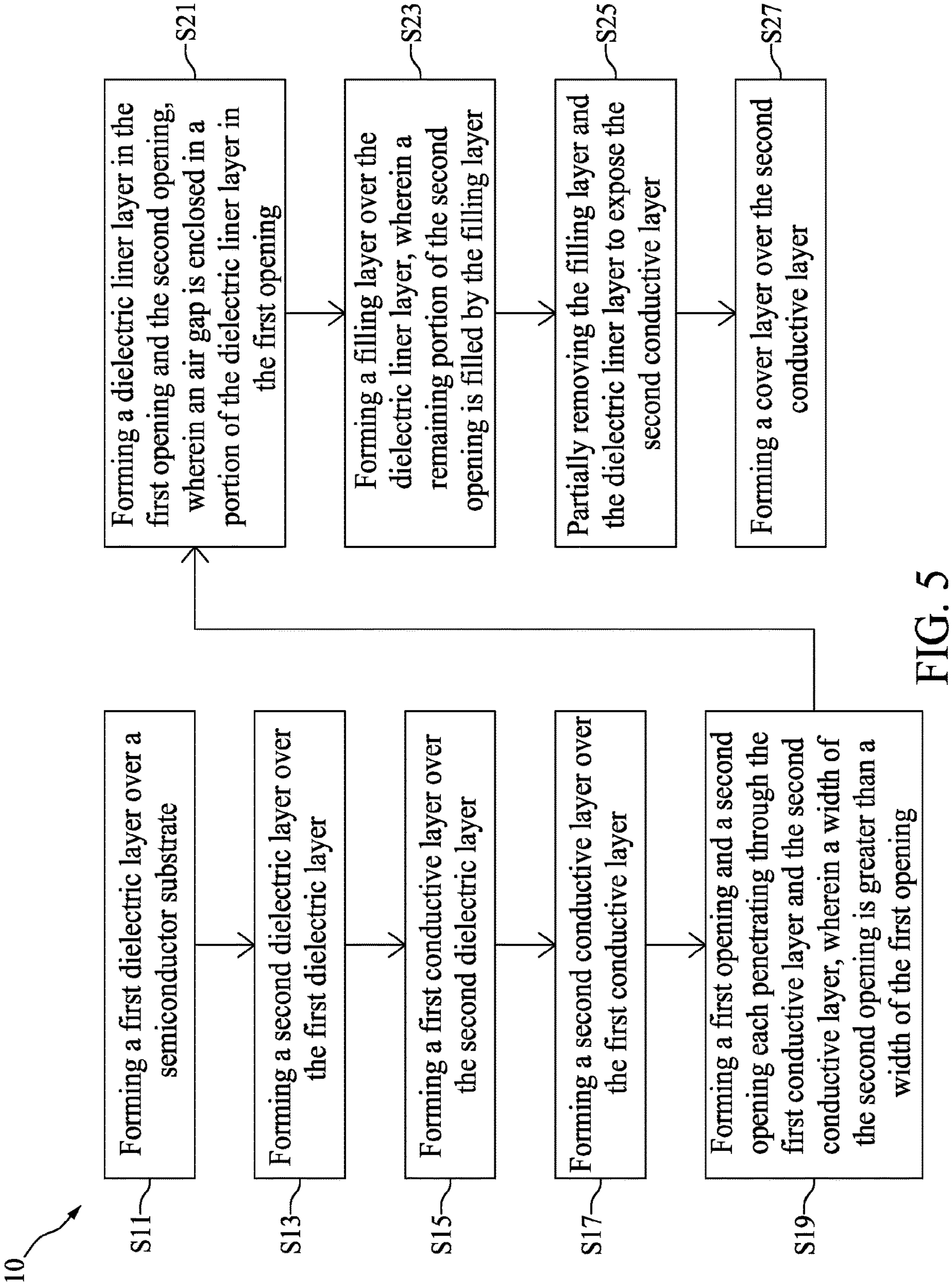
FIG. 5 is a flow diagram illustrating a method for preparing a semiconductor device structure, in accordance with some embodiments.

FIG. 5 is a flow diagram illustrating a method 10 for preparing a semiconductor device structure (e.g., the semiconductor device structure 100*a* or 100*b*), and the method 10 includes steps S11, S13, S15, S17, S19, S21, S23, S25 and S27, in accordance with some embodiments. The steps S11 to S27 of FIG. 5 are elaborated in connection with the following figures, such as FIGS. 7-15.

Figure 6:
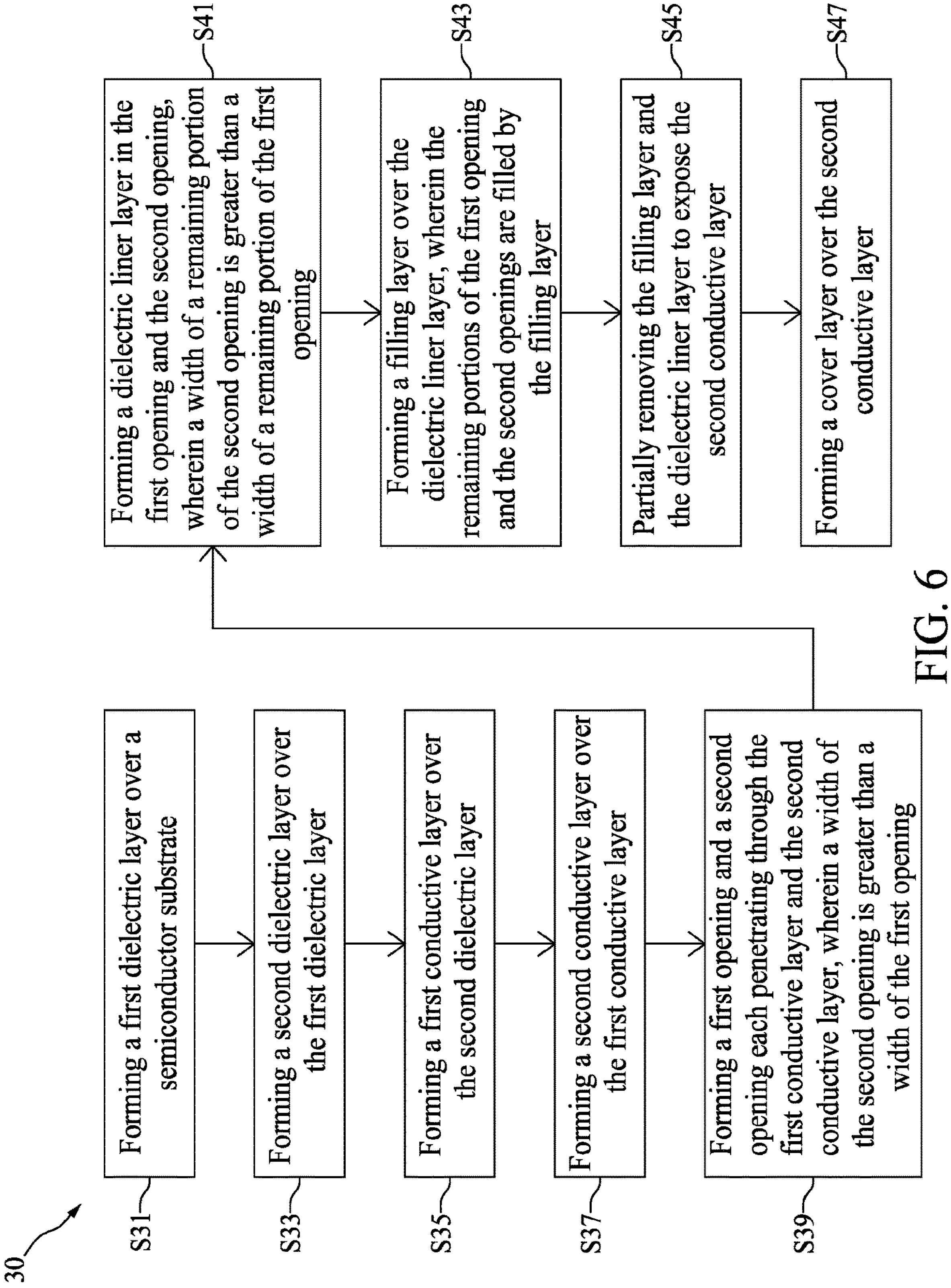
FIG. 6 is a flow diagram illustrating a method for preparing a semiconductor device structure, in accordance with some embodiments.

FIG. 6 is a flow diagram illustrating a method 30 for preparing a semiconductor device structure (e.g., the semiconductor device structure 200*a* or 200*b*), and the method 30 includes steps S31, S33, S35, S37, S39, S41, S43, S45 and S47, in accordance with some embodiments. The steps S31 to S47 of FIG. 6 are elaborated in connection with the following figures, such as FIGS. 16-20.

Figure 7:
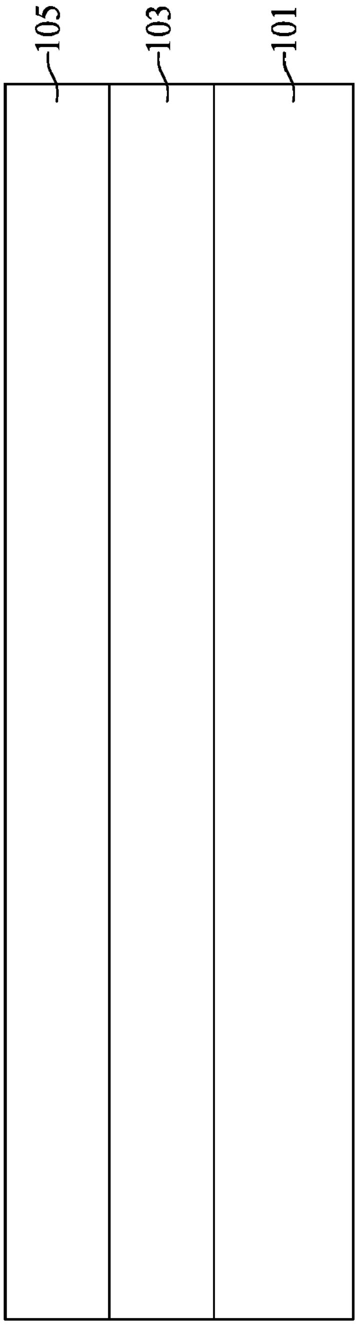
FIG. 7 is a cross-sectional view illustrating an intermediate stage of sequentially forming a first dielectric layer and a second dielectric layer over a semiconductor substrate during the formation of the semiconductor device structure, in accordance with some embodiments.

FIGS. 7-13 are cross-sectional views illustrating intermediate stages of forming the semiconductor device structure 100*a*, in accordance with some embodiments. As shown in FIG. 7, a semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A first dielectric layer 103 and a second dielectric layer 105 are sequentially formed over the semiconductor substrate 101, as shown in FIG. 7 in accordance with some embodiments. The respective steps are illustrated as the steps S11 and S13 in the method 10 shown in FIG. 5. In some embodiments, the first dielectric layer 103 and the second dielectric layer 105 are made of or include silicon oxide, silicon nitride, or silicon oxynitride. In some embodiments, the first dielectric layer 103 is made of or includes borosilicate glass (BSG), silicon dioxide ($SiO_2$), or a combination thereof. In some embodiments, the second dielectric layer 105 is made of or includes borophosphosilicate glass (BPSG), tetraethoxysilane (TEOS), or a combination thereof.

The first dielectric layer 103 may be formed by a deposition process, such as a chemical vapor deposition (CVD) process, a physical vapor deposition (PVD) process, an atomic layer deposition (ALD) process, a spin-on coating process, or another suitable method. Some processes used to form the second dielectric layer 105 are similar to, or the same as, those used to form the first dielectric layer 103, and details thereof are not repeated herein. In addition, the second dielectric layer 105 may also be referred to as an interlayer dielectric (ILD) layer.

Figure 8:
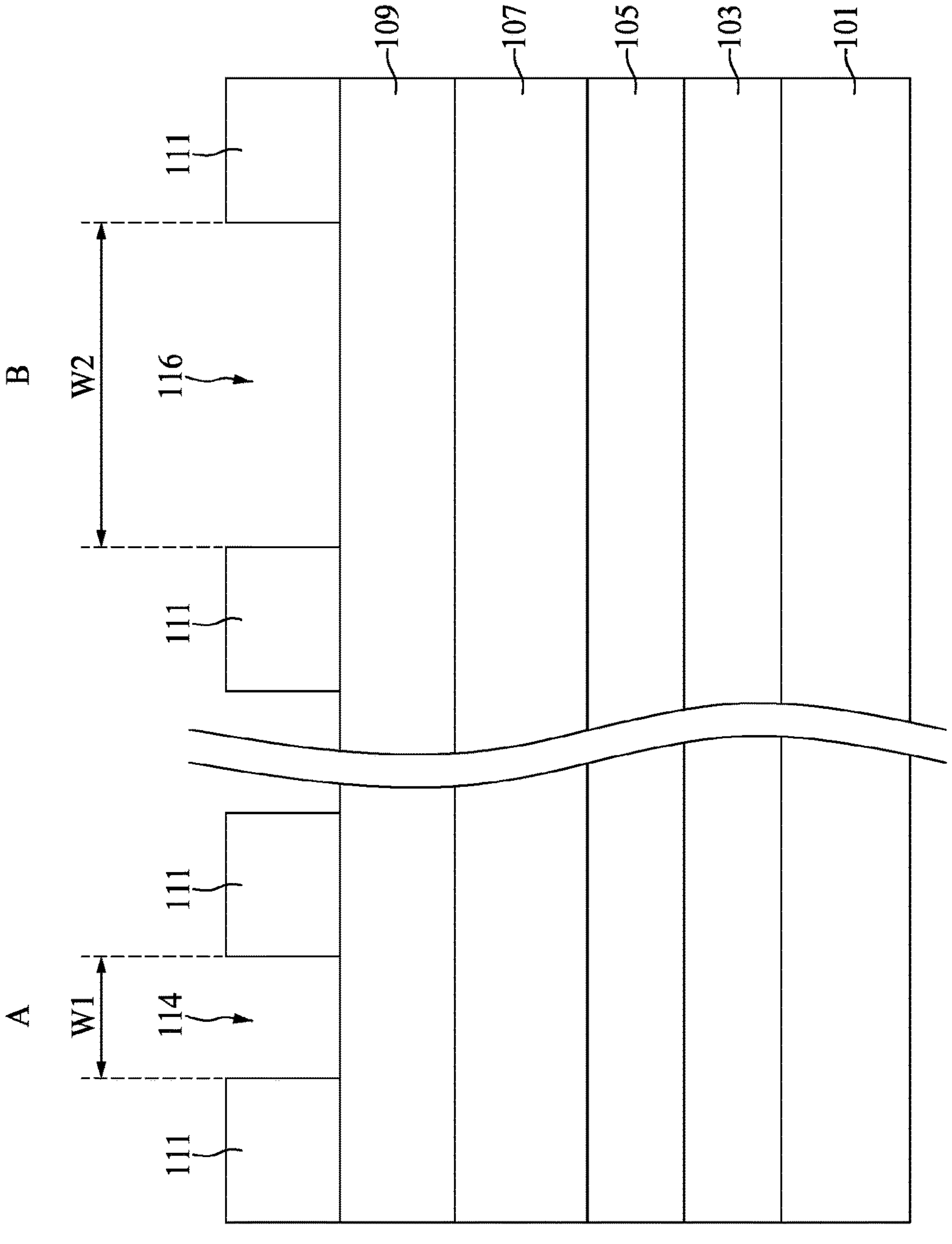
FIG. 8 is a cross-sectional view illustrating an intermediate stage of sequentially forming a first conductive layer, a second conductive layer, and a patterned mask over the second dielectric layer during the formation of the semiconductor device structure, in accordance with some embodiments.

Next, a first conductive layer 107 and a second conductive layer 109 are sequentially formed over the second dielectric layer 105, as shown in FIG. 8 in accordance with some embodiments. The respective steps are illustrated as the steps S15 and S17 in the method 10 shown in FIG. 5. In some embodiments, the first conductive layer 107 and the second conductive layer 109 are made of or include tungsten (W), aluminum (Al), copper (Cu), titanium (Ti), tantalum (Ta), titanium nitride (TiN), tantalum nitride (TaN), cobalt tungsten (CoW), another suitable material, or a combination thereof. In some embodiments, the first conductive layer 107 is made of or includes titanium nitride (TiN), and the second conductive layer 109 is made of or includes tungsten (W).

The first conductive layer 107 may be formed by a deposition process, such as a CVD process, a PVD process, an ALD process, a metal organic chemical vapor deposition (MOCVD) process, a sputtering process, a plating process, or another suitable method. Some processes used to form the second conductive layer 109 are similar to, or the same as, those used to form the first conductive layer 107, and details thereof are not repeated herein. In addition, the first conductive layer 107 may also be referred to as a barrier layer.

Still referring to FIG. 8, a patterned mask 111 with a plurality of openings (e.g., the openings 114 and 116) is formed over the second conductive layer 109, in accordance with some embodiments. In some embodiments, the opening 114 is in the first region A, the opening 116 is in the second region B, and the second conductive layer 109 are partially exposed by the openings 114 and 116. In some embodiments, the width of the opening 116 (i.e., the width W2) is greater than the width of the opening 114 (i.e., the width W1). In some embodiments, the second conductive layer 109 and the patterned mask 111 include different materials so that the etching selectivities may be different in the subsequent etching process.

Figure 9:
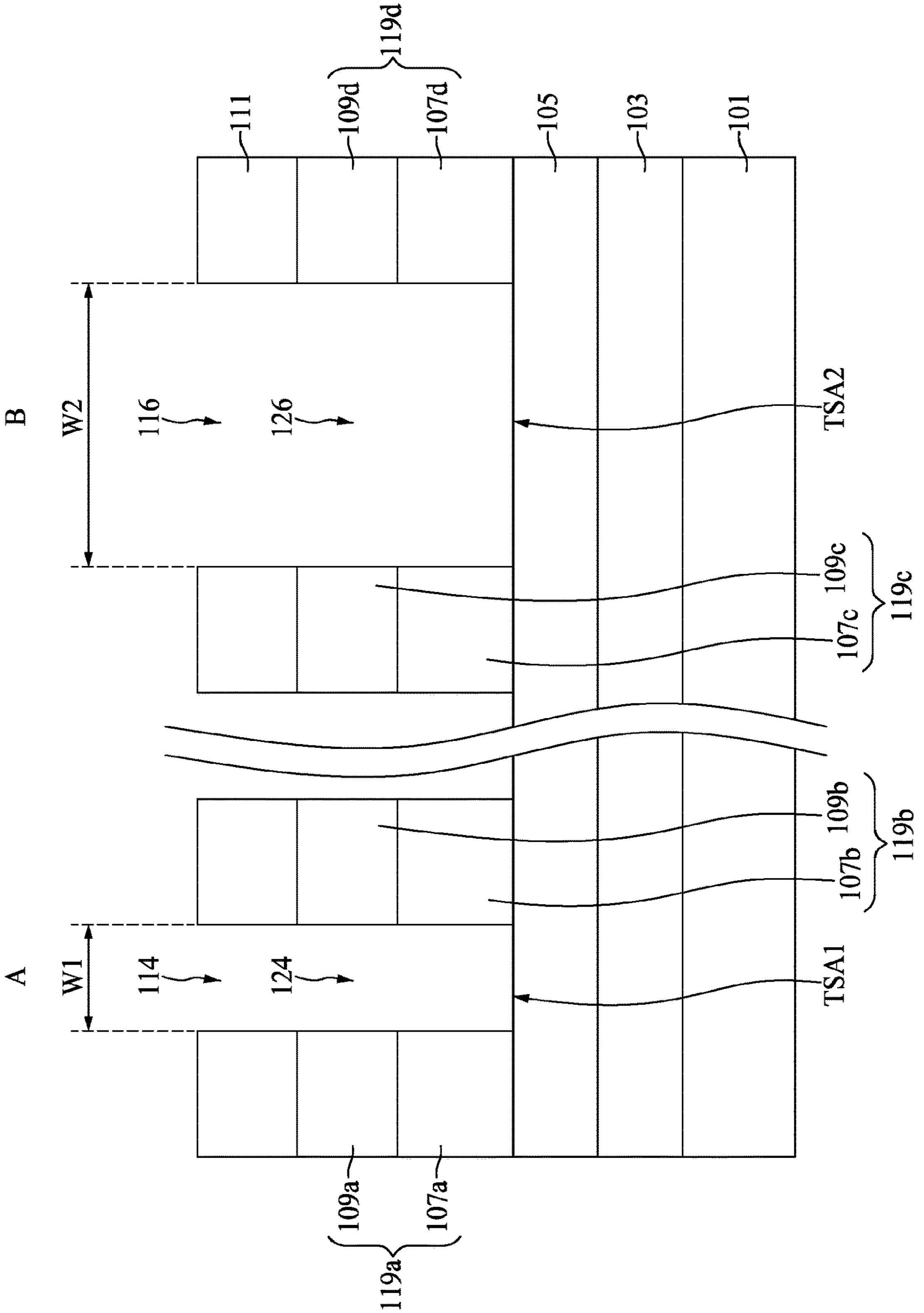
FIG. 9 is a cross-sectional view illustrating an intermediate stage of forming a first opening and a second opening penetrating through the first conductive layer and the second conductive layer using the patterned mask as an etching mask during the formation of the semiconductor device structure, in accordance with some embodiments.

Subsequently, an etching process is performed using the patterned mask 111 as an etching mask, such that openings 124 and 126 are formed penetrating through the first conductive layer 107 and the second conductive layer 109, as shown in FIG. 9 in accordance with some embodiments. In some embodiments, a width of the opening 126 (i.e., the width W2) in the second region B is greater than a width of the opening 124 (i.e., the width W1) in the first region A. The respective step is illustrated as the step S19 in the method 10 shown in FIG. 5.

Moreover, a top surface area TSA2 of the second dielectric layer 105 exposed by the opening 126 is greater than a top surface area TSA1 of the second dielectric layer 105 exposed by the opening 124, in accordance with some embodiments. In some embodiments, the etching process for forming the openings 124 and 126 includes a wet etching process, a dry etching process, or a combination thereof.

After the openings 124 and 126 are formed, a plurality of interconnect structures 119*a*, 119*b*, 119*c*, and 119*d* are obtained. In some embodiments, the remaining portions of the first conductive layer 107 and the second conductive layer 109 are referred to as first conductive portions 107*a*, 107*b*, 107*c*, 107*d* and second conductive portions 109*a*, 109*b*, 109*c*, 109*d* hereinafter. As mentioned above, each of the interconnect structures 119*a*, 119*b*, 119*c*, and 119*d* includes a first conductive portion and a second conductive portion disposed over the first conductive portion, as shown in FIG. 9 in accordance with some embodiments.

Figure 10:
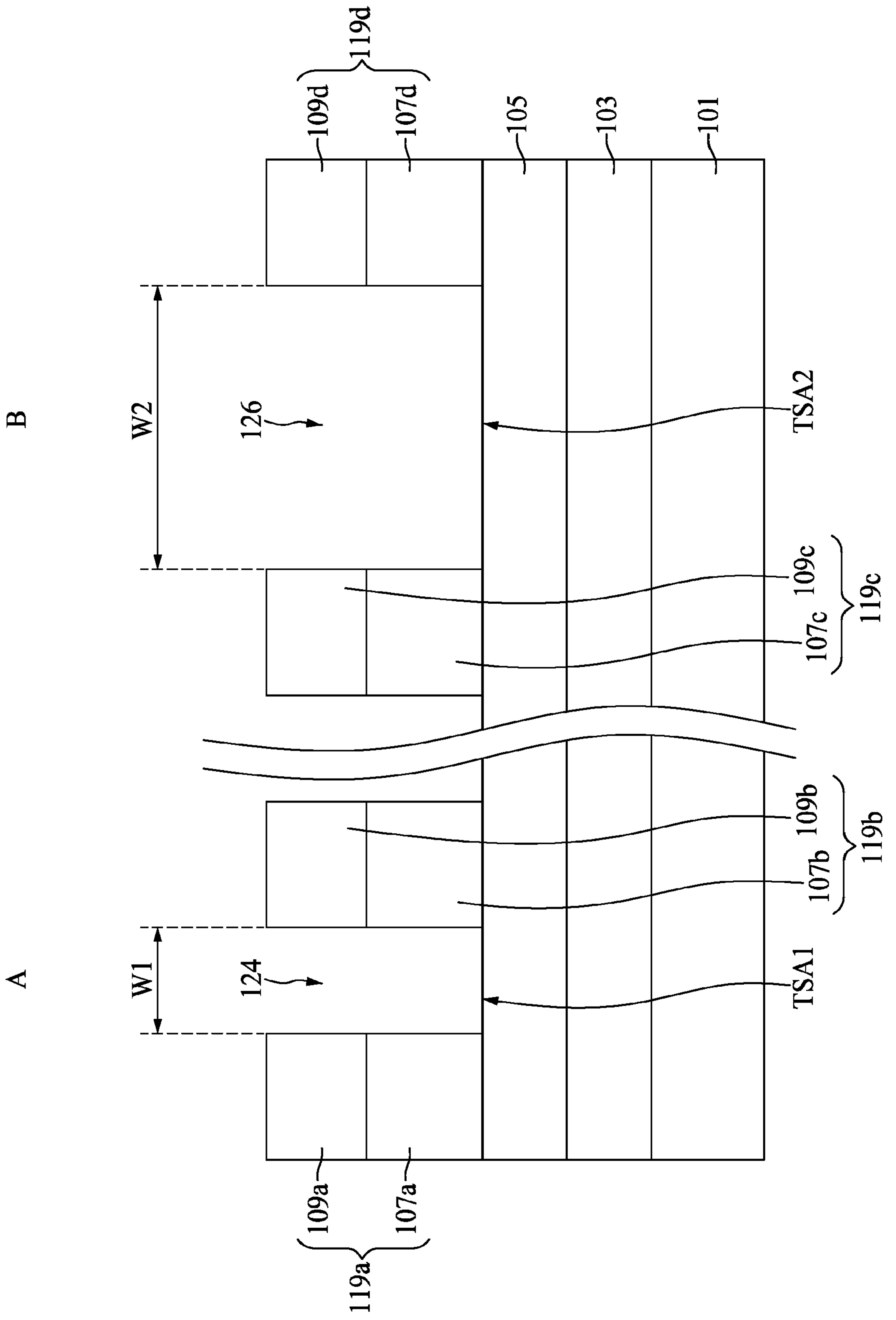
FIG. 10 is a cross-sectional view illustrating an intermediate stage of removing the patterned mask during the formation of the semiconductor device structure, in accordance with some embodiments.

Then, the patterned mask 111 is removed, as shown in FIG. 10 in accordance with some embodiments. In some embodiments, the patterned mask 111 is removed by a stripping process, an ashing process, an etching process, or another suitable process. After the patterned mask 111 is removed, the top surfaces of the second conductive portions 109*a*, 109*b*, 109*c* and 109*d* are exposed.

Figure 11:
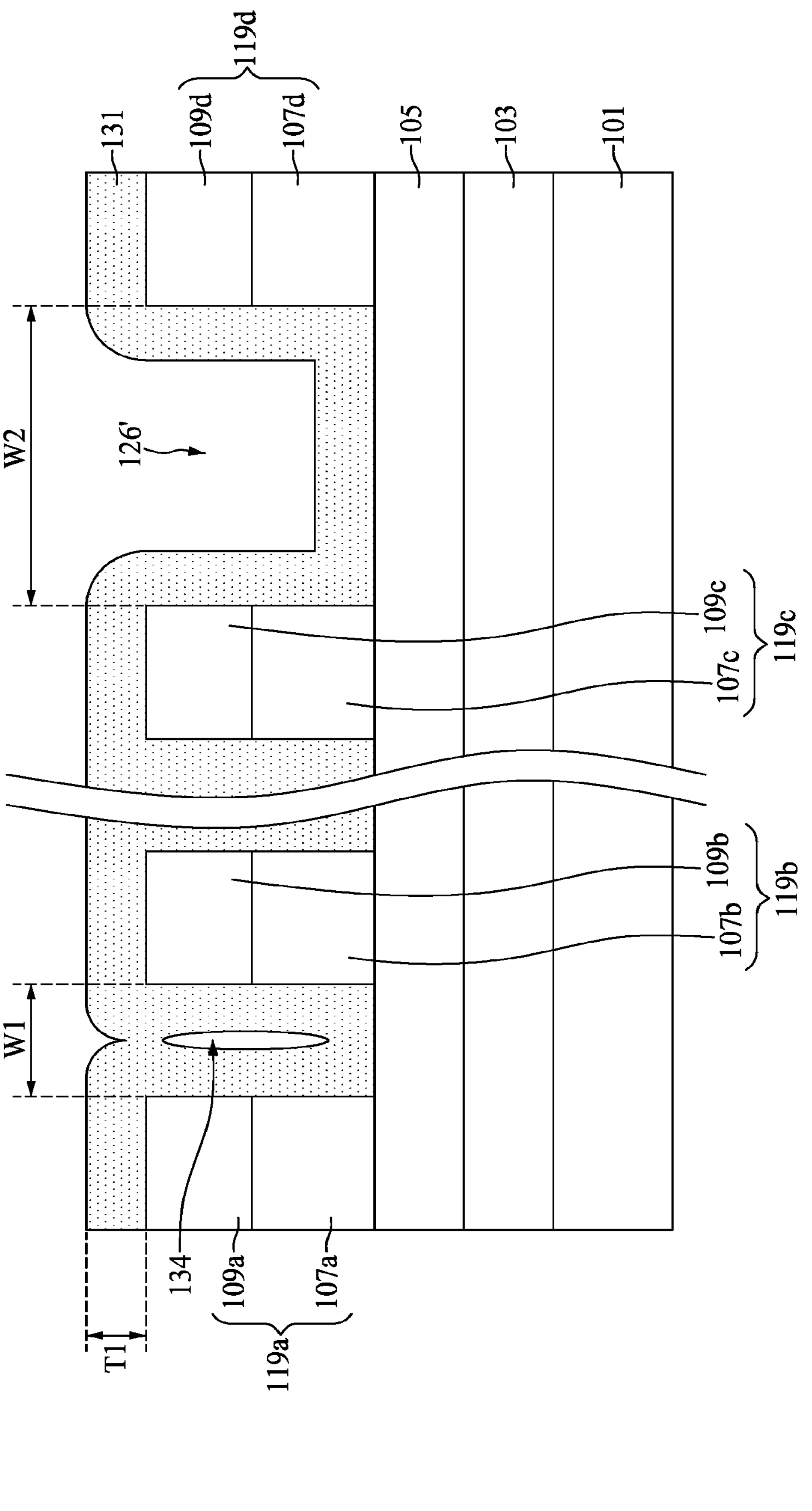
FIG. 11 is a cross-sectional view illustrating an intermediate stage of forming a dielectric liner layer in the first opening and the second opening during the formation of the semiconductor device structure, in accordance with some embodiments.

Next, a dielectric liner layer 131 is conformally formed over the structure of FIG. 10, as shown in FIG. 11 in accordance with some embodiments. In some embodiments, the dielectric liner layer 131 is formed in the openings 124 and 126 and over the top surfaces of the second conductive portions 109*a*, 109*b*, 109*c* and 109*d*. The respective step is illustrated as the step S21 in the method 10 shown in FIG. 5.

In some embodiments, the thickness of the dielectric liner layer 131 is adjusted such that an air gap 134 is enclosed in the portion of the dielectric liner layer 131 filled in the opening 124, while the opening 126 remains unfilled by the dielectric liner layer 131. In some embodiments, the dielectric liner layer 131 has a thickness T1, the width W1 of the opening 124 is less than two times of the thickness T1, and the width W2 of the opening 126 is greater than two times of the thickness T1.

Moreover, in some embodiments, the dielectric liner layer 131 is made of or includes boron carbonitride (BCN). However, any other suitable dielectric materials may be utilized. The dielectric liner layer 131 may be formed by a deposition process, such as a CVD process, a PVD process, an ALD process, a spin-on coating process, or another suitable method. In some embodiments, the air gap 134 is enclosed (or sealed) in the portion of the dielectric liner layer 131 filled in the opening 124. In other words, the air gap 134 is not exposed.

Figure 12:
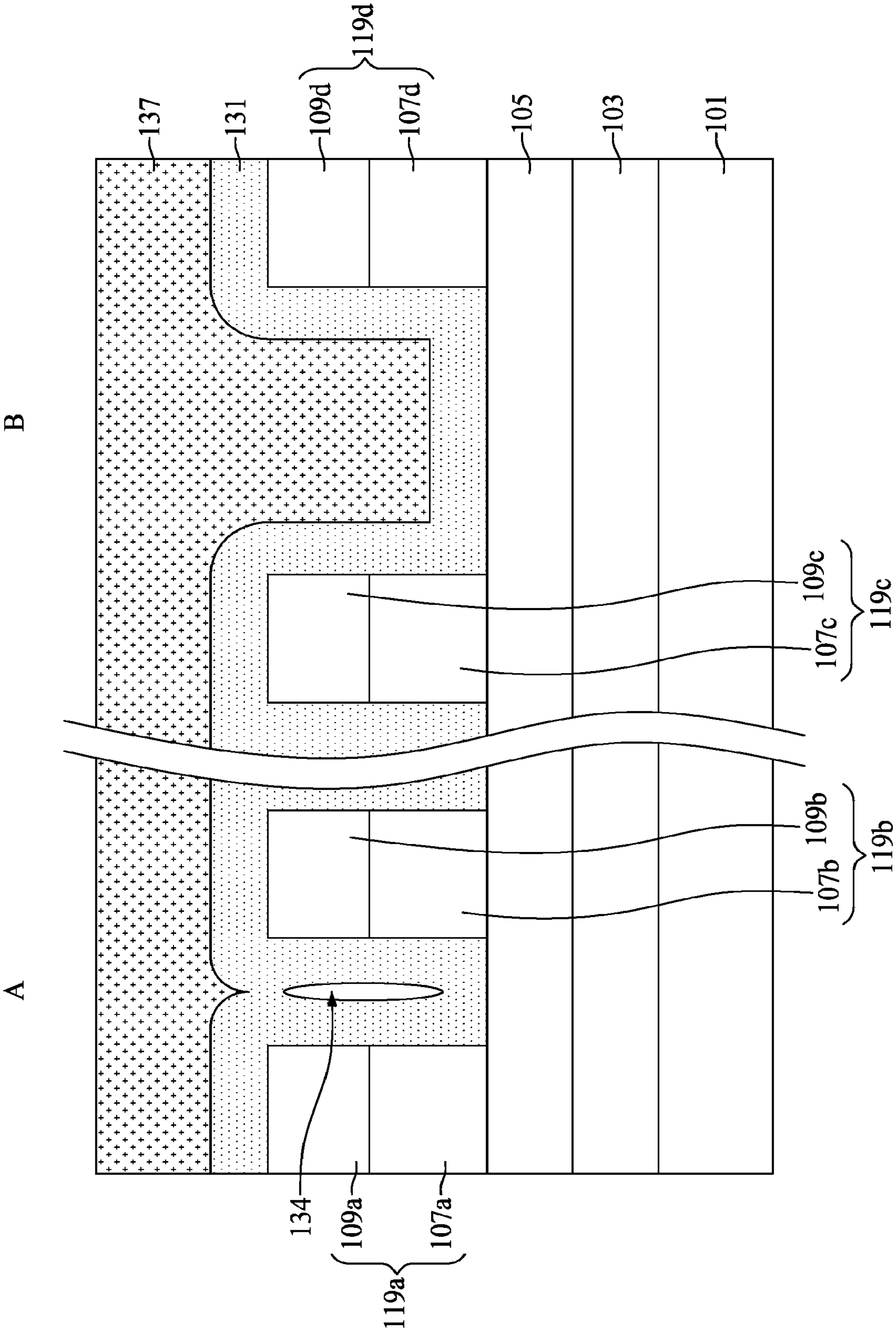
FIG. 12 is a cross-sectional view illustrating an intermediate stage of forming a filling layer over the dielectric liner layer during the formation of the semiconductor device structure, in accordance with some embodiments.

Subsequently, a filling layer 137 is formed over the dielectric liner layer 131, as shown in FIG. 12 in accordance with some embodiments. In some embodiments, a remaining portion of the opening 126 (also referred to as 126') in the structure of FIG. 11 is filled by the filling layer 137. The respective step is illustrated as the step S23 in the method 10 shown in FIG. 5.

In some embodiments, since the air gap 134 in the first region A is enclosed by the dielectric liner layer 131, the air gap 134 is separated from the filling layer 137 by the dielectric liner layer 131. In some embodiments, the filling layer 137 is made of or includes a low-k dielectric material. The dielectric constant (k value) of the low-k dielectric material may be lower than about 3.0, for example. In some embodiments, the filling layer 137 is formed by a sputtering process. However, any other suitable deposition methods may be utilized.

Figure 13:
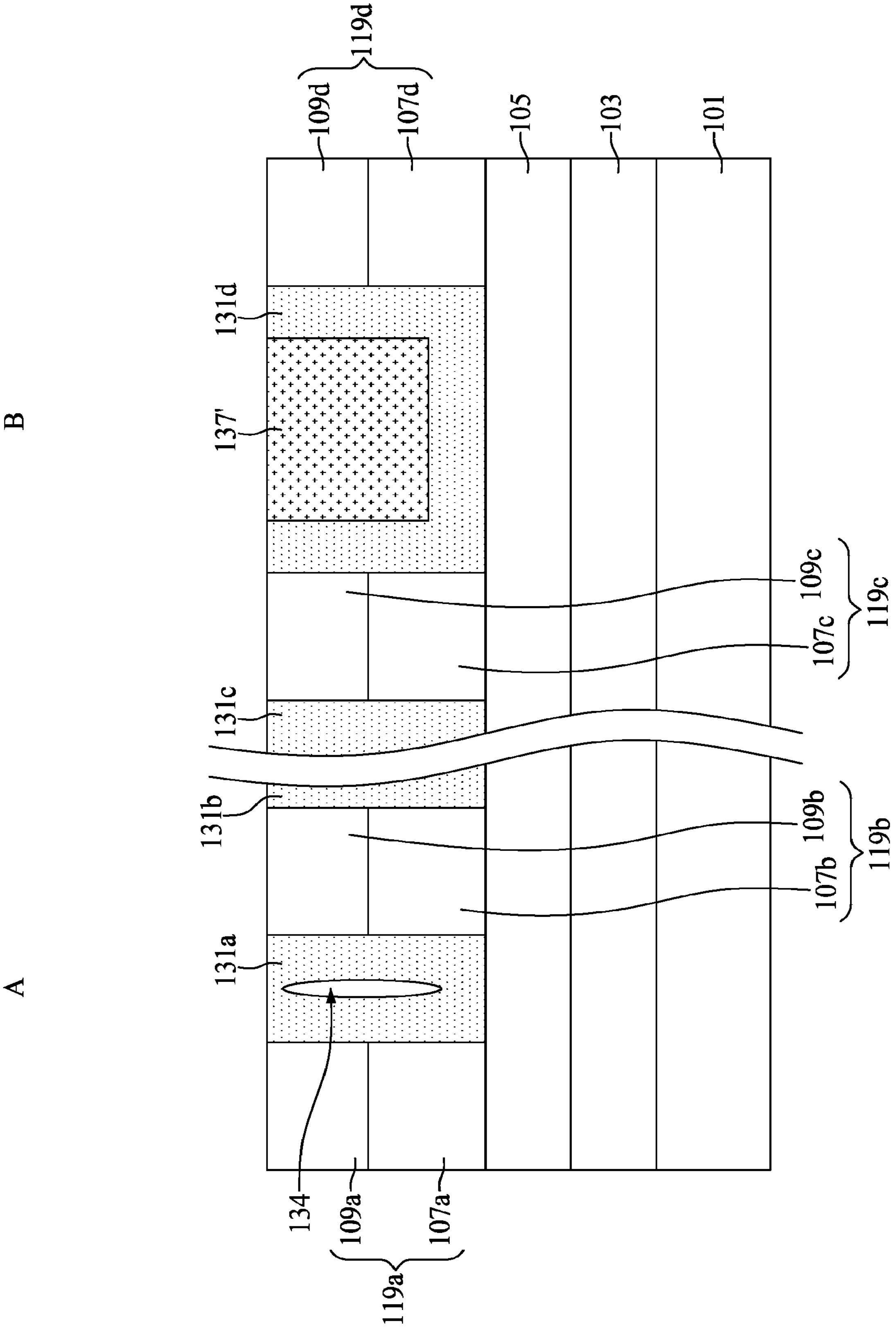
FIG. 13 is a cross-sectional view illustrating an intermediate stage of partially removing the filling layer and the dielectric liner layer to expose the second conductive layer during the formation of the semiconductor device structure, in accordance with some embodiments.

Then, the filling layer 137 and the dielectric liner layer 131 are partially removed to expose the interconnect structures 119*a*, 119*b*, 119*c* and 119*d* (i.e., the second conductive portions 109*a*, 109*b*, 109*c* and 109*d*), as shown in FIG. 13 in accordance with some embodiments. The respective step is illustrated as the step S25 in the method 10 shown in FIG. 5. After the filling layer 137 and the dielectric liner layer 131 are partially removed, dielectric liner portions 131*a*, 131*b*, 131*c*, 131*d* and a filling portion 137' are obtained.

In some embodiments, the dielectric liner portions 131*a*, 131*b* and the air gap 134 are in the first region A, and the dielectric liner portions 131*c*, 131*d*, and the filling portion 137' are in the second region B. In some embodiments, the filling layer 137 and the dielectric liner layer 131 are partially removed by a planarization process, an etch-back process, or a combination thereof. The planarization process may include a chemical mechanical polishing (CMP) process.

Next, a cover layer 141 is formed over the interconnect structures 119*a*, 119*b*, 119*c*, and 119*d*, as shown in FIG. 1 in accordance with some embodiments. In some embodiments, the cover layer 141 is formed over and in direct contact with the top surfaces of the interconnect structures 119*a*, 119*b*, 119*c*, 119*d* (i.e., the top surfaces of the second conductive portions 109*a*, 109*b*, 109*c*, 109*d*), the top surfaces of the dielectric liner portions 131*a*, 131*b*, 131*c*, 131*d*, and the top surface of the filling portion 137'. The respective step is illustrated as the step S27 in the method 10 shown in FIG. 5.

In some embodiments, the cover layer 141 is made of or includes a silicon-based material, such as silicon nitride ($Si_3N_4$), silicon oxynitride (SiON), or silicon dioxide ($SiO_2$). In some embodiments, the cover layer 141 is made of or includes carbonitride with or without an additional dopant such as boron (B). The cover layer 141 may be formed by a deposition process, such as a CVD process, a PVD process, an ALD process, a spin-on coating process, or another suitable method. After the cover layer 141 is formed, the semiconductor device structure 100*a* is obtained.

Figure 14:
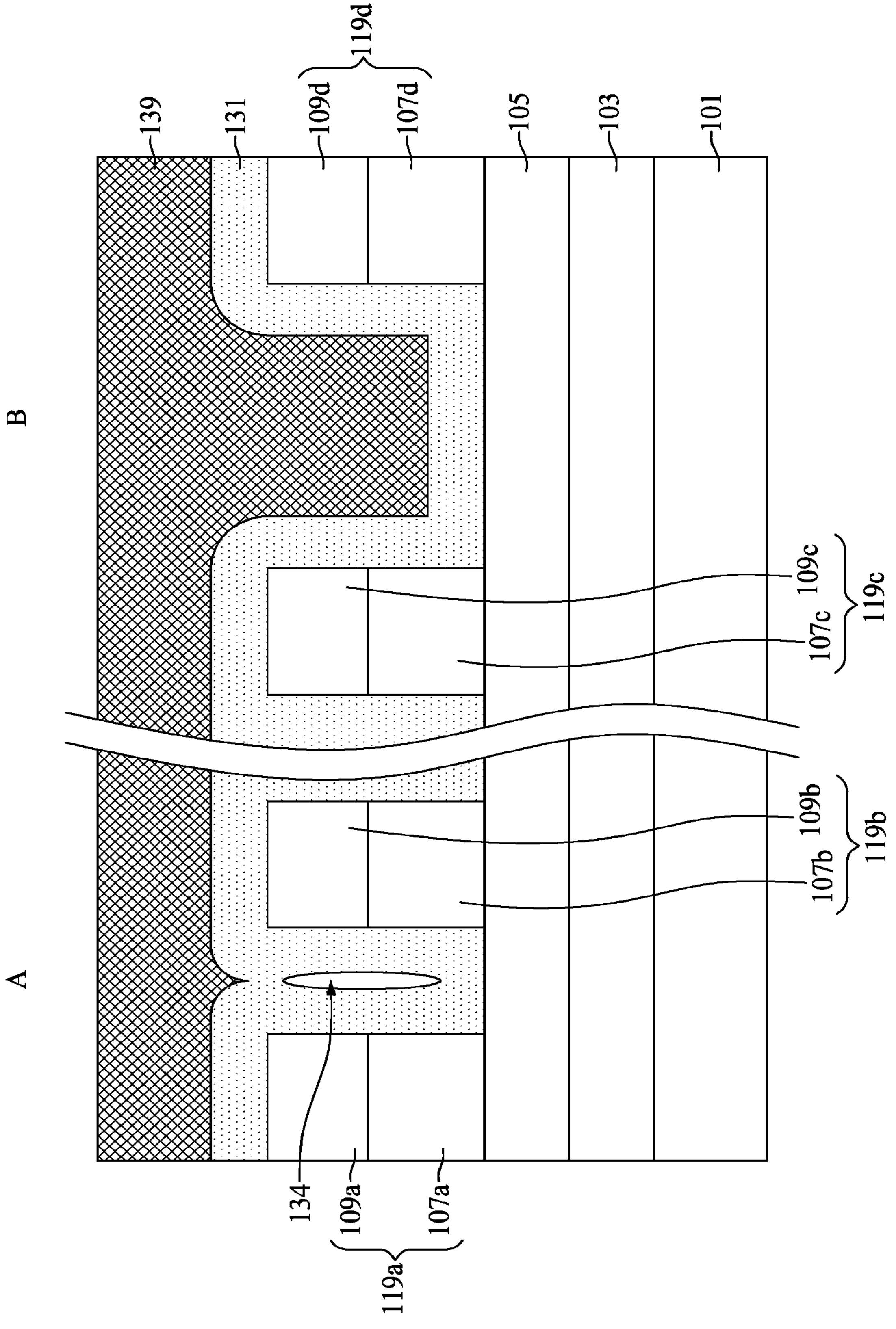
FIG. 14 is a cross-sectional view illustrating an intermediate stage of forming a filling layer over the dielectric liner layer during the formation of the semiconductor device structure, in accordance with some embodiments.
Figure 15:
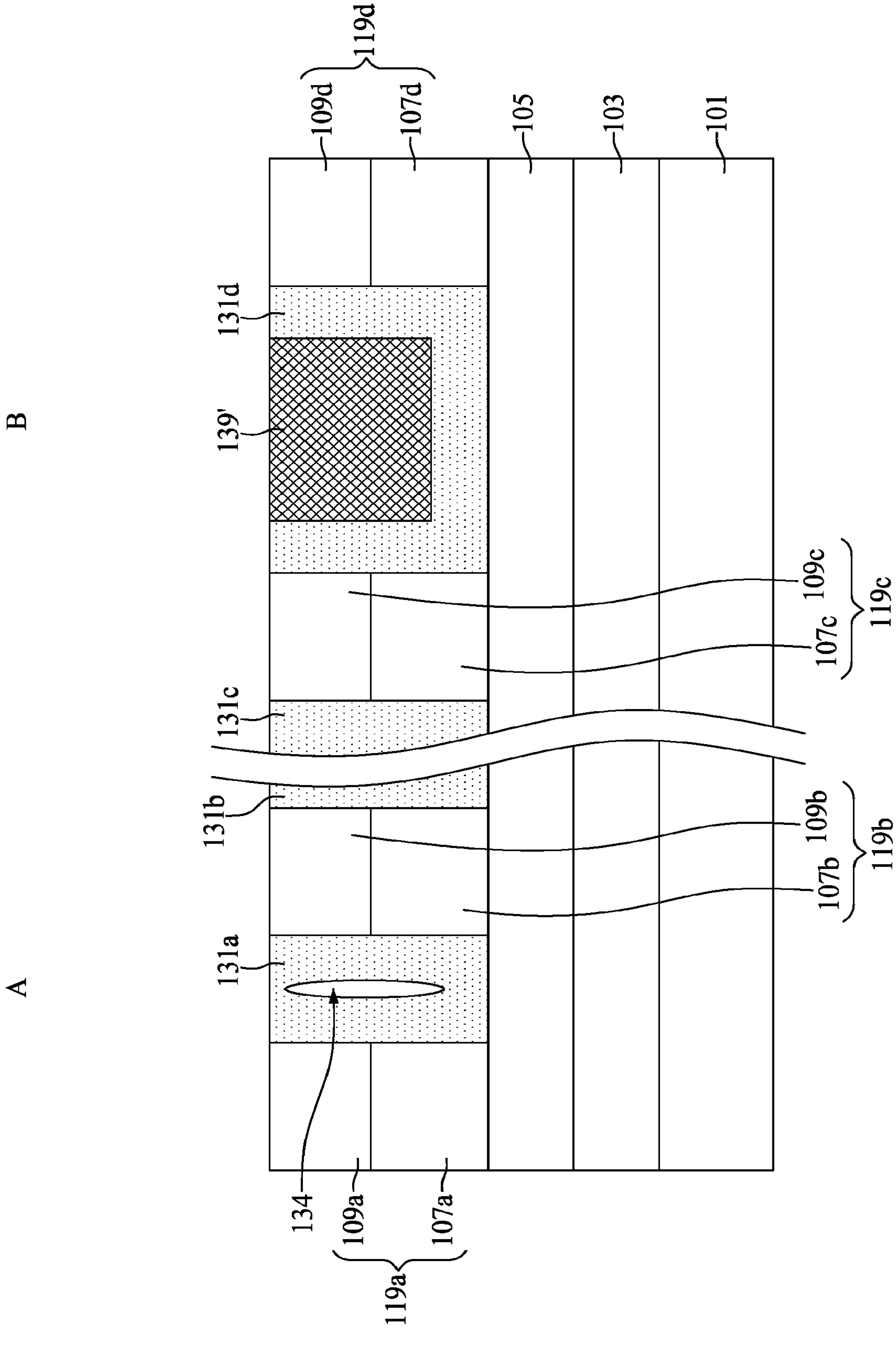
FIG. 15 is a cross-sectional view illustrating an intermediate stage of partially removing the filling layer and the dielectric liner layer to expose the second conductive layer during the formation of the semiconductor device structure, in accordance with some embodiments.

FIGS. 14 and 15 are cross-sectional views illustrating intermediate stages of forming the semiconductor device structure 100*b*, in accordance with some embodiments. It should be pointed out that operations for forming the semiconductor device structure 100*b* before the structure shown in FIG. 14 are substantially the same as the operations for forming the semiconductor device structure 100*a* shown in FIGS. 7-11, and the related detailed descriptions may refer to the foregoing paragraphs and are not discussed again herein.

After the dielectric liner layer 131 is formed, a filling layer 139 is formed over the dielectric liner layer 131, as shown in FIG. 14 in accordance with some embodiments. In some embodiments, a remaining portion of the opening 126 (i.e., 126' in FIG. 11) is filled by the filling layer 139. The respective step is illustrated as the step S23 in the method 10 shown in FIG. 5.

In some embodiments, since the air gap 134 in the first region A is enclosed by the dielectric liner layer 131, the air gap 134 is separated from the filling layer 139 by the dielectric liner layer 131. In some embodiments, the filling layer 139 is made of or includes an energy removable material. In some embodiments, the energy removable material includes a thermal decomposable material. In some other embodiments, the energy removable material includes a photonic decomposable material, an e-beam decomposable material, or another suitable energy decomposable material. In some embodiments, the energy removable material includes a base material and a decomposable porogen material that is substantially removed once being exposed to an energy source (e.g., heat).

In this case, the base material may include hydrogen silsesquioxane (HSQ), methylsilsesquioxane (MSQ), porous polyarylether (PAE), porous SiLK, or porous silicon dioxide ($SiO_2$), and the decomposable porogen material may include a porogen organic compound, which can provide porosity to the space originally occupied by the energy removable material (i.e., the filling layer 139) in the subsequent processes. In some embodiments, the filling layer 139 is formed by a sputtering process. However, any other suitable deposition methods may be utilized.

Subsequently, the filling layer 139 and the dielectric liner layer 131 are partially removed to expose the interconnect structures 119*a*, 119*b*, 119*c* and 119*d* (i.e., the second conductive portions 109*a*, 109*b*, 109*c* and 109*d*), as shown in FIG. 15 in accordance with some embodiments. The respective step is illustrated as the step S25 in the method 10 shown in FIG. 5. After the filling layer 139 and the dielectric liner layer 131 are partially removed, dielectric liner portions 131*a*, 131*b*, 131*c*, 131*d* and a filling portion 139' are obtained.

In some embodiments, the dielectric liner portions 131*a*, 131*b* and the air gap 134 are in the first region A, and the dielectric liner portions 131*c*, 131*d*, and the filling portion 139' are in the second region B. In some embodiments, the filling layer 139 and the dielectric liner layer 131 are partially removed by a planarization process, an etch-back process, or a combination thereof. The planarization process may include a CMP process.

Then, a cover layer 141 is formed over the interconnect structures 119*a*, 119*b*, 119*c*, and 119*d*, as shown in FIG. 2 in accordance with some embodiments. In some embodiments, the cover layer 141 is formed over and in direct contact with the top surfaces of the interconnect structures 119*a*, 119*b*, 119*c*, 119*d* (i.e., the top surfaces of the second conductive portions 109*a*, 109*b*, 109*c*, 109*d*), the top surfaces of the dielectric liner portions 131*a*, 131*b*, 131*c*, 131*d*, and the top surface of the filling portion 139'. The respective step is illustrated as the step S27 in the method 10 shown in FIG. 5.

The details of the cover layer 141 may be essentially the same as what are shown and discussed in FIG. 1, and hence are not repeated herein. After the cover layer 141 is formed, the semiconductor device structure 100*b* is obtained. In some embodiments, a heat treatment process can be performed to transform the filling portion 139' into an air gap (not shown). In some embodiments, the heat treatment process is optional. In some embodiments, the temperature used in the heat treatment process may be high enough to efficiently burn-out the filling portion 139', leaving the air gap enclosed by the dielectric liner portion 131*d* and the cover layer 141. In some other embodiments, the temperature used in the heat treatment process is selected such that the filling portion 139' is transformed into an air gap surrounded or enclosed by a remaining portion of the filling portion 139'.

Figure 16:
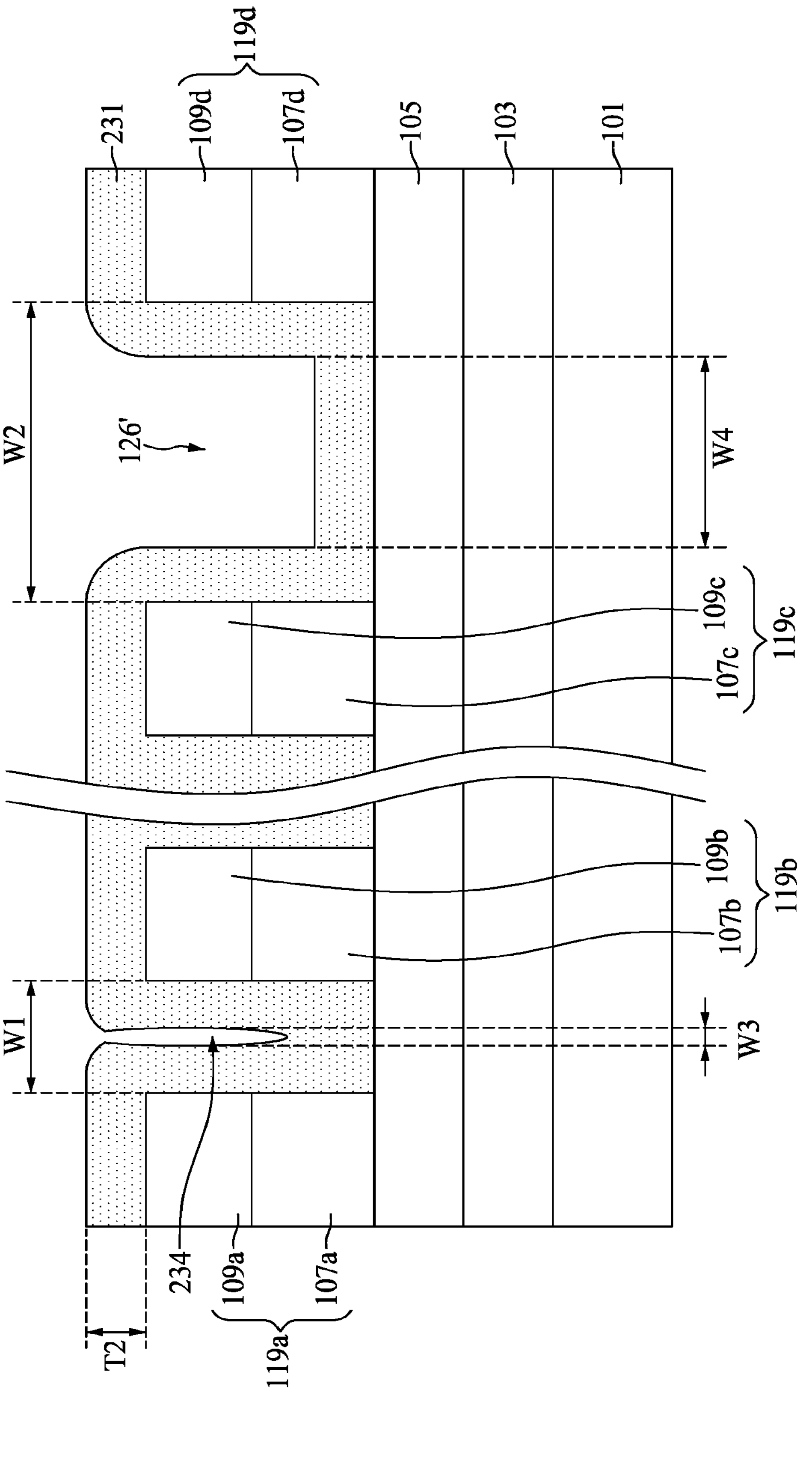
FIG. 16 is a cross-sectional view illustrating an intermediate stage of forming a dielectric liner layer in the first opening and the second opening during the formation of the semiconductor device structure, in accordance with some embodiments.
Figure 17:
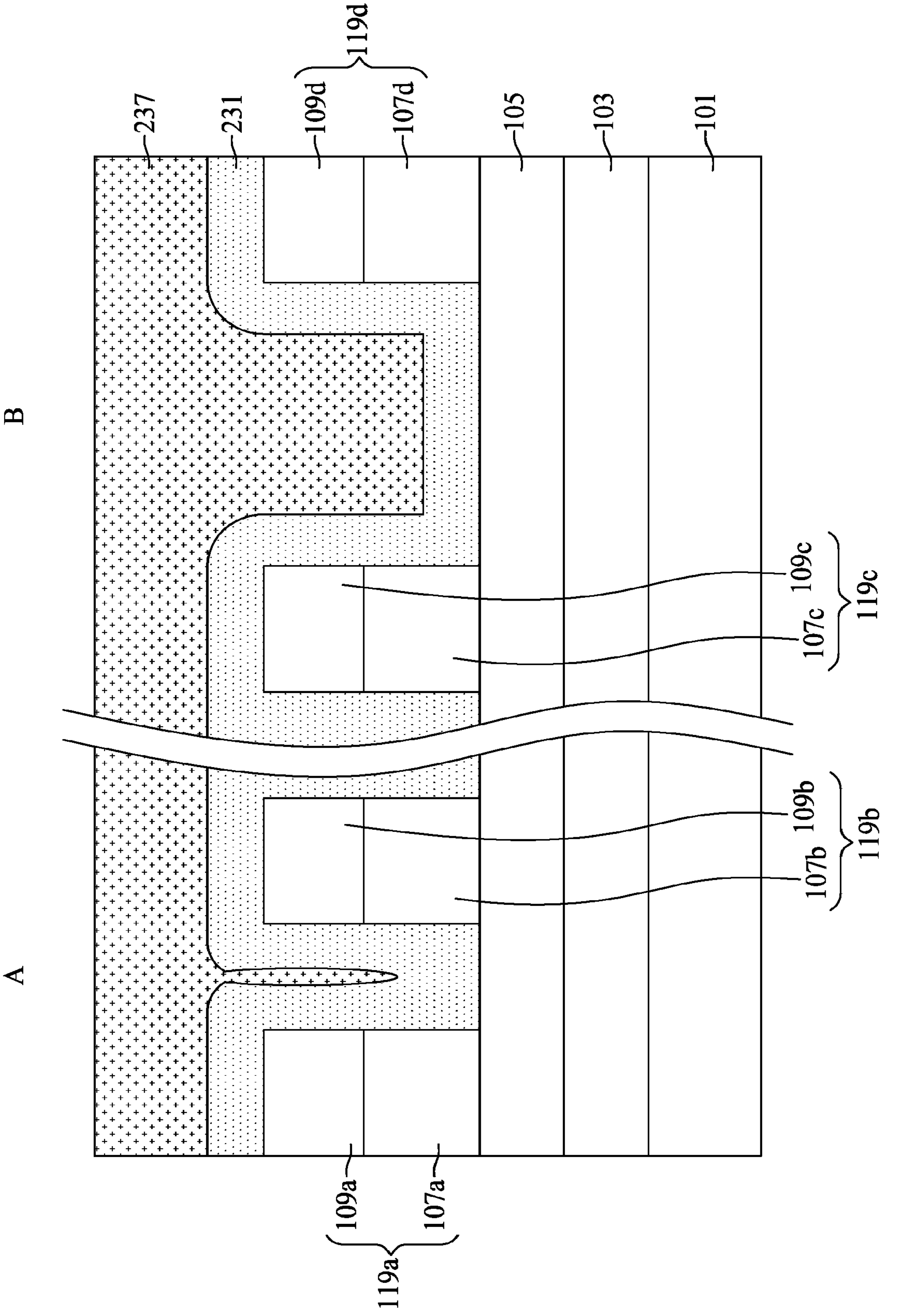
FIG. 17 is a cross-sectional view illustrating an intermediate stage of forming a filling layer over the dielectric liner layer during the formation of the semiconductor device structure, in accordance with some embodiments.
Figure 18:
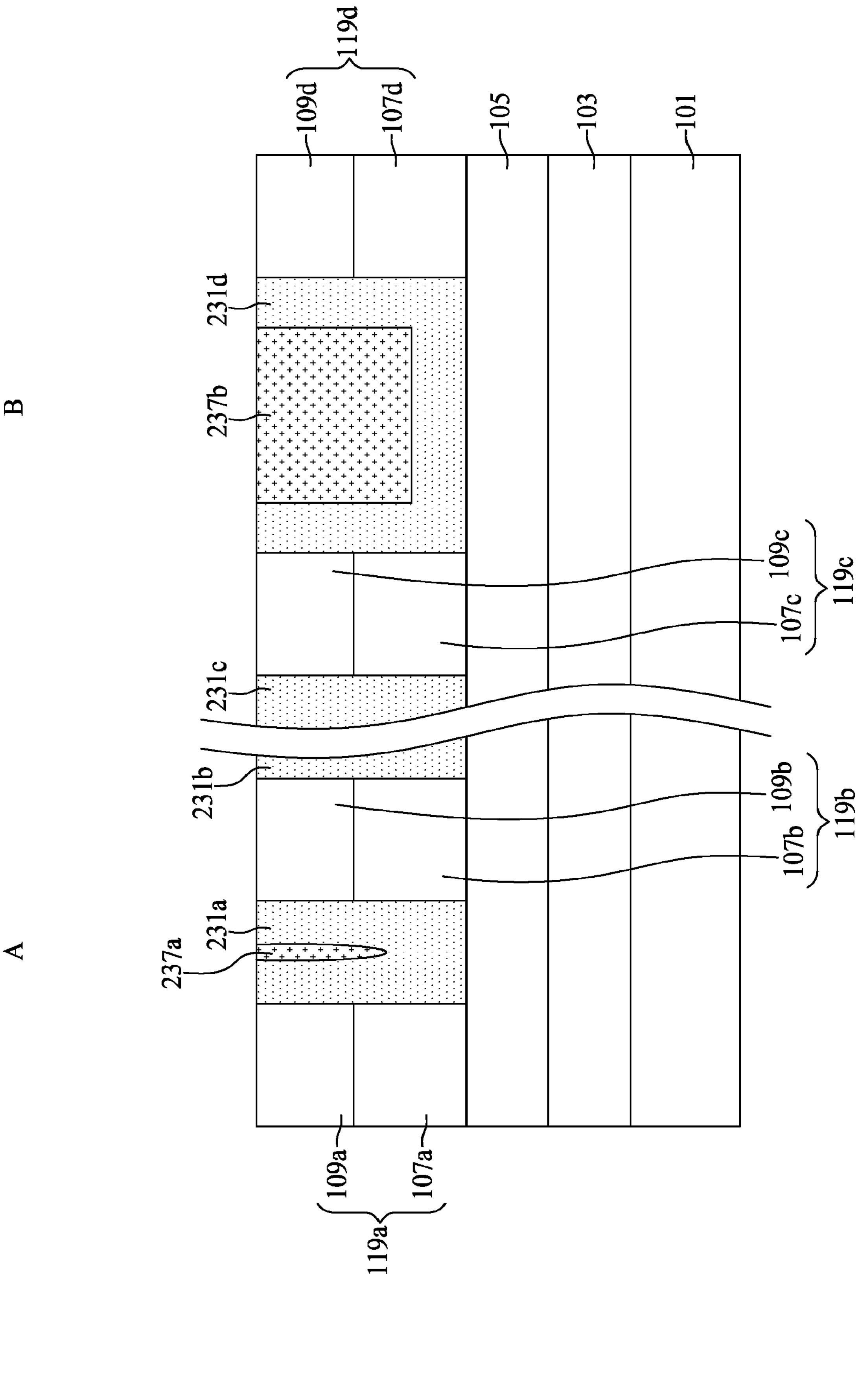
FIG. 18 is a cross-sectional view illustrating an intermediate stage of partially removing the filling layer and the dielectric liner layer to expose the second conductive layer during the formation of the semiconductor device structure, in accordance with some embodiments.

FIGS. 16-18 are cross-sectional views illustrating intermediate stages of forming the semiconductor device structure 200*a*, in accordance with some embodiments. It should be pointed out that operations for forming the semiconductor device structure 200*a* before the structure shown in FIG. 16 are substantially the same as the operations for forming the semiconductor device structure 100*a* shown in FIGS. 7-10 (The steps S31 to S39 in the method 30 shown in FIG. 6 are the same as the steps S11 to S19 in the method 10 shown in FIG. 5), and the related detailed descriptions may refer to the foregoing paragraphs and are not discussed again herein.

After the openings 124 and 126 are formed, a dielectric liner layer 231 is conformally formed over the structure of FIG. 10, as shown in FIG. 16 in accordance with some embodiments. In some embodiments, the dielectric liner layer 231 is formed in the openings 124 and 126 and over the top surfaces of the second conductive portions 109*a*, 109*b*, 109*c* and 109*d*. The respective step is illustrated as the step S41 in the method 30 shown in FIG. 6.

In some embodiments, the thickness of the dielectric liner layer 231 is adjusted such that a gap 234 (i.e., the remaining portion of the opening 124) formed in the first region A has a smaller width than that of the opening 126' (i.e., the remaining portion of the opening 126) formed in the second region B. For example, the width W4 of the opening 126' is greater than the width W3 of the gap 234. In some embodiments, the width W3 represents a width measured at the widest portion of the gap 234.

Moreover, referring to FIGS. 10 and 16, the dielectric liner layer 231 has a thickness T2, the width W1 of the opening 124 is less than two times of the thickness T2, and the width W2 of the opening 126 is greater than two times of the thickness T2. In some embodiments, the opening 124 in the first region A is partially filled by the dielectric liner layer 231, and there is no air gap enclosed in the dielectric liner layer 231. Some materials and processes used to form the dielectric liner layer 231 are similar to, or the same as, those used to form the dielectric liner layer 131, and details thereof are not repeated herein.

Next, a filling layer 237 is formed over the dielectric liner layer 231, as shown in FIG. 17 in accordance with some embodiments. In some embodiments, the gap 234 (i.e., the remaining portion of the opening 124 after the dielectric liner layer 231 is formed) in the first region A and the opening 126' (i.e., the remaining portion of the opening 126 after the dielectric liner layer 231 is formed) in the second region B are filled by the filling layer 237. The respective step is illustrated as the step S43 in the method 30 shown in FIG. 6.

In some embodiments, the filling layer 237 is made of or includes a low-k dielectric material. The dielectric constant (k value) of the low-k dielectric material may be lower than about 3.0, for example. In some embodiments, the filling layer 237 is formed by a sputtering process. However, any other suitable deposition methods may be utilized.

Subsequently, the filling layer 237 and the dielectric liner layer 231 are partially removed to expose the interconnect structures 119*a*, 119*b*, 119*c* and 119*d* (i.e., the second conductive portions 109*a*, 109*b*, 109*c* and 109*d*), as shown in FIG. 18 in accordance with some embodiments. The respective step is illustrated as the step S45 in the method 30 shown in FIG. 6. After the filling layer 237 and the dielectric liner layer 231 are partially removed, dielectric liner portions 231*a*, 231*b*, 231*c*, 231*d* and filling portions 237*a* and 237*b* are obtained.

In some embodiments, the dielectric liner portions 231*a*, 231*b* and the filling portion 237*a* are in the first region A, and the dielectric liner portions 231*c*, 231*d*, and the filling portion 237*b* are in the second region B. In some embodiments, the filling layer 237 and the dielectric liner layer 231 are partially removed by a planarization process, an etch-back process, or a combination thereof. The planarization process may include a CMP process.

Then, a cover layer 141 is formed over the interconnect structures 119*a*, 119*b*, 119*c*, and 119*d*, as shown in FIG. 3 in accordance with some embodiments. In some embodiments, the cover layer 141 is formed over and in direct contact with the top surfaces of the interconnect structures 119*a*, 119*b*, 119*c*, 119*d* (i.e., the top surfaces of the second conductive portions 109*a*, 109*b*, 109*c*, 109*d*), the top surfaces of the dielectric liner portions 231*a*, 231*b*, 231*c*, 231*d*, and the top surfaces of the filling portions 237*a* and 237*b*. The respective step is illustrated as the step S47 in the method 30 shown in FIG. 6.

The details of the cover layer 141 may be essentially the same as what are shown and discussed in FIG. 1, and hence are not repeated herein. After the cover layer 141 is formed, the semiconductor device structure 200*a* is obtained.

Figure 19:
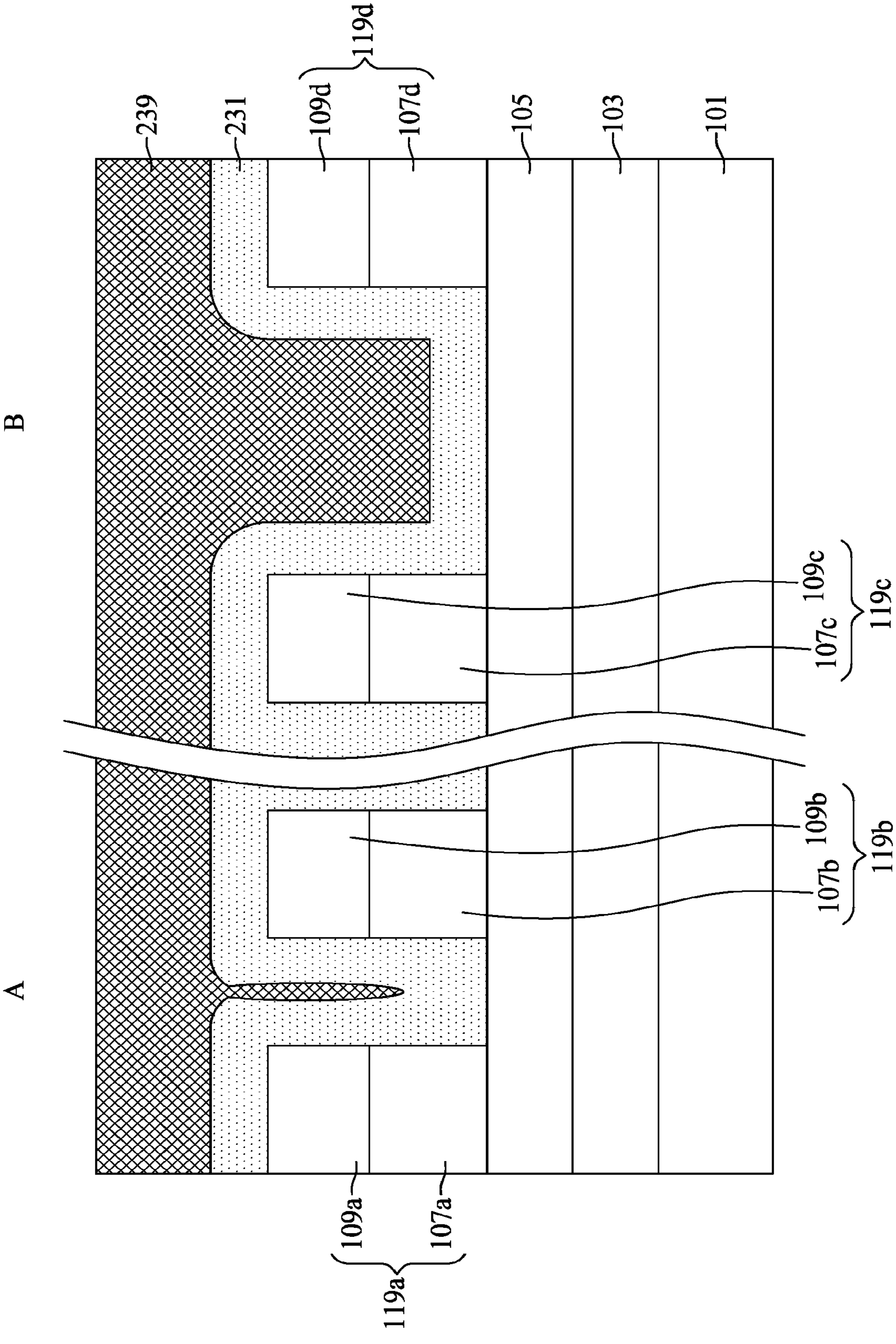
FIG. 19 is a cross-sectional view illustrating an intermediate stage of forming a filling layer over the dielectric liner layer during the formation of the semiconductor device structure, in accordance with some embodiments.
Figure 20:
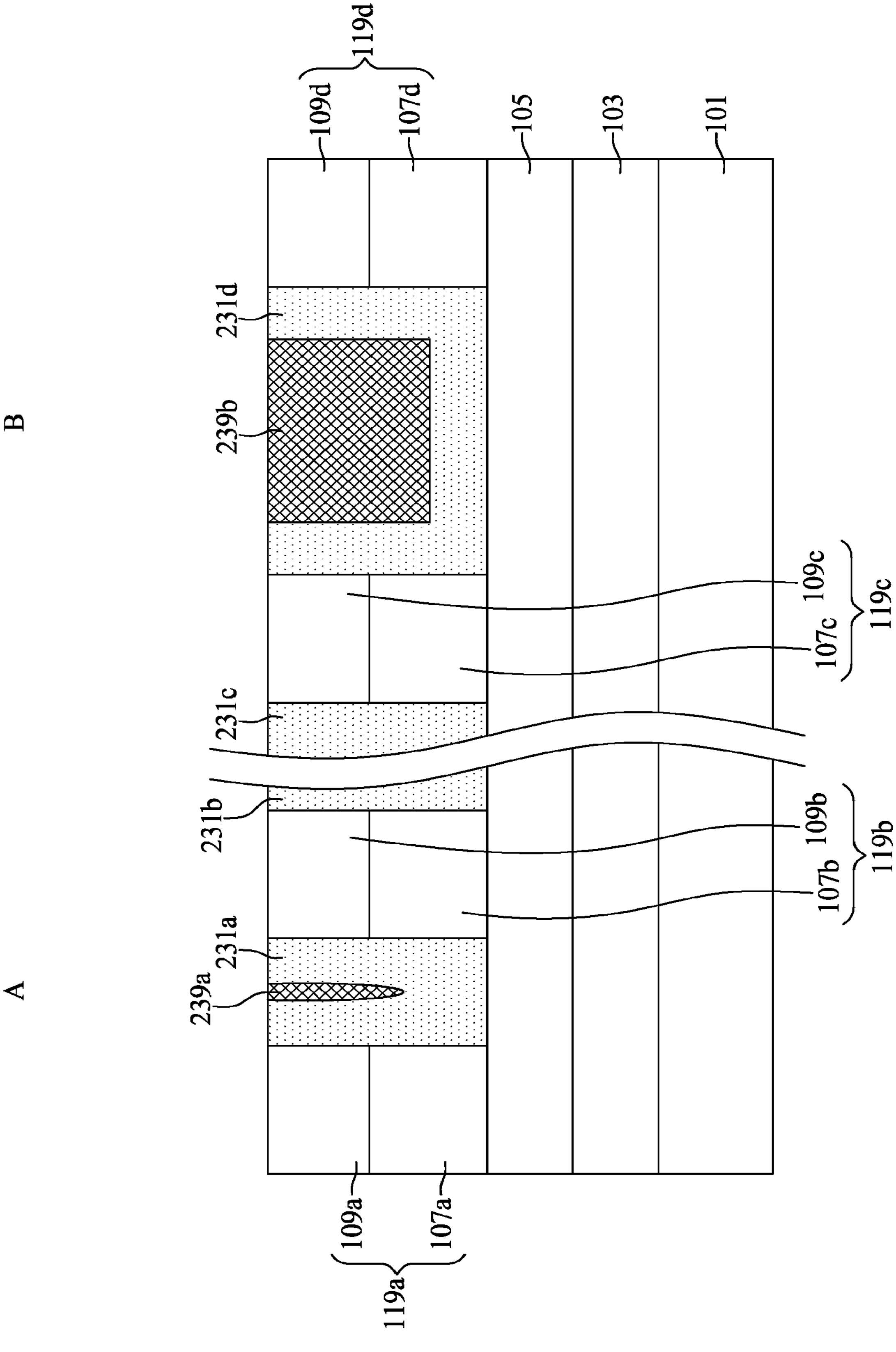
FIG. 20 is a cross-sectional view illustrating an intermediate stage of partially removing the filling layer and the dielectric liner layer to expose the second conductive layer during the formation of the semiconductor device structure, in accordance with some embodiments.

FIGS. 19 and 20 are cross-sectional views illustrating intermediate stages of forming the semiconductor device structure 200*b*, in accordance with some embodiments. It should be pointed out that operations for forming the semiconductor device structure 200*b* before the structure shown in FIG. 19 are substantially the same as the operations for forming the semiconductor device structure 200*a* shown in FIG. 16, and the related detailed descriptions may refer to the foregoing paragraphs and are not discussed again herein.

After the dielectric liner layer 231 is formed, a filling layer 239 is formed over the dielectric liner layer 231, as shown in FIG. 19 in accordance with some embodiments. In some embodiments, the gap 234 and the opening 126' are filled by the filling layer 239. The respective step is illustrated as the step S43 in the method 30 shown in FIG. 6.

In some embodiments, the filling layer 239 is made of or includes an energy removable material. The details of the energy removable material may be essentially the same as what are shown and discussed in FIG. 14, and hence are not repeated herein. In some embodiments, the filling layer 239 is formed by a sputtering process. However, any other suitable deposition methods may be utilized.

Next, the filling layer 239 and the dielectric liner layer 231 are partially removed to expose the interconnect structures 119*a*, 119*b*, 119*c* and 119*d* (i.e., the second conductive portions 109*a*, 109*b*, 109*c* and 109*d*), as shown in FIG. 20 in accordance with some embodiments. The respective step is illustrated as the step S45 in the method 30 shown in FIG. 6. After the filling layer 239 and the dielectric liner layer 231 are partially removed, dielectric liner portions 231*a*, 231*b*, 231*c*, 231*d* and filling portions 239*a* and 239*b* are obtained.

In some embodiments, the dielectric liner portions 231*a*, 231*b* and the filling portion 239*a* are in the first region A, and the dielectric liner portions 231*c*, 231*d*, and the filling portion 239*b* are in the second region B. In some embodiments, the filling layer 239 and the dielectric liner layer 231 are partially removed by a planarization process, an etch-back process, or a combination thereof. The planarization process may include a CMP process.

Subsequently, a cover layer 141 is formed over the interconnect structures 119*a*, 119*b*, 119*c*, and 119*d*, as shown in FIG. 4 in accordance with some embodiments. In some embodiments, the cover layer 141 is formed over and in direct contact with the top surfaces of the interconnect structures 119*a*, 119*b*, 119*c*, 119*d* (i.e., the top surfaces of the second conductive portions 109*a*, 109*b*, 109*c*, 109*d*), the top surfaces of the dielectric liner portions 231*a*, 231*b*, 231*c*, 231*d*, and the top surfaces of the filling portions 239*a* and 239*b*. The respective step is illustrated as the step S47 in the method 30 shown in FIG. 6.

The details of the cover layer 141 may be essentially the same as what are shown and discussed in FIG. 1, and hence are not repeated herein. After the cover layer 141 is formed, the semiconductor device structure 200*b* is obtained. In some embodiments, a heat treatment process can be performed to transform the filling portions 239*a* and 239*b* into air gaps (not shown). In some embodiments, the heat treatment process is optional. In some embodiments, the temperature used in the heat treatment process may be high enough to efficiently burn-out the filling portions 239*a* and 239*b*, such that air gaps are formed. In some other embodiments, the temperature used in the heat treatment process is selected such that an air gap surrounded or enclosed by a remaining portion of the filling portion is obtained in the first region A and/or the second region B of the semiconductor device structure 200*b*.

Embodiments of the semiconductor device structure and method for preparing the same are provided in the disclosure. In some embodiments, the semiconductor device structure (e.g., the semiconductor device structure 100*a* or 100*b*) includes a first interconnect structure, a second interconnect structure, a first dielectric liner portion disposed adjacent to the first interconnect structure, and a second dielectric liner portion disposed adjacent to the second interconnect structure. The semiconductor device structure also includes a filling portion surrounded by the second dielectric liner portion, and an air gap is enclosed in the first dielectric liner portion, which helps to reduce the capacitive coupling between adjacent interconnect structures, and RC delay can be decreased. As a result, performance (e.g., operation speed) and reliability of the semiconductor device structure can be improved.

In some embodiments, the semiconductor device structure (e.g., the semiconductor device structure 200*a* or 200*b*) includes a first interconnect structure, a second interconnect structure, a first dielectric liner portion disposed adjacent to the first interconnect structure, and a second dielectric liner portion disposed adjacent to the second interconnect structure. The semiconductor device structure also includes a first filling portion surrounded by the first dielectric liner portion, and a second filling portion surrounded by the second dielectric liner portion, the material(s) of the first filling portion and the second filling portion can be selected to reduce the capacitive coupling between adjacent interconnect structures, and RC delay can be decreased. As a result, performance (e.g., operation speed) and reliability of the semiconductor device structure can be improved. Moreover, the first filling portion and the second filling portion with different widths can be formed from the same material(s) with the same process step(s). Therefore, manufacturing cost and processing time can be reduced.

Figure 21:
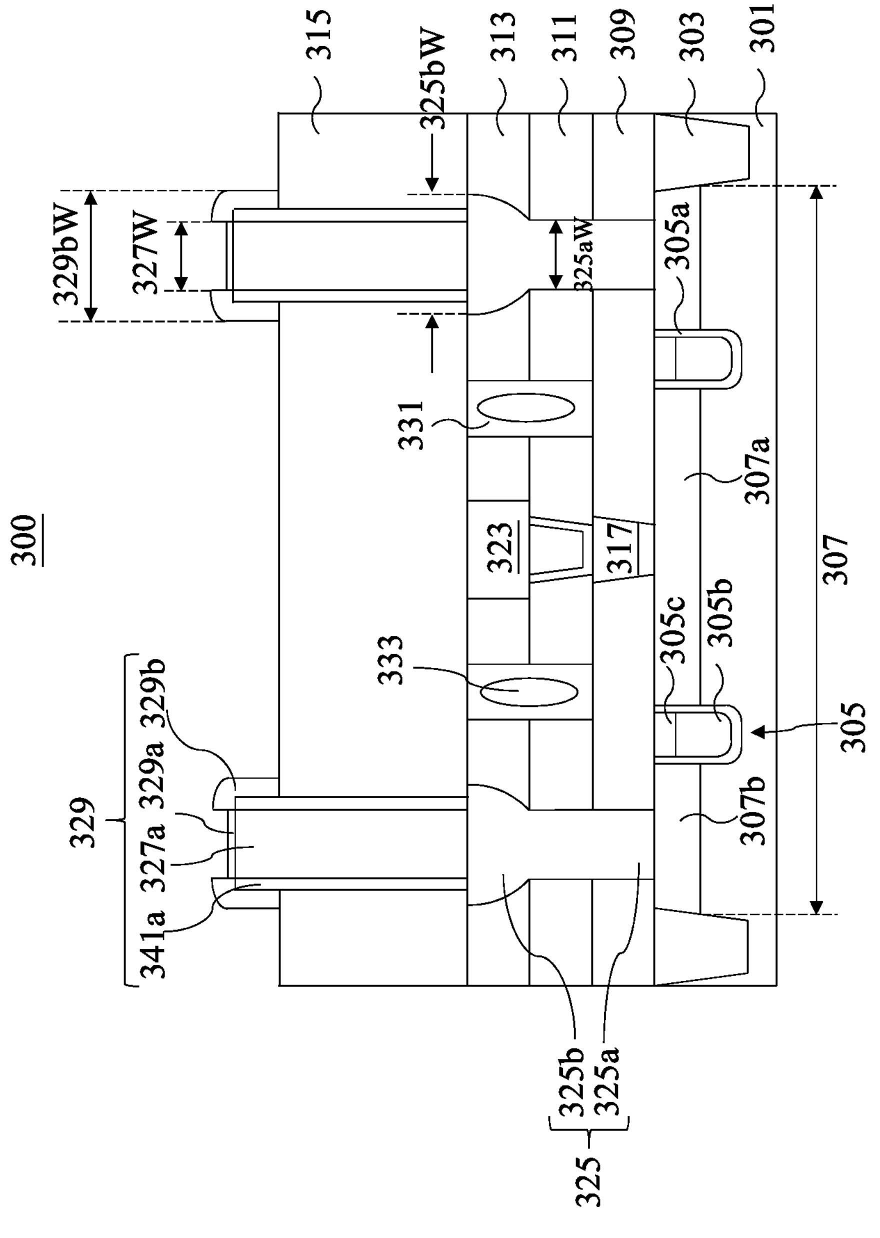
FIG. 21 is a schematic diagram of a semiconductor structure according to some embodiments of the present disclosure.

In some embodiments, the semiconductor device structures 100*a*, 100*b*, 200*a*, and/or 200*b* can be integrated into another structure, such as a semiconductor structure 300 having metal plugs shown in FIG. 21 and a semiconductor structure 500 having contacts shown in FIG. 42.

Reference is made to FIG. 21. FIG. 21 is a schematic diagram of the semiconductor structure 300 according to some embodiments of the present disclosure. In some embodiments, the semiconductor structure 300 includes a memory structure.

The semiconductor structure 300 includes a substrate 301, a plurality of isolation structures 303, a plurality of word lines 305, an active region 307, a first insulating film 309, a second insulating film 311, a third insulating film 313, a fourth insulating film 315, a contact 317, a bit line contact 319, a first coverage layer 321, a bit line 323, a plurality of capacitor contacts 325, a plurality of plugs 327, a plurality of landing pads 329. As illustrated in FIG. 21, the semiconductor structure 300 further includes a plurality of liner structures 331 and a plurality of air gaps 333 disposed in the plurality of liner structures 331, respectively.

The plurality of isolation structures 303 may be disposed in the substrate 301 and separated from each other. The plurality of isolation structures 303 defines the active region 307. The plurality of word lines 305 may be disposed in the substrate 301 and separated from each other. Each one of the plurality of word lines 305 includes a bottom layer 305*a*, a middle layer 305*b*, and a top layer 305*c*. The bottom layers 305*a* may be respectively inwardly disposed in the substrate 301. The middle layers 305*b* may be respectively correspondingly disposed on the bottom layers 305*a*. A top surface of middle layers 305*b* may be lower than a top surface of the substrate 301. The top layers 305*c* may be respectively correspondingly disposed on the middle layers 305*b*. A top surface of top layer 305*c* may be at the same vertical level as the top surface of the substrate 301.

The active region 307 may include a first doped region 307*a* and a plurality of second doped regions 307*b*. The first doped region 301 is disposed between an adjacent pair of the plurality of word lines 305. The second doped regions 307*b* are respectively disposed between the plurality of isolation structures 303 and the plurality of word lines 305.

The first insulating film 309 may be disposed on the substrate 301. The contact 317 is disposed in the first insulating film 309 and is electrically connected to the first doped region 307*a*. The capacitor contacts 325 are respectively disposed on the second doped regions 307*b* and are respectively electrically connected to the second doped regions 307*b*. In some embodiments, the contact 317 includes tungsten.

The second insulating film 311 may be disposed on the first insulating film 309. The bit line contact 319 may be disposed in the second insulating film 311. The first coverage layer 321 may be disposed in the second insulating film 311 and on a top surface of the contact 317. The first coverage layer 321 is disposed between the bit line contact 319 and the contact 317. In addition, the first coverage layer 321 may be disposed on and attached to sidewalls of the bit line contact 319. In some embodiments, the first coverage layer 321 includes tungsten nitride.

The third insulating film 313 may be disposed on the second insulating film 311. The bit line 323 may be disposed in the third insulating film 313 and on the bit line contact 319 and the first coverage layer 321. The fourth insulating film 315 may be disposed on the third insulating film 313. The plurality of plugs 327 may be disposed to pass through the fourth insulating film 315. The plurality of plugs 327 may be respectively correspondingly electrically connected to the capacitor contacts 325.

Each of the capacitor contacts 325 includes a neck portion 325*a* and a head portion 325*b* over the neck portion 325*a*. A width 325*b*W measured at the widest portion of the head portion 325*b* is larger than a width 325*a*W of the neck portion 325*a*. In some embodiments, the head portion 325*b* has a curved sidewall 325*c*. In some embodiments, the head portion 325*b* has a tapered profile.

Each of the landing pads 329 includes a first spacer 329*a* and a second spacer 329*b*. The first spacer 329*a* is disposed on a protruding portion 327*a* of the capacitor plug 327, and the second spacer 329*b* is disposed on a sidewall of the protruding portion 327*a*. In some embodiments, the width 329*b*W of the second spacer 329*b* is larger than the width 327W of the capacitor plug 327. A topmost surface of the second spacer 329*b* is higher than a top surface of the first spacer 239*a*. In some embodiments, the first spacer 329*a* includes polysilicon, and the second spacer 329*b* includes metal silicide from the polysilicon of the first spacer 329*a*. In some embodiments, the capacitor plug 327, the first spacer 329*a*, and the second spacer 329*b* form a landing pad 329 over the capacitor contact 325. In some embodiments, the first spacer 329*a*, the second spacer 329*b*, and the capacitor plugs 327 are collectively referred to as the land pad 329.

Each of the liner structures 331 is disposed in the second insulating film 311 and the third insulating film 313. In addition, each of the liner structures 331 is disposed between the capacitor contact 325 and the bit line 323. The air gap 333 is disposed in and enclosed by the liners structure 331.

In some embodiments, the liner structure 331 and the air gaps 333 have a relative lower dielectric layer than the second insulating film 311 and/or the third insulating film 313. Therefore, an effective capacitance between the capacitor contact 325 and the bit line 323 can be reduced. Alternatively stated, the capacitive coupling between the capacitor contact 325 and the adjacent bit line 323 can be reduced, and the RC constant can be decreased.

It should be noted that the number of liner structures 331 and air gaps 333 are provided for illustrative purposes, however, the present disclosure is not limited thereto. Various numbers of liner structures 331 and air gaps 333 are within the contemplated scope of the present disclosure.

In other embodiments, the air gap 333 may not by enclosed by the liner structure 331. In such embodiments, the air gap 333 is exposed to the fourth insulating film 315.

Reference is made to FIG. 22 to FIG. 41. FIG. 22 to FIG. 41 are cross-sectional views illustrating intermediate stages of forming the semiconductor structure 300 according to some embodiments of the present disclosure.

Figure 22:
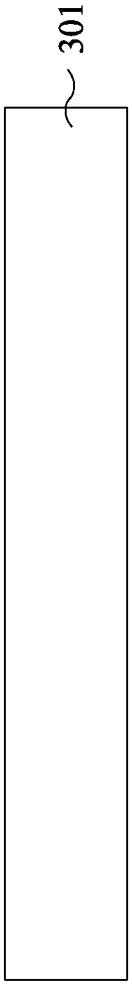
FIG. 22 to FIG. 41 are cross-sectional views illustrating intermediate stages of forming the semiconductor structure shown in FIG. 21 according to some embodiments of the present disclosure.

In FIG. 22, a substrate 301 may be provided. The substrate 301 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, or indium gallium phosphide.

Figure 23:
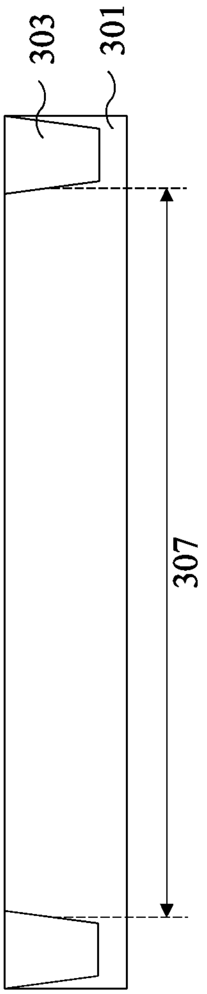

In FIG. 23, a plurality of isolation structures 303 may be formed in the substrate 301. The plurality of isolation structures 303 are separated from each other in a cross-sectional view and define an active regions 307. The plurality of isolation structures 303 may be formed of, for example, an insulating material such as silicon oxide, silicon nitride, silicon oxynitride, silicon nitride oxide, fluoride-doped silicate, or the like. In some embodiments, the silicon oxynitride refers to a substance which contains silicon, nitrogen, and oxygen and in which a proportion of oxygen is greater than that of nitrogen. The silicon nitride oxide refers to a substance which contains silicon, oxygen, and nitrogen and in which a proportion of nitrogen is greater than that of oxygen.

Figure 24:
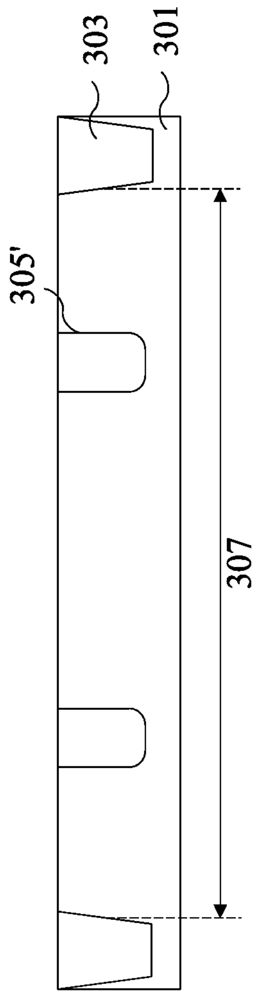

In FIG. 24, a plurality of trench openings 305' may be formed in the substrate 301. A photolithography process may be used to pattern the substrate 301 to define positions of the plurality of trench openings 305'. An etch process, such as an anisotropic dry etch process, may be performed to form the plurality of trench openings 305' in the substrate 301.

Figure 25:
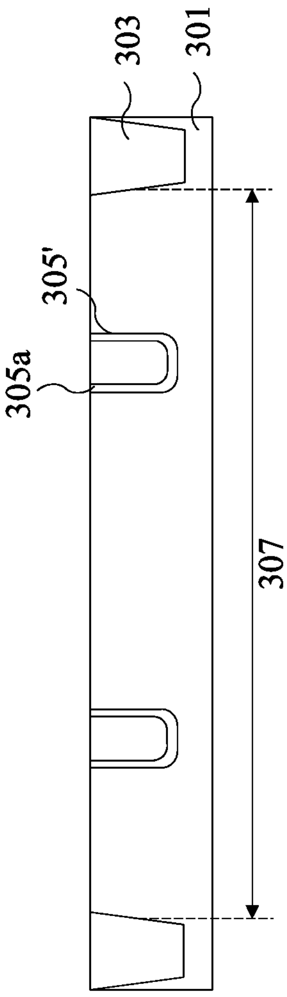

In FIG. 25, after the etch process, the plurality of bottom layers 305*a* may be correspondingly formed and attached to sidewalls and bottoms of the plurality of trench openings 305'. The plurality of bottom layers 305*a* may be formed of, for example, silicon oxide, silicon oxynitride, silicon nitride oxide, silicon nitride, or the like.

Figure 26:
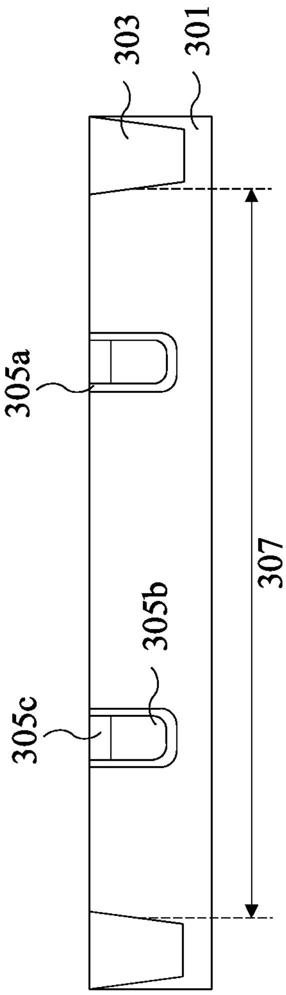

In FIG. 26, the plurality of middle layers 305*b* may be correspondingly formed on the plurality of bottom layers 305*a*. Top surfaces of the plurality of middle layers 305*b* may be lower than a top surface of the substrate 301. The plurality of middle layers 305*b* may be formed of, for example, doped polysilicon, metal material, or metal silicide. Metal silicide may be, for example, nickel silicide, platinum silicide, titanium silicide, molybdenum silicide, cobalt silicide, tantalum silicide, tungsten silicide, or the like. The plurality of top layers 305*c* may be correspondingly formed on the plurality of middle layers 305*b*. Top surfaces of the plurality of top layers 305*c* may be at the same vertical level as the top surface of the substrate 301. The plurality of top layers 305*c* may be formed of, for example, silicon oxide, silicon oxynitride, silicon nitride oxide, silicon nitride, or the like.

Figure 27:
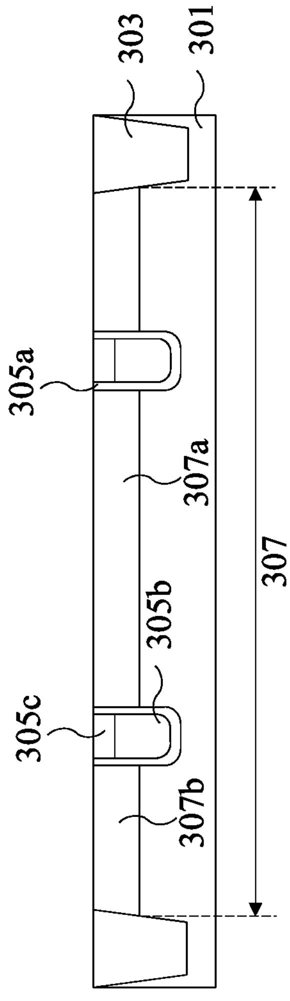

In FIG. 27, a first doped region 307*a* and second doped regions 307*b* may be formed in the active region 307 of the substrate 301. The first doped region 307*a* is disposed between an adjacent pair of the plurality of word lines 305. The second doped regions 307*b* are respectively disposed between the plurality of isolation structures 303 and the plurality of word lines 305. The first doped region 307*a* and the second doped regions 307*b* are respectively doped with a dopant such as phosphorus, arsenic, or antimony. The first doped region 307*a* and the second doped regions 307*b* respectively have dopant concentrations ranging from about 1E17 atoms/cm3 to about 1E19 atoms/cm3.

Figure 28:
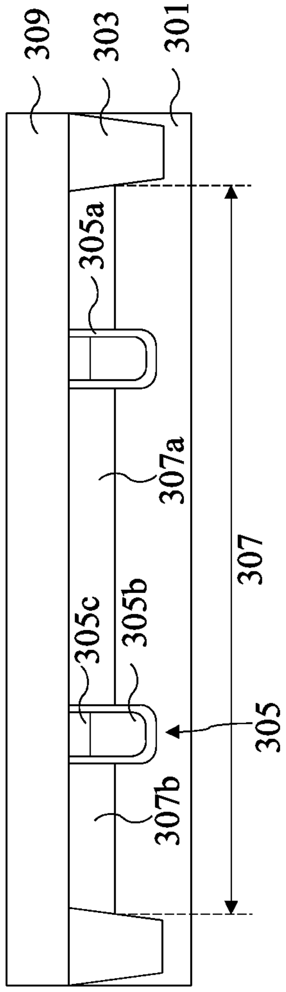

In FIG. 28, a first insulating film 309 may be formed on the substrate 301. The first insulating film 309 may be formed of, for example, silicon nitride, silicon oxide, silicon oxynitride, undoped silica glass, borosilica glass, phosphosilica glass, borophosphosilica glass, or a combination thereof, but is not limited thereto.

Figure 29:
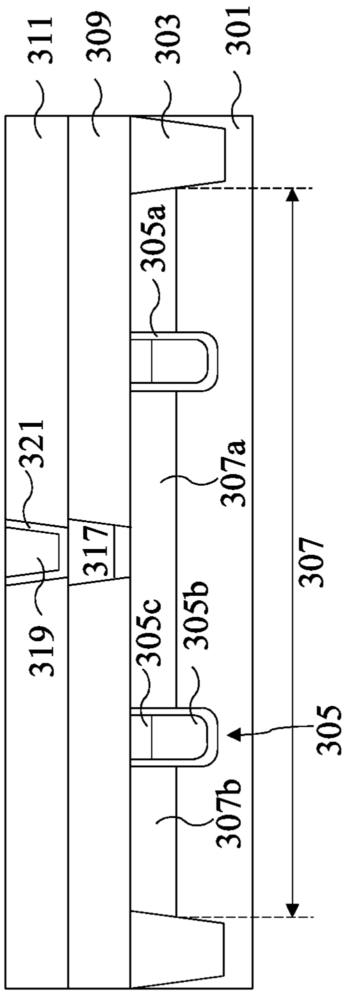

In FIG. 29, a contact 317 may be formed in the first insulating film 309. A photolithography process may be used to pattern the first insulating film 309 to define a position of the contact 317. An etch process, such as an anisotropic dry etch process, may be performed after the photolithography process to form an opening in the first insulating film 309. After the etch process, a conductive material, for example, aluminum, copper, tungsten, cobalt, or other suitable metal or metal alloy is deposited, by a metallization process such as chemical vapor deposition, physical vapor deposition, sputtering, or the like, in the opening to form the contact 317. A planarization process, such as chemical mechanical polishing, may be performed after the metallization process to remove excess deposited material and provide a substantially flat surface for subsequent processing steps.

The contact 317 is disposed on the first doped region 307*a* and is electrically connected to the first doped region 307*a*. In the embodiments, the contact 317 includes tungsten. Defects may be easily formed on a top surface of the contact 317 including tungsten when the top surface of the contact 317 is exposed to oxygen or air. The defects may affect the yield of the semiconductor device 300.

A second insulating film 311 may be formed on the first insulating film 309. The second insulating film 311 may be formed of a same material as the material of the first insulating film 309, but is not limited thereto. A photolithography process may be used to pattern the second insulating film 311 to define a position of bit line contacts 319. An etch process, such as an anisotropic dry etch process, may be performed after the photolithography process to form a bit line contact opening in the second insulating film 311. A top surface of the contact 317 may be exposed through the bit line contact opening. A cleaning process using a reducing agent may be optionally performed to remove the defects on the top surface of the contact 317. The reducing agent may be titanium tetrachloride, tantalum tetrachloride, or a combination thereof.

After the cleaning process, a first coverage layer 321 may be formed to cover bottoms and sidewalls of the bit line contact opening. In some embodiments, the first coverage layer 321 includes tungsten nitride. The first coverage layer 321 may prevent the top surface of the contact 317 from being exposed to oxygen or air; therefore, the first coverage layer 321 may reduce formation of the defects on the top surface of the contact 317. A conductive material, for example, aluminum, copper, tungsten, cobalt, or other suitable metal or metal alloy is deposited, by a metallization process such as chemical vapor deposition, physical vapor deposition, sputtering, or the like, in the bit line contact opening to form the bit line contacts 319. A planarization process, such as chemical mechanical polishing, may be performed after the metallization process to remove excess deposited material and provide a substantially flat surface for subsequent processing steps.

Figure 30:
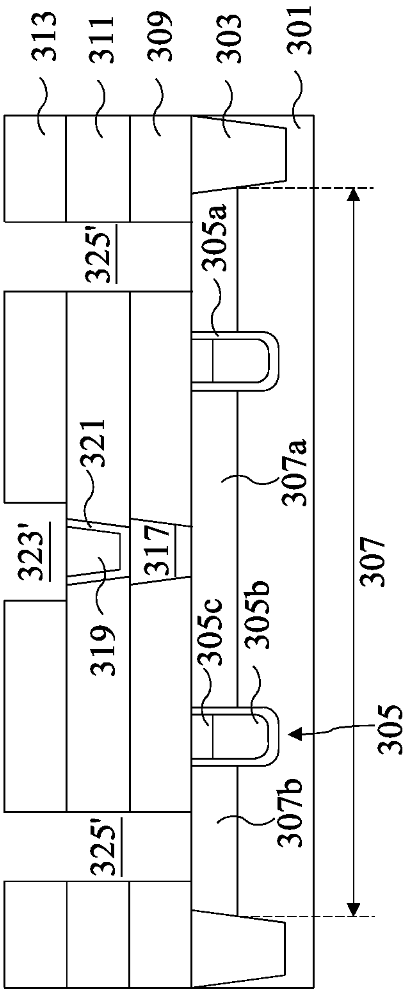

In FIG. 30, a third insulating film 313 may be formed on the second insulating film 311. The third insulating film 313 may be formed of a same material as the material of the first insulating film 309, but is not limited thereto. A photolithography process may be used to pattern the third insulating film 313 to define a position of the bit line 323. An etch process, such as an anisotropic dry etch process, may be performed after the photolithography process to form a bit line trench opening 323' in the third insulating film 313. In some embodiments, the photolithography process may also pattern the third insulating film 313 to define positions of a plurality of contact holes 325', and an etch process may be performed to form a plurality of contact holes 325' penetrating through the third insulating film 313, the second insulating film 311, and the first insulating film 309. In other words, the contact holes 325' are considered deep holes, while the bit line trench opening 323' are considered a relatively shallow hole.

Figure 31:
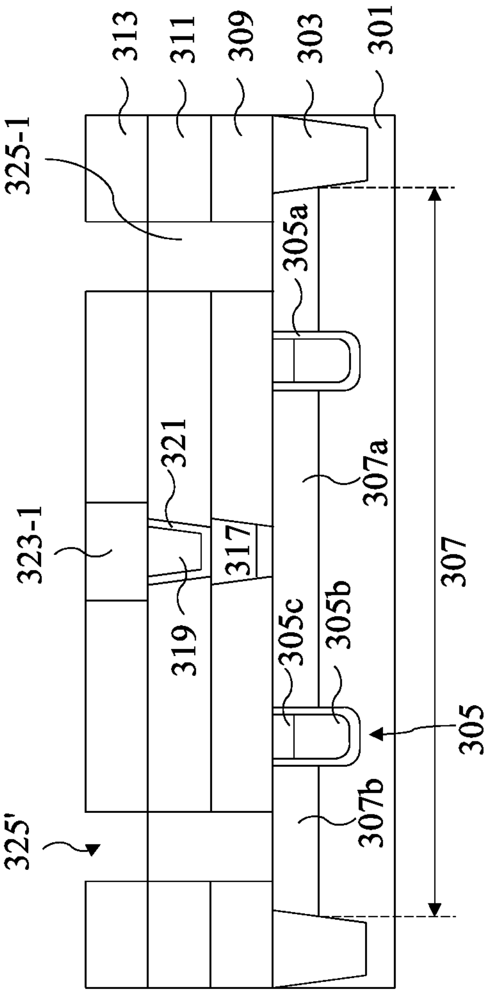

In FIG. 31, the bit line trench opening 323' and the contact holes 325' may be filled with material by processes such as chemical vapor deposition, physical vapor deposition, sputtering, or the like. In some embodiments, the contact holes 325' is deeper than the bit line trench opening 323', and the bit line trench opening 323' may be completely filled by a filling material 323-1, and the contact holes 325' may be partially filled by a filling material 325-1, which can be the same as the filling material 323-1. In some embodiments, the upper portion of the contact holes 325' in the third insulating film 313 is not filled by the filling material 325-1.

Figure 32:
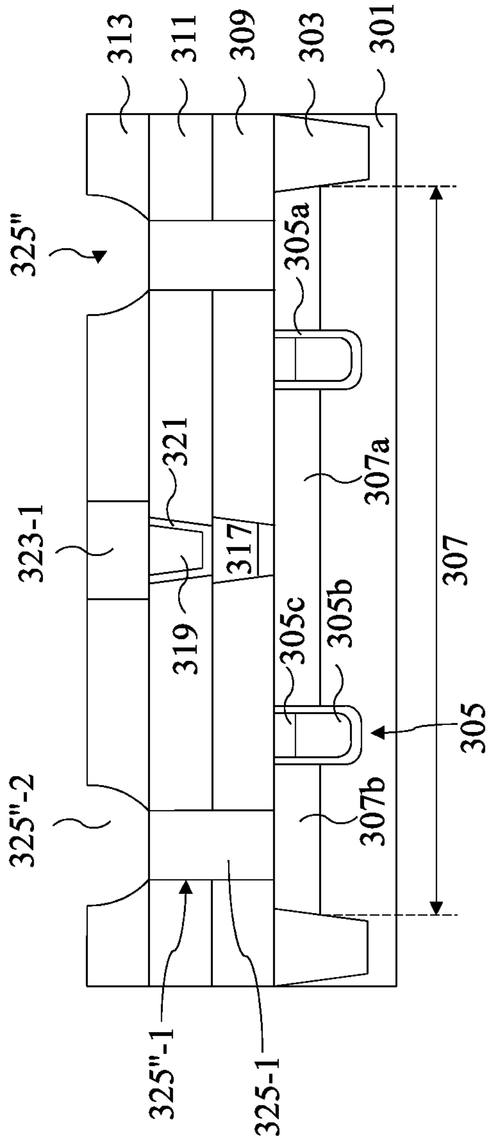

In FIG. 32, an etch process, such as an isotropic etch process, may be performed to remove a portion of the third insulating film 313 around the contact holes 325' to form a plurality of transformed holes 325" having a narrow portion 325"-1 occupied by the filling material 325-1 in the second insulating film 311 and a wide portion 325"-2 in the third insulating film 313.

Figure 33:
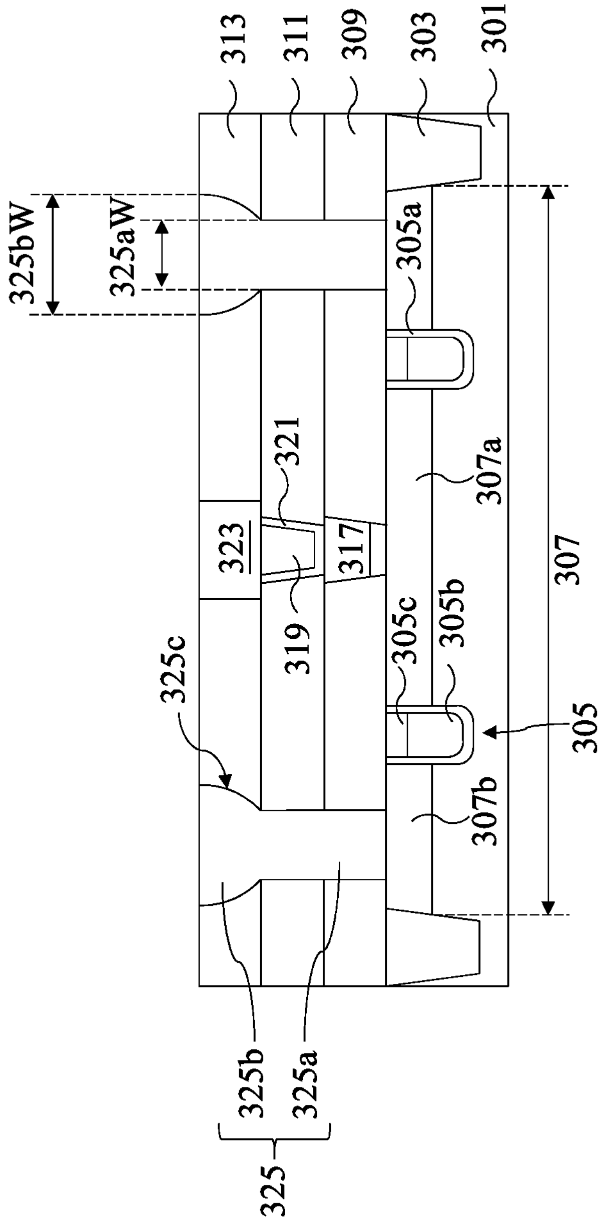

In FIG. 33, the filling material 325-1 and the filling material 323-1 are stripped from the transformed holes 325" and the bit line trench opening 323', respectively. After stripping the filling materials, a conductive material, for example, aluminum, copper, tungsten, cobalt, or other suitable metal or metal alloy is deposited, by a metallization process such as chemical vapor deposition, physical vapor deposition, sputtering, or the like, in the plurality of bit line trench opening 323' to form a bit line 323 and in the transformed holes 325" to form a plurality of capacitor contacts 325. A planarization process, such as chemical mechanical polishing, may be performed after the metallization process to remove excess deposited material and provide a substantially flat surface for subsequent processing steps.

The capacitor contact 325 includes a neck portion 325*a* and a head portion 325*b* over the neck portion 325*a*. In some embodiments, the head portion 325*b* has a curved sidewall 325*c*. In some embodiments, the head portion 325*b* has tapered profile.

Figure 34:
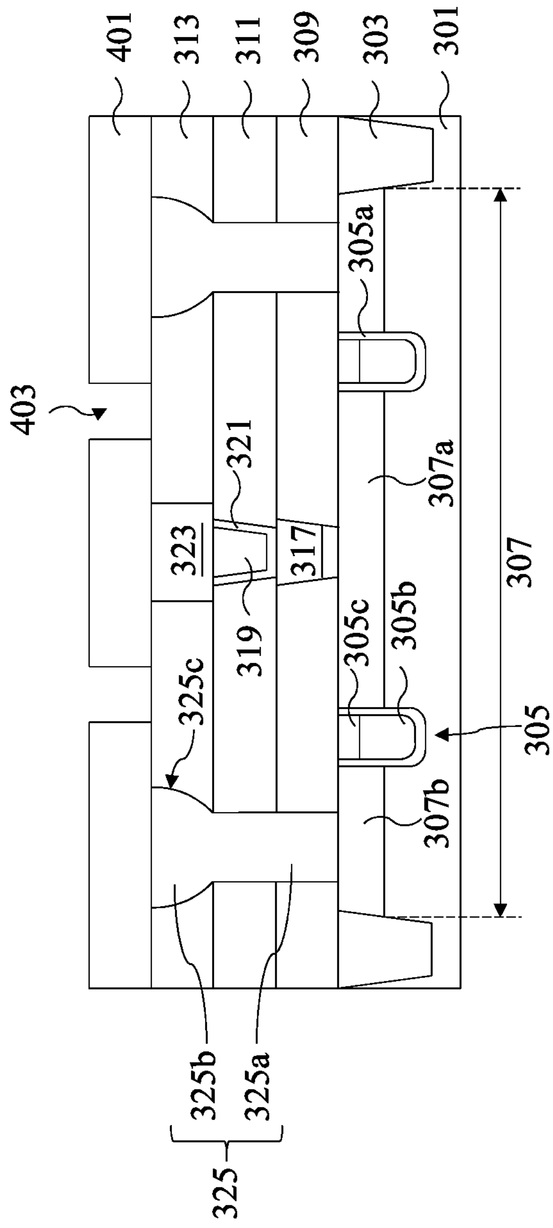

In FIG. 34, a patterned mask 401 with a plurality of openings 403 is formed over the third insulating film 313. The third insulating film 313 is partially exposed by the openings 403. In some embodiments, the third insulating film 313 and the patterned mask 401 include different materials so that the etching selectivities may be different in the subsequent etching process.

Figure 35:
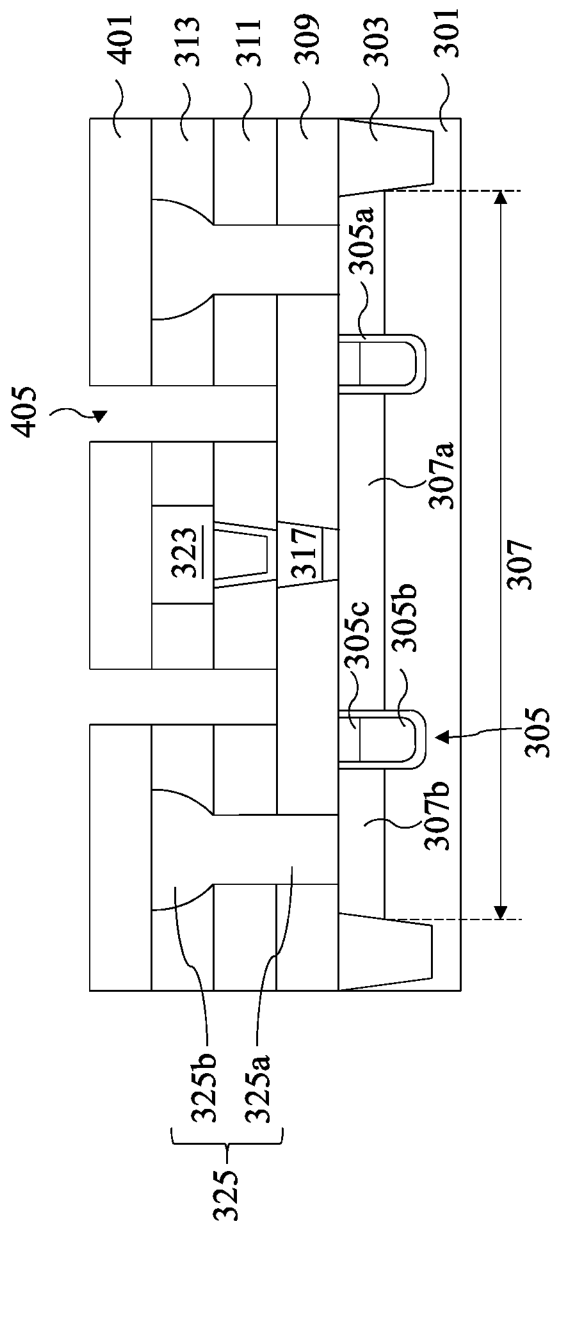

In FIG. 35, an etching process is performed using the patterned mask 401 as an etching mask, such that openings 405 are formed penetrating through the second insulating film 311 and the third insulating film 313. The first insulating film 309 is partially exposed by the openings 405. In some embodiments, the etching process for forming the openings 405 includes a wet etching process, a dry etching process, or a combination thereof.

Figure 36:
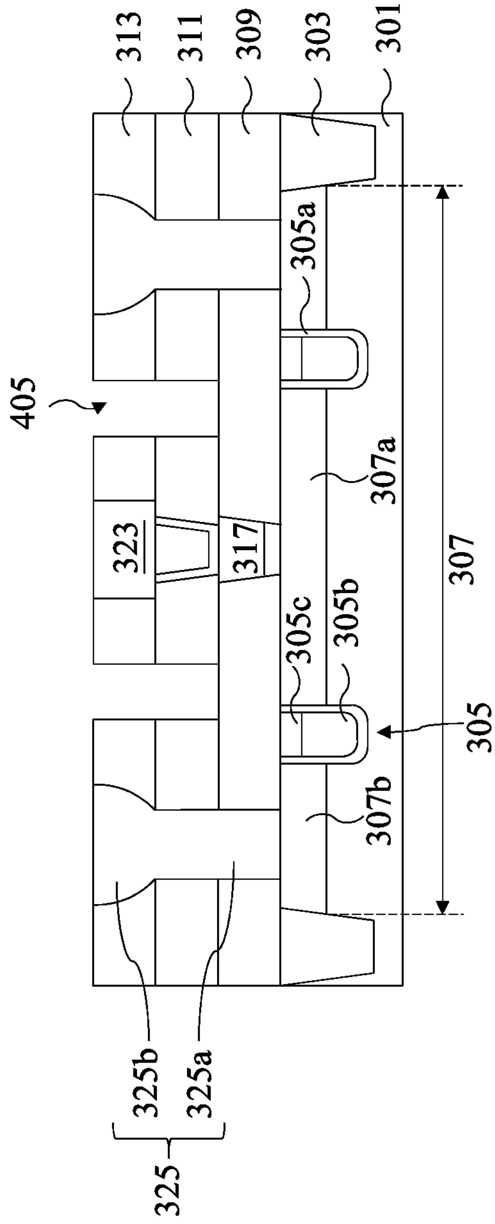

In FIG. 36, the patterned mask 401 is removed. In some embodiments, the patterned mask 401 is removed by a stripping process, an ashing process, an etching process, or another suitable process. After the patterned mask 401 is removed, the top surfaces of the third insulating film 313, the head portion 325*b* of the capacitor contact 325, and the bit line 323 are exposed.

Figure 37:
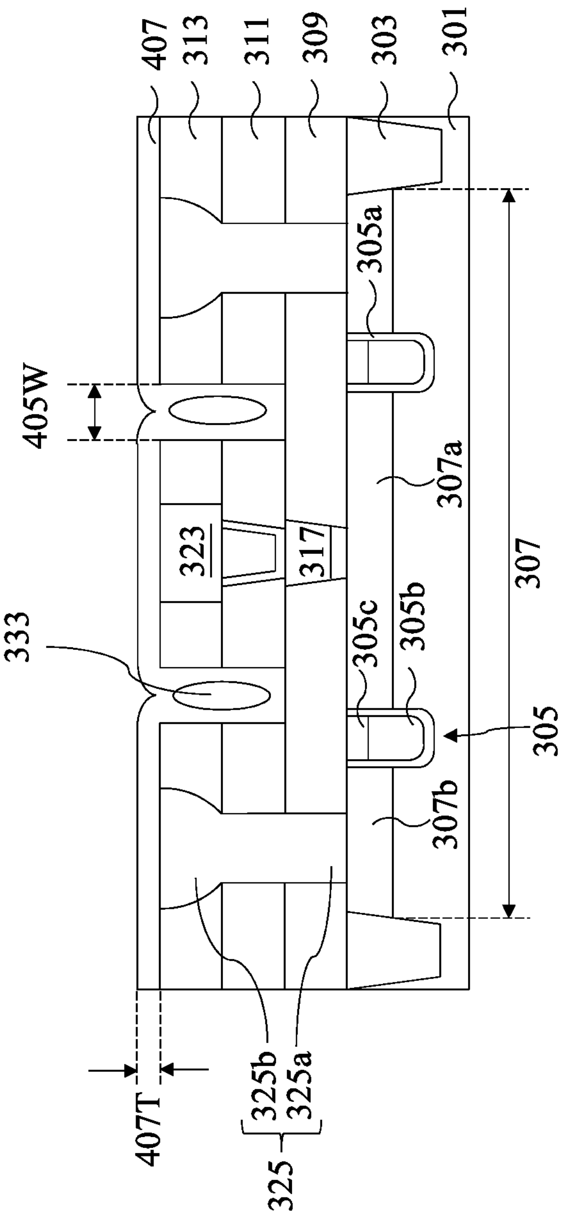

In FIG. 37, a dielectric liner layer 407 is conformally formed in the openings 405 and over the top surfaces of the third insulating film 313, the head portion 325*b* of the capacitor contact 325, and the bit line 323.

In some embodiments, a thickness 407T of the dielectric liner layer 407 is adjusted such that an air gap 333 is enclosed in the portion of the dielectric liner layer 407 filled in the openings 405. In some embodiments, a width 405W of the opening 405 is less than two times of the thickness 407T of the dielectric liner layer 407.

Moreover, in some embodiments, the dielectric liner layer 407 is made of or includes boron carbonitride (BCN). However, any other suitable dielectric materials may be utilized. The dielectric liner layer 407 may be formed by a deposition process, such as a CVD process, a PVD process, an ALD process, a spin-on coating process, or another suitable method. In some embodiments, the air gap 333 is enclosed (or sealed) in the portion of the dielectric liner layer 407 filled in the opening 405. In other words, the air gap 333 is not exposed.

Figure 38:
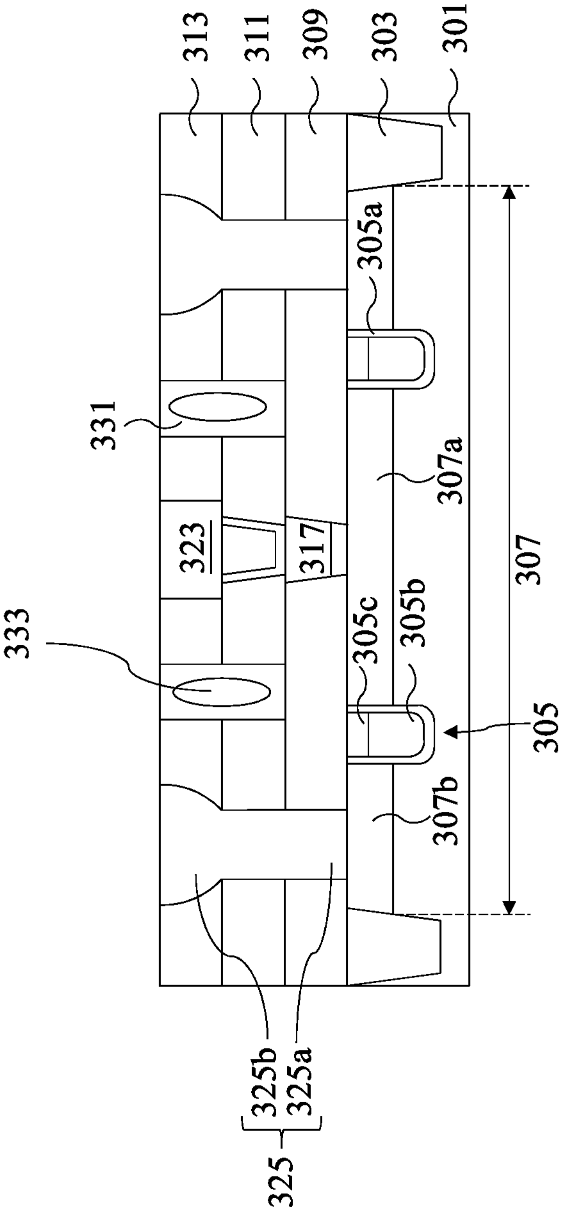

In FIG. 38, the dielectric liner layer 407 is partially removed to be a liner structure 331. In some embodiments, the dielectric liner layer 407 is removed by a planarization process, an etch-back process, or a combination thereof. The planarization process may include a chemical mechanical polishing (CMP) process. It should be noted that the air gap 333 do not protrude from the top surface of the third insulating film 313, therefore, the air gap 333 is still enclosed (or sealed) by the liner structure 331 after the planarization process and/or the etch-back process.

Figure 39:
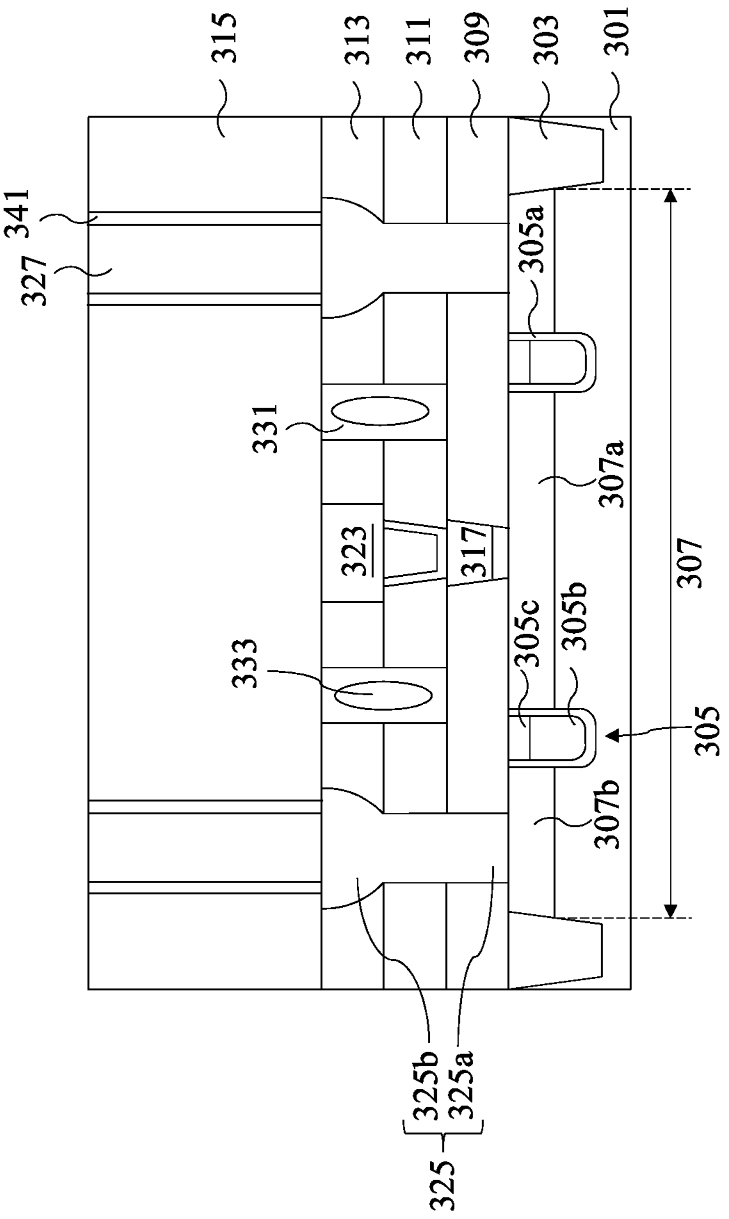

In FIG. 39, a fourth insulating film 315 may be formed on the third insulating film 313. The fourth insulating film 315 may be formed of a same material as the material of the first insulating film 309, but is not limited thereto. A photolithography process may be used to pattern the fourth insulating film 315 to define positions of the plurality of capacitor plugs 327.

An etch process, such as an anisotropic dry etch process, may be performed after the photolithography process to form a plurality of plug openings passing through the fourth insulating film 315 to expose the head portion 325*b*. After the etch process, a conductive material, for example, aluminum, copper, tungsten, cobalt, or other suitable metal or metal alloy is deposited, by a metallization process such as chemical vapor deposition, physical vapor deposition, sputtering, or the like, in the plurality of plug openings to form the plurality of capacitor plugs 327 over the head portion 325*b*. In some embodiments, a plurality of barrier layers 341 may be respectively correspondingly disposed between the capacitor plugs 327 and the fourth insulating film 315. A planarization process, such as chemical mechanical polishing, may be performed after the metallization process to remove excess deposited material and provide a substantially flat surface for subsequent processing steps.

Figure 40:
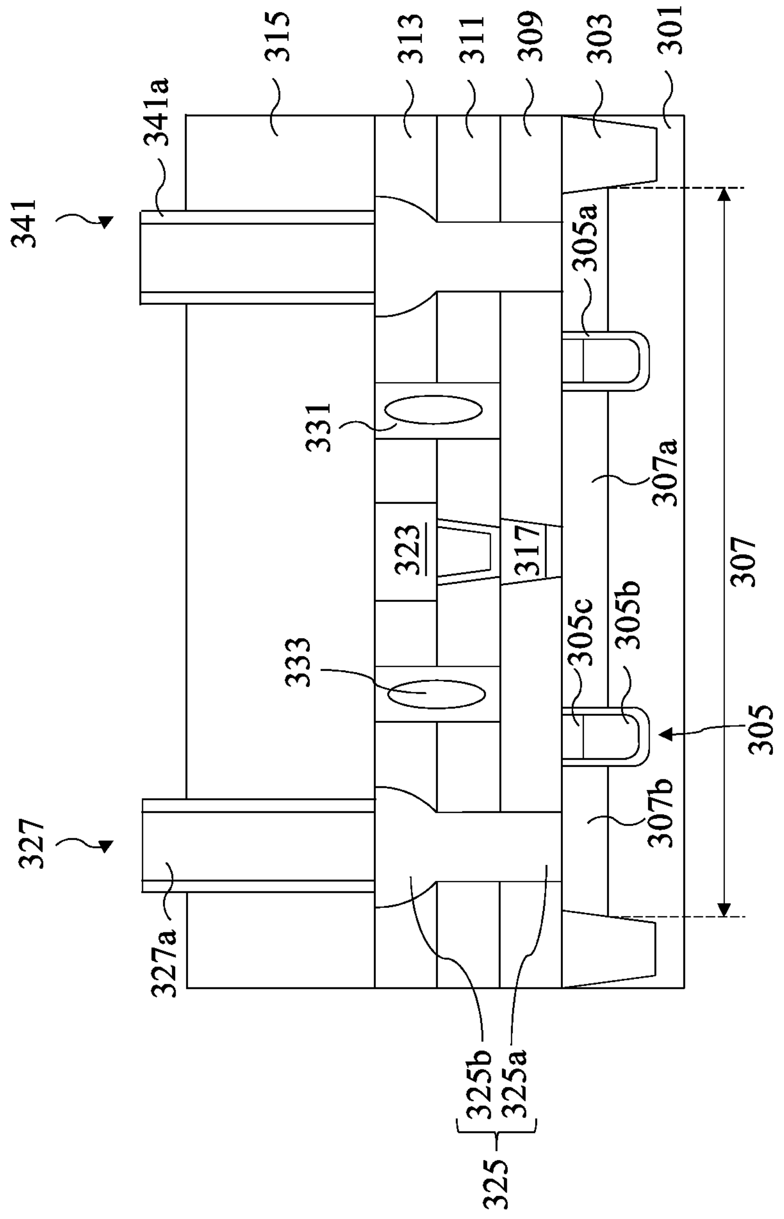

In FIG. 40, an etching back process is performed to remove a top portion of the fourth insulating film 315 to expose a protruding portion 327*a* of the capacitor plug 327 and a top portion 341*a* of the barrier layer 341. In some embodiments, after the etching back process, the top surface of the capacitor plug 327 is higher than that of the fourth insulating film 315, and the sidewall of the top portion 341*a* is exposed.

Figure 41:
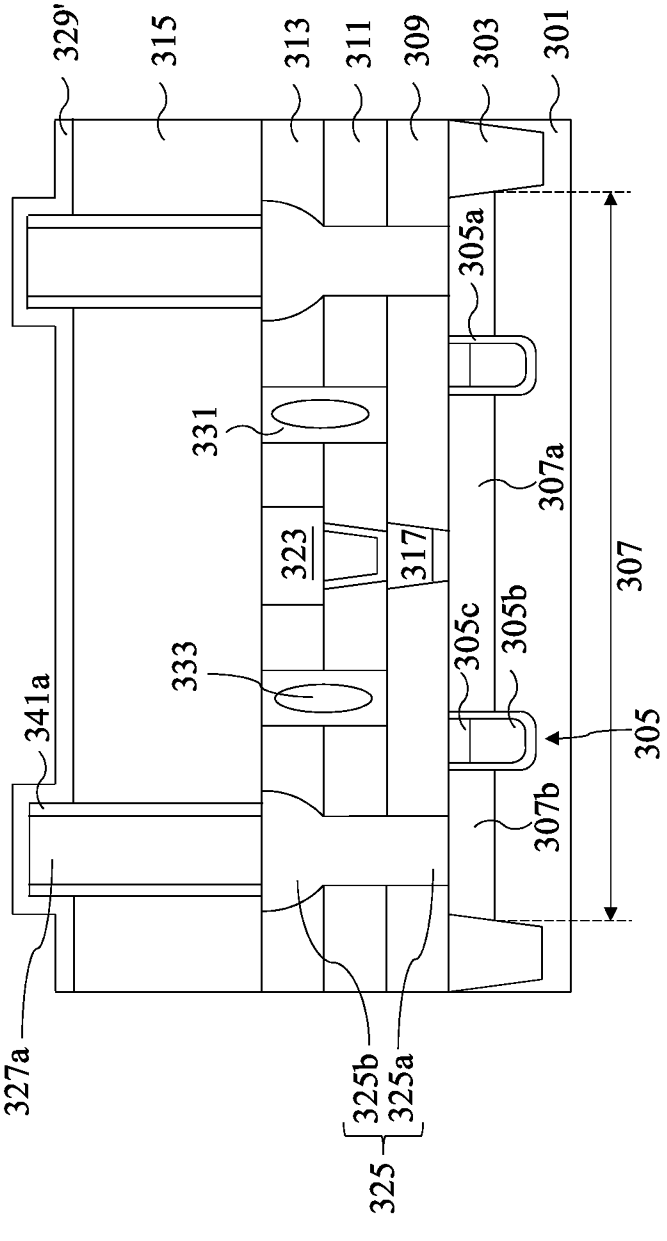

In FIG. 41, a deposition process is performed to form a liner layer 329', covering the top surface of the fourth insulating film 315, the top surface of the protruding portion 327*a*, the top surface of the top portion 341*a*, and the sidewall of the top portion 341*a*. In some embodiments, the liner layer 329' is a silicon-containing layer such as polysilicon layer.

After the liner layer 329' is deposited, a thermal process is performed to form a plurality of landing pads 329 over the fourth insulating film 315. Each of the landing pad 329 includes the capacitor plug 327, the barrier layers 341, a first silicide layer (metal silicide) 329*a* over the protruding portion 327*a*, and a second silicide layer (metal silicide) 329*b* on a sidewall of the top portion 341*a*. In some embodiments, the thermal process is an alicidation process.

The thermal process transforms a portion of the protruding portion 327*a* and the liner layer 329' into the first silicide layer 329*a*, and transforms the top portion 341*a* of the barrier layers 341 and the liner layer 329' into the second silicide layer 329*b*. Based on the thermal process described above, the landing pad 329 is formed without using the lithographic technique, i.e., the landing pad 329 is self-aligned to the capacitor plug 327. In some embodiments, the thickness and shape of the protruding portion 327*a* and the top portion 341*a* may be changed after the thermal process (not shown in FIG. 21).

After the thermal process, the semiconductor structure 300 is formed.

Figure 42A:
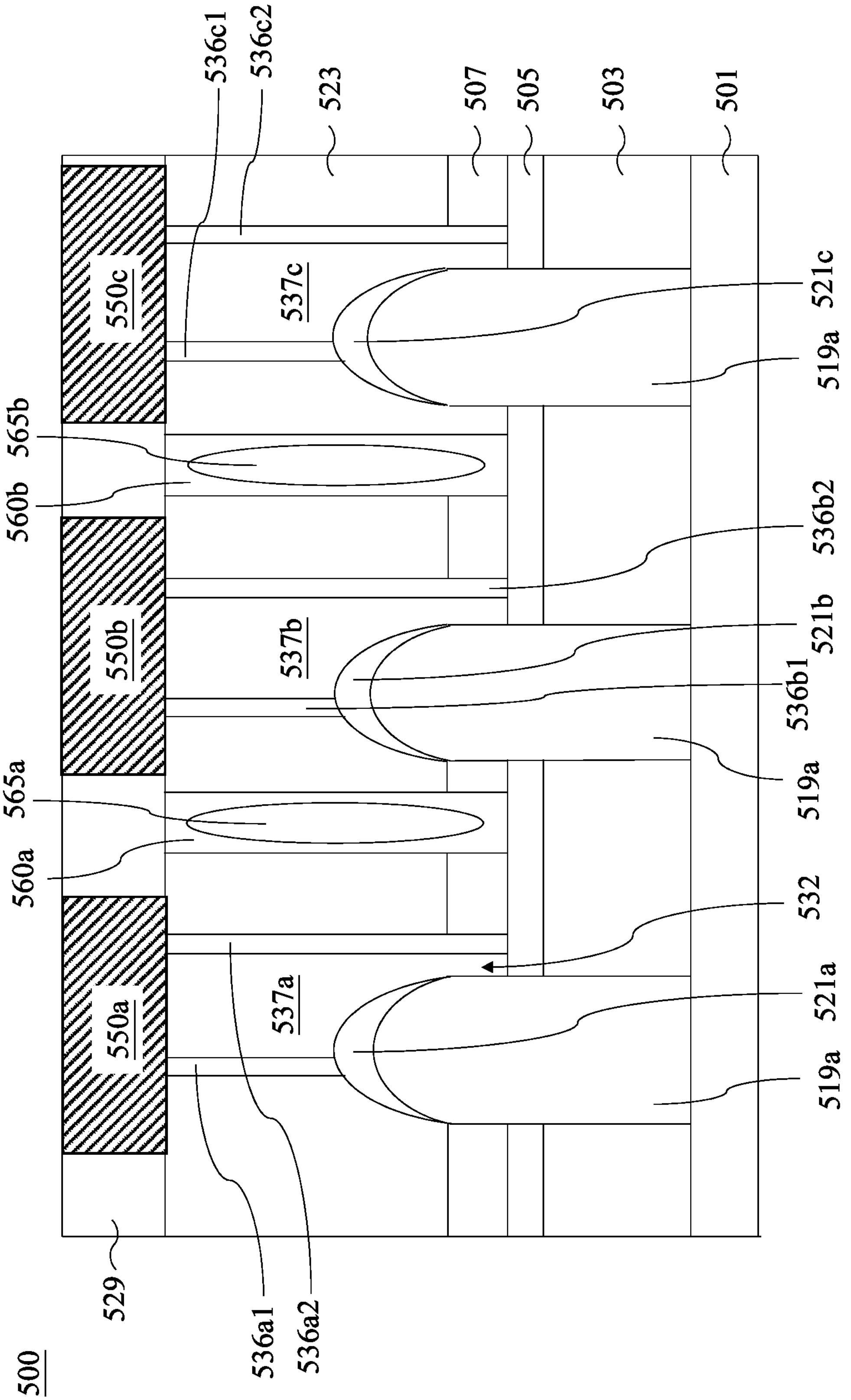
FIG. 42*a* is a schematic diagram of a semiconductor structure according to some embodiments of the present disclosure.
Figure 42B:
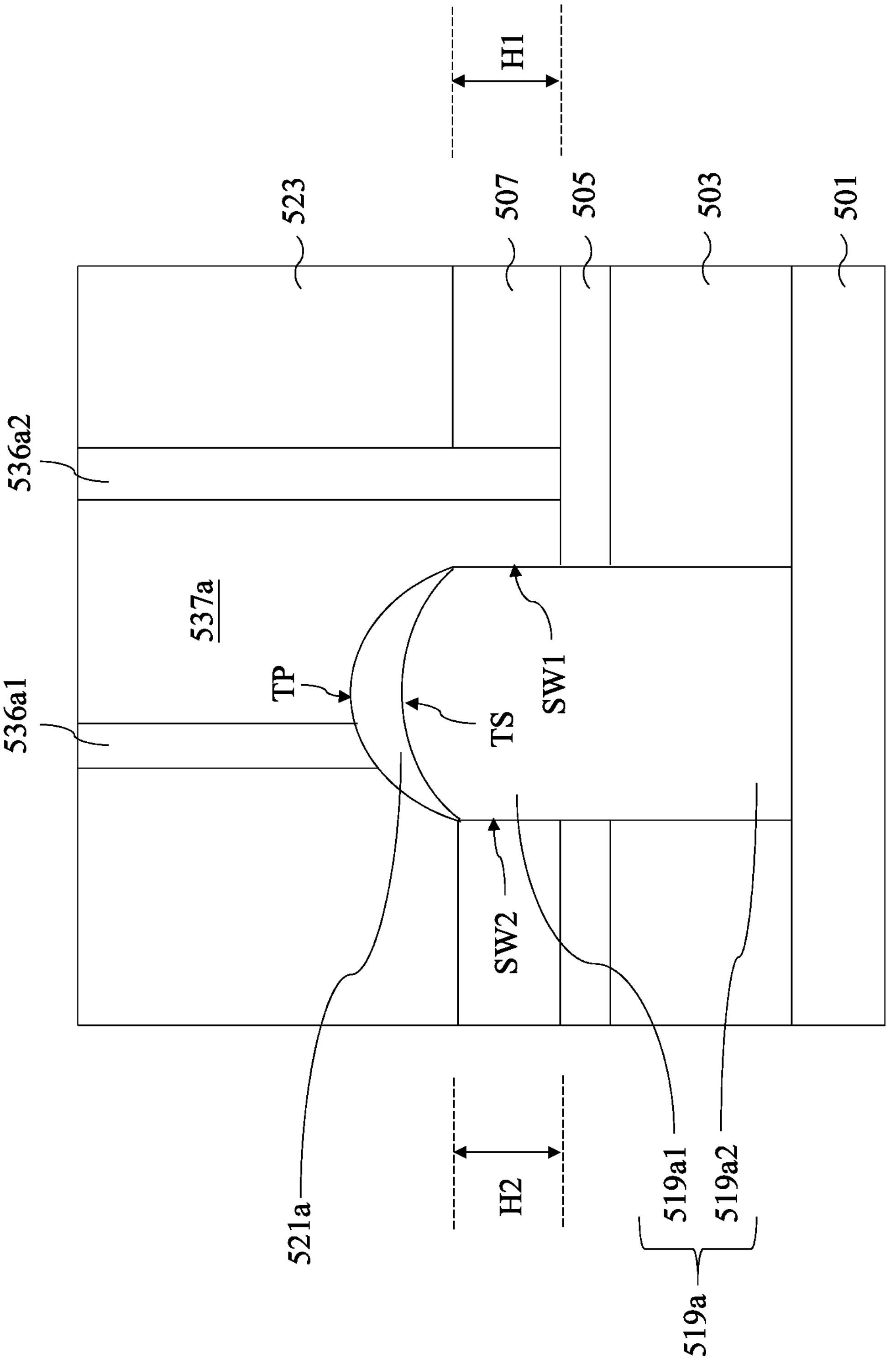
FIG. 42*b* is a schematic diagram of partial enlarged view of the semiconductor device shown in FIG. 42*a* according to some embodiments of the present disclosure

Reference is made to FIG. 42*a* and FIG. 42*b*. FIG. 42*a* is a schematic diagram of the semiconductor structure 500 according to some embodiments of the present disclosure. FIG. 42*b* is a partial enlarged view of the semiconductor device 500 according to some embodiments of the present disclosure. In some embodiments, the semiconductor structure 500 includes a memory structure, such as a dynamic random access memory (DRAM).

The semiconductor device 500 includes a first dielectric layer 503, a metal plug 519*a*, a metal plug 519*b*, and a metal plug 519*c* disposed over a semiconductor substrate 501. Moreover, in some embodiments, an etch stop layer 505 is disposed over the first dielectric layer 503, and the metal plug 519*a*, the metal plug 519*b*, and the metal plug 519*c* protrude from the etch stop layer 503.

It should be noted that, although only three first metal plugs are illustrated in FIG. 42*a*, the present disclosure is not limited thereto. Depending on the product requirements, the number of first metal plugs in the semiconductor device 500 may be less or more than three. Referring to FIG. 42*b*, the first metal plug 519*a* has an upper portion 519*a*1 protruding from the top surface 505T of the etch stop layer 505, and a lower portion 519*a*2 under the upper portion 519*a*1.

In some embodiments, the first metal plug 519*a*, the first metal plug 519*b*, and the first metal plug 519*c* are identical. It should be noted that the following disclosure related to the first metal plug 519*a* can be applied to the first metal plug 519*b* and the first metal plug 519*c*.

In some embodiments, the etch stop layer 505 and the first dielectric layer 503 surround the lower portion 519*a*2 of the first metal plug 519*a*, and the upper portion 519*a*1 of the first metal plug 519*a* has a rounded (or curved) top surface TS. In some embodiments, the etch stop layer 505 and the first dielectric layer 503 adjoin the sidewalls of the lower portion 519*a*2. In some embodiments, the top surface TS of the upper portion 519*a*1 is convex, and the top surface TS connects a first sidewall SW1 of the upper portion 519*a* to a second sidewall SW2 of the upper portion 519*a*1.

Moreover, the semiconductor device 500 includes a second metal plug 537*a*, a second metal plug 537*b*, and a second metal plug 537*c* disposed over the first metal plug 519*a*, the first metal plug 519*b*, and the first metal plug 519*c*, respectively. The semiconductor device 500 further includes a second dielectric layer 507 and a third dielectric layer 523. The second dielectric layer 507 disposed over the etch stop layer 505, and the third dielectric layer 523 disposed over the second dielectric layer 507. The semiconductor device 500 further includes a silicide layer 521*a*, a silicide layer 521*b*, and a silicide layer 521*c*. The silicide layer 521*a* is disposed between the first metal plug 519*a* and the second metal plug 537*a*; the silicide layer 521*b* is disposed between the first metal plug 519*b* and the second metal plug 537*b*; and the silicide layer 521*c* is disposed between the first metal plug 519*c* and the second metal plug 537*c*.

By forming the silicide layers 521*a*, 521*b*, and 521*c*, the contact resistance between the first metal plugs (such as 519*a*, 519*b*, 519*c*) and the second metal plugs (such as 537*a*, 537*b*, 537*c*) may be decreased, thereby improving the performance of the semiconductor device 500. However, in some other embodiments, the silicide layers 521*a*, 521*b*, 521*c* can be omitted.

The second metal plug 537*a* extends to contact the top surface 505T of the etch stop layer 505. In some embodiments, the first sidewall SW1 of the upper portion 519*a*1 is in direct contact with the second metal plug 537*a*, and the second sidewall SW2 of the upper portion 519*a*1 is in direct contact with the second dielectric layer 507.

The second dielectric layer 507 is separated from the first sidewall SW1. A height H1 of the first sidewall SW1 is substantially the same as a height H2 of the second dielectric layer 507. Within the context of this disclosure, the word "substantially" means preferably at least 90%, more preferably 95%, even more preferably 98%, and most preferably 99%.

More specifically, the top surface TS of the upper portion 519*a*1 has a topmost point TP, and the topmost point TP is higher than the top surface 507T of the second dielectric layer 507. That is, the upper portion 519*a*1 protrudes from the top surface 507T of the second dielectric layer 507.

In addition, the top surface TS of the upper portion 519*a*1 is separated from the second metal plug 537*a* by the silicide layer 521*a*, and the silicide layer 521*a* extends between the top surface TS and the third dielectric layer 523. A portion of the silicide layer 521*a* is exposed to and in direct contact with the third dielectric layer 523. In other words, a portion of the third dielectric layer 523 is disposed above the upper portion 519*a*1.

The second metal plug 537*a* is separated from the second dielectric layer 523 by an air gap 536*a*1 and an air gap 536*a*2; the second metal plug 537*b* is separated from the second dielectric layer 523 by an air gap 536*b*1 and an air gap 536*b*2; and second metal plug 537*c* is separated from the second dielectric layer 523 by an air gap 536*c*1 and an air gap 536*c*2.

By forming the air gaps 536*a*1, 536*a*2, 536*b*1, 536*b*2, 536*c*1, and 536*c*2, the parasitic capacitance between adjacent second metal plugs may be reduced, thereby improving the operation speed of the semiconductor device 500. However, in some embodiments, the air gaps 536*a*1, 536*a*2, 536*b*1, 536*b*2, 536*c*1, and 536*c*2 can be omitted.

The semiconductor device 500 further includes a bit line 550*a*, a bit line 550*b*, a bit line 550*c*, and a fourth dielectric layer 539. The bit lines 550*a*, the bit line 550*b*, and the bit line 550*c* are disposed over and electrically connected to the second metal plug 537*a*, the second metal plug 537*b*, and second metal plug 537*c*, and the bit line 550*a*, the bit line 550*b*, and the bit line 550*c* are further electrically connected to the first metal plug 519*a*, the first metal plug 519*b*, and the first metal plug 519*c* through the second metal plug 537*a*, the second metal plug 537*b*, and the second metal plug 537*c*, respectively. The fourth dielectric layer 539 surrounds the bit lines 550*a*, the bit line 550*b*, and the bit line 550*c*.

In the semiconductor device 500, since the first metal plugs 519*a*, 519*b*, and 519*c* have rounded top surfaces, the contact areas between the first metal plugs 519*a*, 519*b*, 519*c* and the second metal plugs 537*a*, 537*b*, 537*c* (or the contact areas between the silicide layers 521*a*, 521*b*, 521*c* and the second metal plugs 537*a*, 537*b*, 537*c*) are increased, compared with arrangements in which the first metal plugs have flat top surfaces and the second metal plugs are perfectly aligned with the first metal plugs. The rounded top surfaces of the first metal plugs 519*a*, 519*b*, and 519*c* may cause a corresponding decrease of the resistances between the first metal plugs 519*a*, 519*b*, 519*c* and the second metal plugs 537*a*, 537*b*, 537*c*, thereby improving the overall device performance.

Moreover, the electric field strengths on the rounded top surfaces of the first metal plugs 519*a*, 519*b*, and 519*c* are evenly distributed, since the first metal plugs 519*a*, 519*b*, and 519*c* have no sharp portions. Therefore, the lifespan of the semiconductor device 500 may be extended significantly, and the performance and reliability of the device may be improved. Furthermore, since the etch stop layer 505 adjoins sidewalls of the first metal plugs 519*a*, 519*b*, and 519*c*, the underlying electronic components can be prevented from being exposed during the processes for forming the second metal plugs 537*a*, 537*b*, and 537*c*, and the issues caused by misalignment between the first metal plugs 519*a*, 519*b*, 519*c* and the second metal plugs 537*a*, 537*b*, 537*c* may be prevented or reduced.

Furthermore, the semiconductor device 500 further includes a liner structure 560*a* and a liner structure 560*b*. The liner structure 560*a* is disposed between the second metal plug 537*a* and the second metal plug 537*b*, and the liner structure 560*b* is disposed between the second metal plug 537*b* and the second metal plug 537*c*.

As illustrated in FIG. 42*a* and FIG. 42*b*, the semiconductor device 500 includes an air gap 565*a* and an air gap 565*b* enclosed by the liner structure 560*a* and the liner structure 560*b*, respectively. The liner structures 560*a* and 560*b* extend from the top surface 505T to a bottom surface of the fourth dielectric layer 539. The liner structures 560*a* and 560*b* are not in contact with the bit lines 550*a*, 550*b*, and 550*c*. In other words, the liner structures 560*a* and 560*s* penetrate the entire second dielectric layer 507 and the entire third dielectric layer 523.

In various embodiments, the liner structure 560*b* and the air gap 565*b* can be omitted.

By forming the liner structure 560*a*, the liner structure 560*b*, the air gap 565*a*, and the air gap 565*b*, the parasitic capacitance between adjacent second metal plugs may be reduced, thereby improving the operation speed of the semiconductor device 500.

Reference is made to FIG. 43 to FIG. 61. FIG. 43 to FIG. 61 are cross-sectional views illustrating intermediate stages of forming the semiconductor structure 500 according to some embodiments of the present disclosure.

Figure 43:
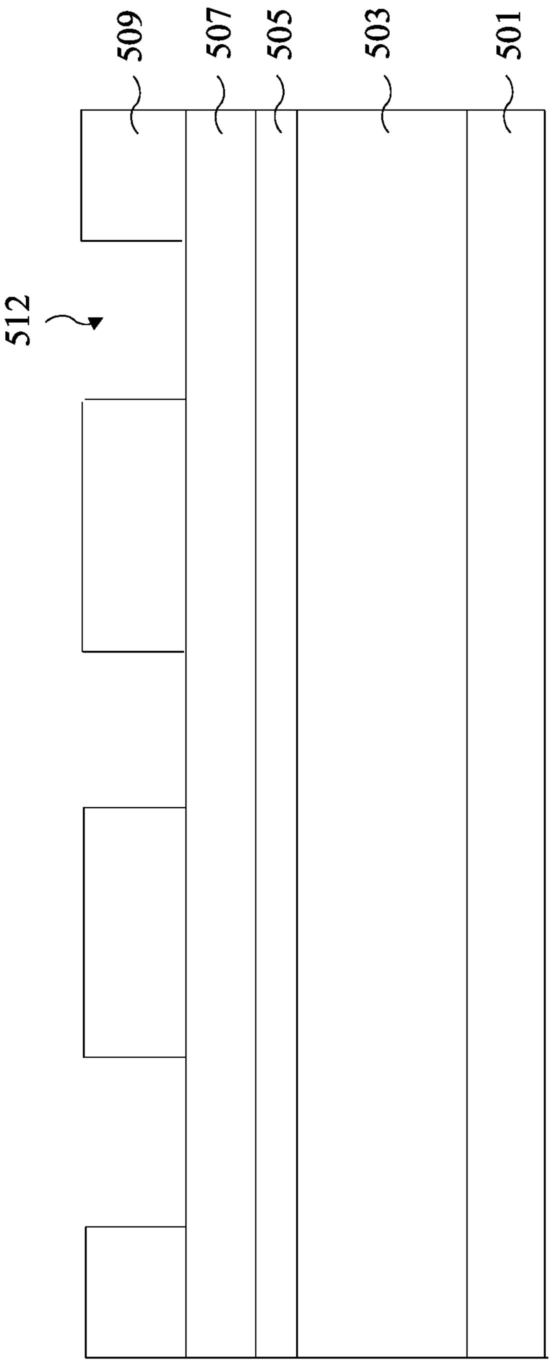
FIG. 43 to FIG. 61 are cross-sectional views illustrating intermediate stages of forming the semiconductor structure shown in FIG. 42*a* and FIG. 42*b* according to some embodiments of the present disclosure.

In FIG. 43, the semiconductor substrate 501 is provided. The semiconductor substrate 501 may be a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field-effect transistors (FinFETs), other suitable IC components, or combinations thereof.

Depending on the IC fabrication stage, the semiconductor substrate 501 may include various material layers (e.g., dielectric layers, semiconductor layers, and/or conductive layers) configured to form IC features (e.g., doped regions, isolation features, gate features, source/drain features, interconnect features, other features, or combinations thereof). The semiconductor substrate 501 has been simplified for the sake of clarity. It should be noted that additional features can be added in the semiconductor substrate 501, and some of the features described below can be replaced, modified, or eliminated in other embodiments.

The first dielectric layer 503, the etch stop layer 505, and the second dielectric layer 507 are sequentially disposed over the semiconductor substrate 501.

The first dielectric layer 503 is made of silicon oxide, silicon carbide, silicon nitride, silicon oxynitride, another suitable material, or a combination thereof, and the first dielectric layer 503 is formed by a deposition process, such as a chemical vapor deposition (CVD) process, a physical vapor deposition (PVD) process, an atomic layer deposition (ALD) process, a spin-on process, or another suitable process.

Some materials and processes used to form the etch stop layer 505 and the second dielectric layer 507 are similar to, or the same as, those used to form the first dielectric layer 503, and descriptions thereof are not repeated herein. It should be noted that the material of the etch stop layer 505 is different from the material of the second dielectric layer 507, in accordance with some embodiments.

After the second dielectric layer 507 is formed, a photoresist pattern 509 with openings 512 is disposed over the second dielectric layer 507, and the second dielectric layer 507 is exposed by the openings 512. In some embodiments, the photoresist pattern 509 may be formed by a deposition process and a patterning process.

The deposition process for forming the photoresist pattern 509 may include a CVD process, a high-density plasma chemical vapor deposition (HDPCVD) process, a spin-on process, or another suitable process. The patterning process for forming the photoresist pattern 509 may include a photolithography process. The photolithography process may include photoresist coating (e.g., spin coating), soft baking, mask aligning, exposure, post-exposure baking, developing the photoresist, rinsing and drying (e.g., hard baking).

Figure 44:
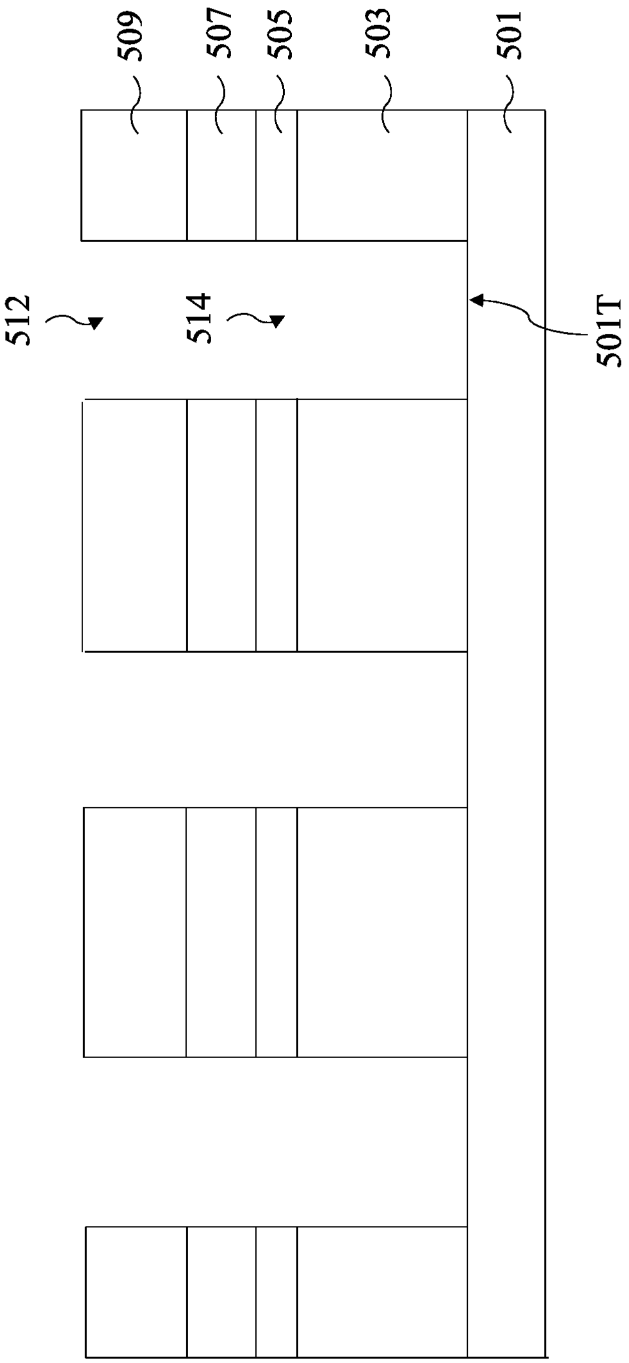

In FIG. 44, an etching process is performed on the structure 501 by using the photoresist pattern 509 as a mask. The etching process is performed until the top surface 501T of the semiconductor substrate 501 is exposed, and openings 514 are formed under the openings 512.

The openings 514 are surrounded by the remaining second dielectric layer 507, the remaining etch stop layer 505 and the remaining first dielectric layer 503. The etching process may be a dry etching process, a wet etching process, or a combination thereof.

Figure 45:
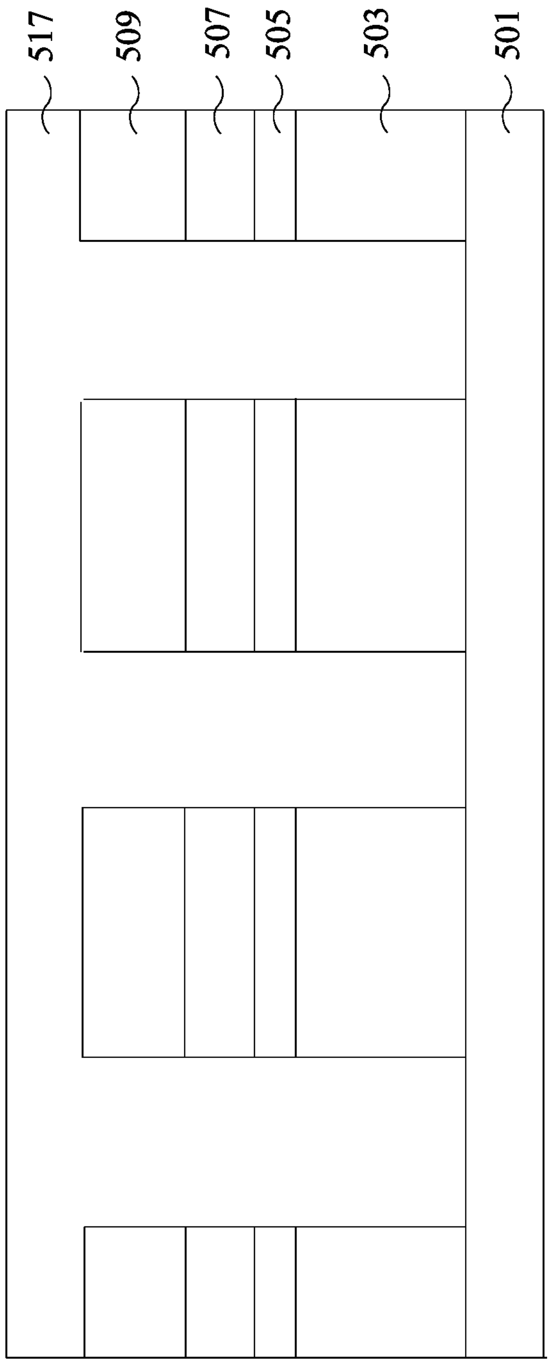

In FIG. 45, a metal layer 517 is deposited to fill the openings 514 and the openings 512. The metal layer 517 further extends onto the photoresist pattern 509.

In some embodiments, the metal layer 517 is made of copper (Cu). In some other embodiments, the metal layer 517 is made of tungsten (W), cobalt (Co), titanium (Ti), aluminum (Al), tantalum (Ta), or another applicable material. Moreover, in some embodiments, the metal layer 517 is formed by a CVD process, a PVD process, an ALD process, a plating (e.g., electroplating) process, a sputtering process, or another suitable process.

Figure 46:
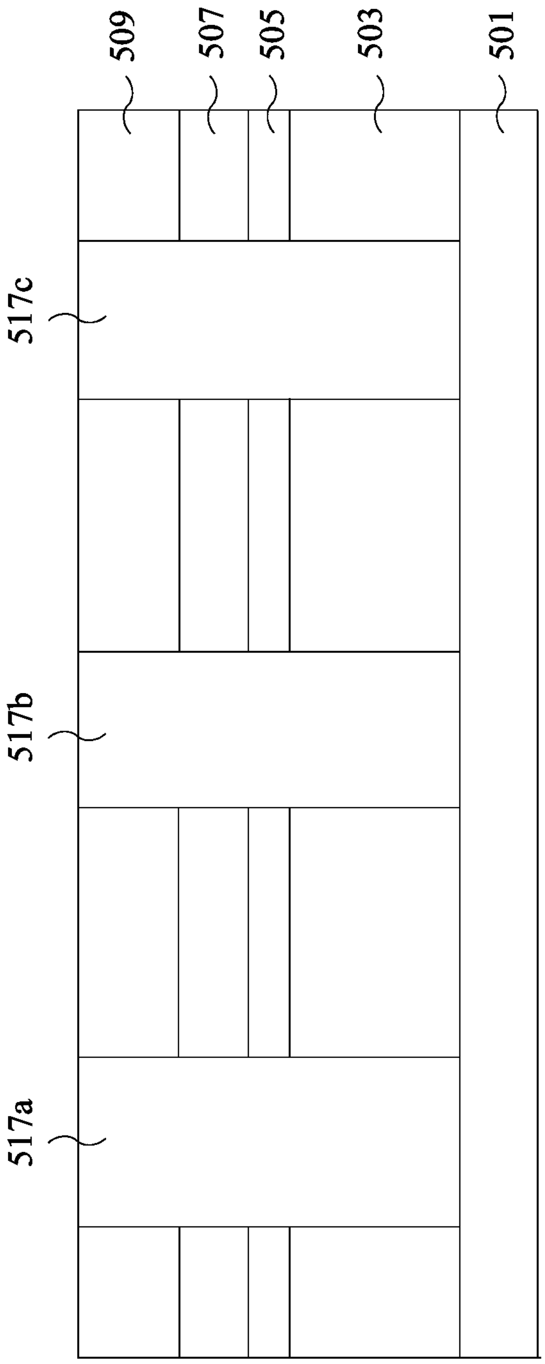

In FIG. 46, a portion of the metal layer 517 on the photoresist pattern 509 is removed to form a metal portion 117*a*, a metal portion 117*b*, and a metal portion 117*c*. More specifically, the portions of the metal layer 517 covering the photoresist pattern 509 are removed, and the portions of the metal layer 517 deposited into the openings 512 and 514 remain, in accordance with some embodiments.

In some embodiments, the removal of the excess portions of the metal layer 517 is performed by a planarization process or an etching process. The planarization process may be a chemical mechanical polishing (CMP) process.

Figure 47:
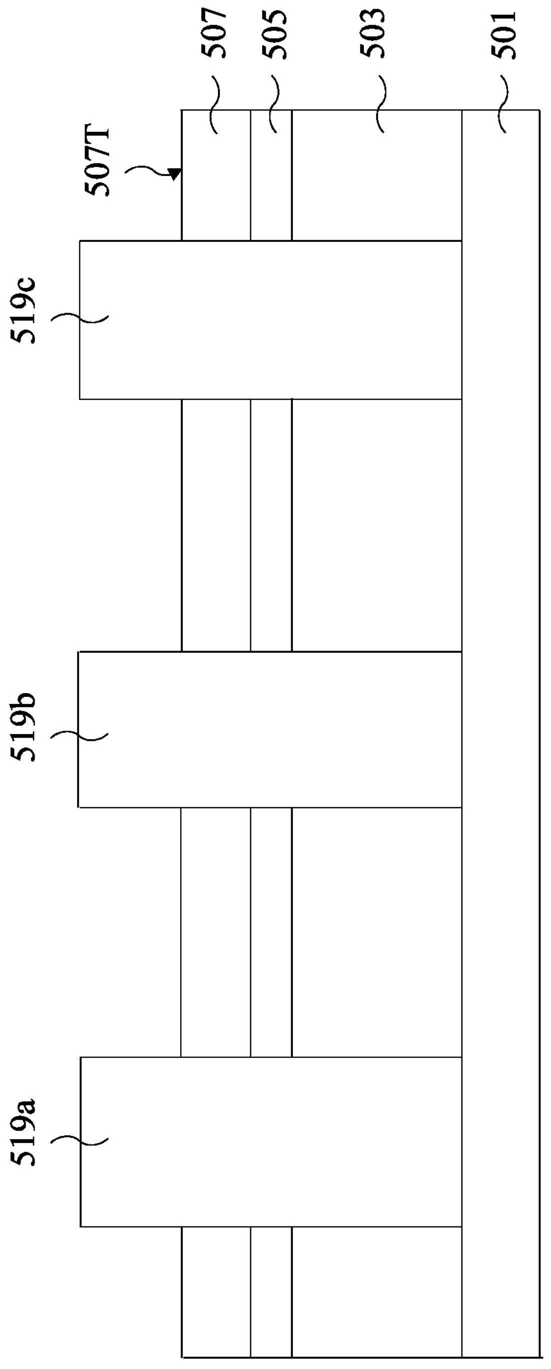

In FIG. 47, the photoresist pattern 509 is removed. In some embodiments, the portions of the metal portions 517*a*, 517*b*, 517*c* protruding from a top surface 507T of the second dielectric layer 507 are slightly etched during the removal process of the photoresist pattern 509, and first metal plugs 519*a*, 519*b*, 519*c* are obtained (i.e., the remaining metal portions 517*a*, 517*b*, 517*c*).

In particular, each of the first metal plugs 519*a*, 519*b*, and 519*c* penetrates through the second dielectric layer 507, the etch stop layer 505 and the first dielectric layer 503 to electrically connect to the electronic components in the semiconductor substrate 501, in accordance with some embodiments.

Figure 48:
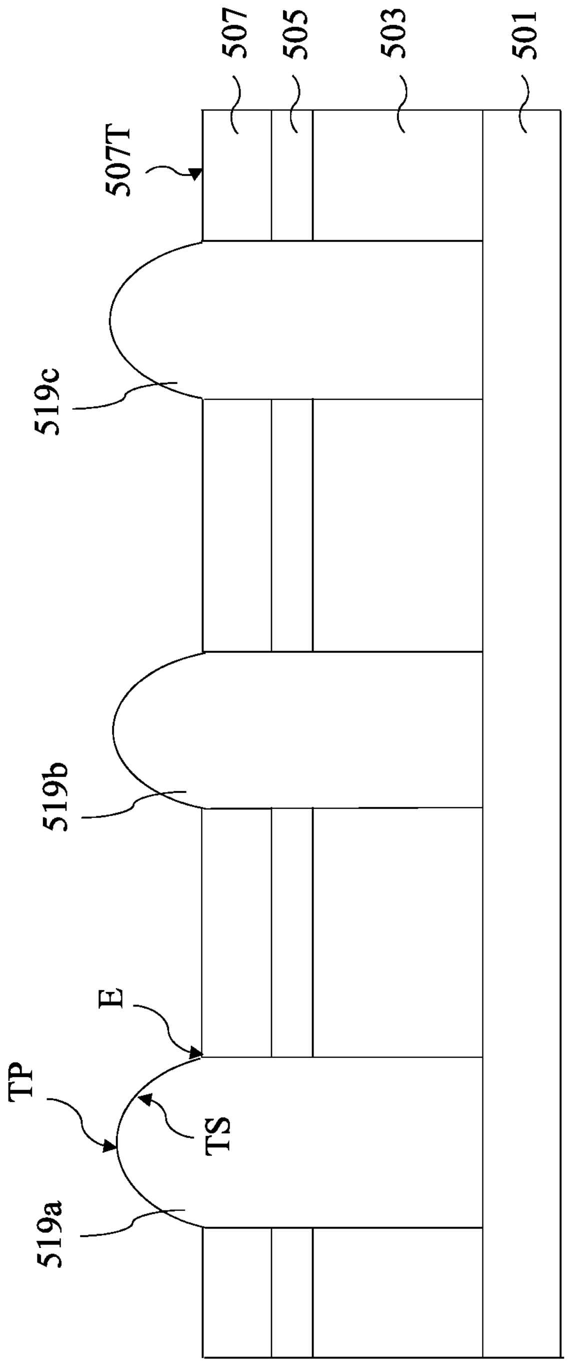

In FIG. 48, an anisotropic etching process is performed to partially remove the first metal plug 519*a*, the first metal plug 519*b*, and the first metal plug 519*c*, such that each of the etched first metal plugs 519*a*, 519*b*, and 519*c* has a rounded (or curved) top surface TS. In some embodiments, the top surface TS is a convex surface.

As described previously, the topmost point TP of the top surface TS is higher than the top surface 507T of the second dielectric layer 507. More specifically, there is an edge E of the top surface TS which is in direct contact with the top surface 507T of the second dielectric layer 507. In some embodiments, the anisotropic etching process is a dry etching process.

Figure 49:
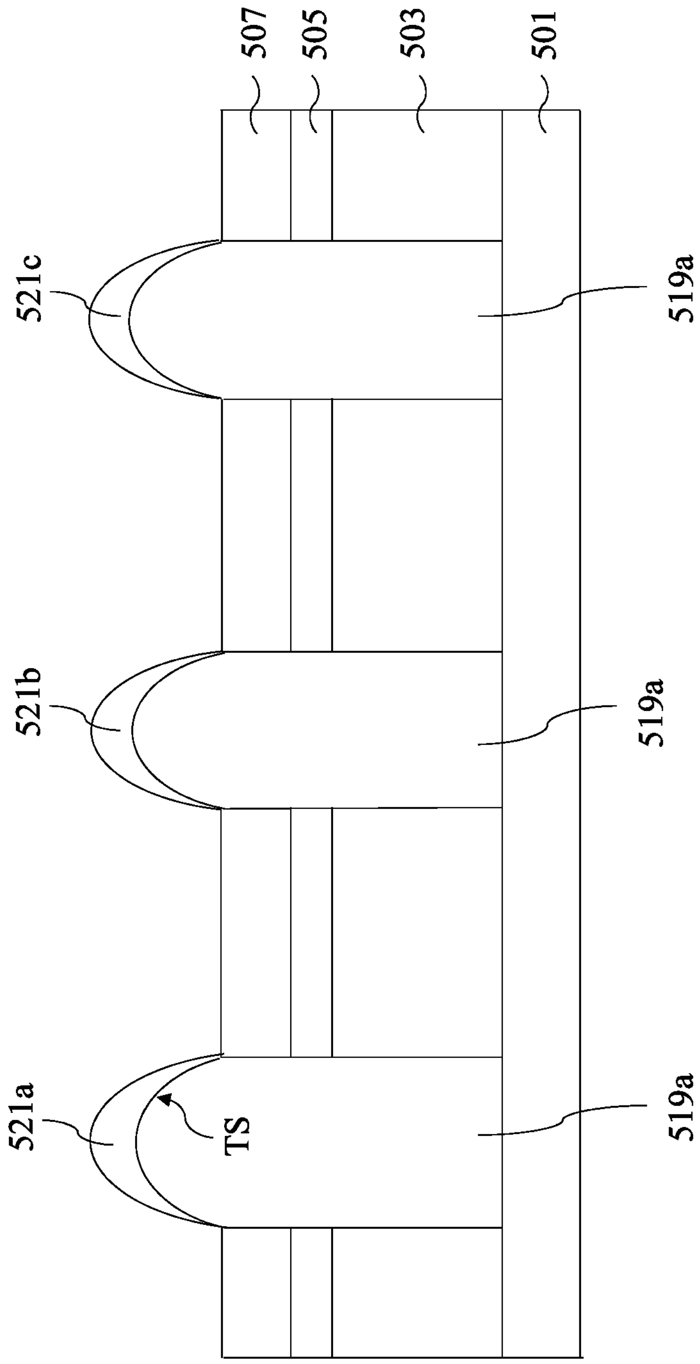

In FIG. 49, the silicide layer 521*a*, the silicide layer 521*b*, and the silicide layer 521*c* are disposed over the first metal plug 519*a*, the first metal plug 519*b*, and the first metal plug 519*c* by a silicidation process. In some embodiments, the silicidation process includes a metal material deposition process and an annealing process performed in sequence. In some embodiments, the deposition process of the silicidation process includes a PVD process, an ALD process, or another suitable process. After the annealing process, the unreacted metal material is removed.

In some embodiments, the silicide layers 521*a*, 521*b*, and 521*c* are made of one of more of copper silicide, tungsten silicide, cobalt silicide, titanium silicide, nickel silicide, and molybdenum silicide. As described previously, by forming the silicide layers 521*a*, 521*b*, 521*c*, the contact resistance between the first metal plugs (such as 519*a*, 519*b*, and 519*c*) and the overlying conductive components (e.g., the second metal plugs 537*a*, 537*b*, and 537*c* as shown in FIG. 42) may be decreased, thereby improving the performance of the device. In some other embodiments, the silicidation process is not performed and the silicide layers 521*a*, 521*b*, and 521*c* may be omitted.

Figure 50:
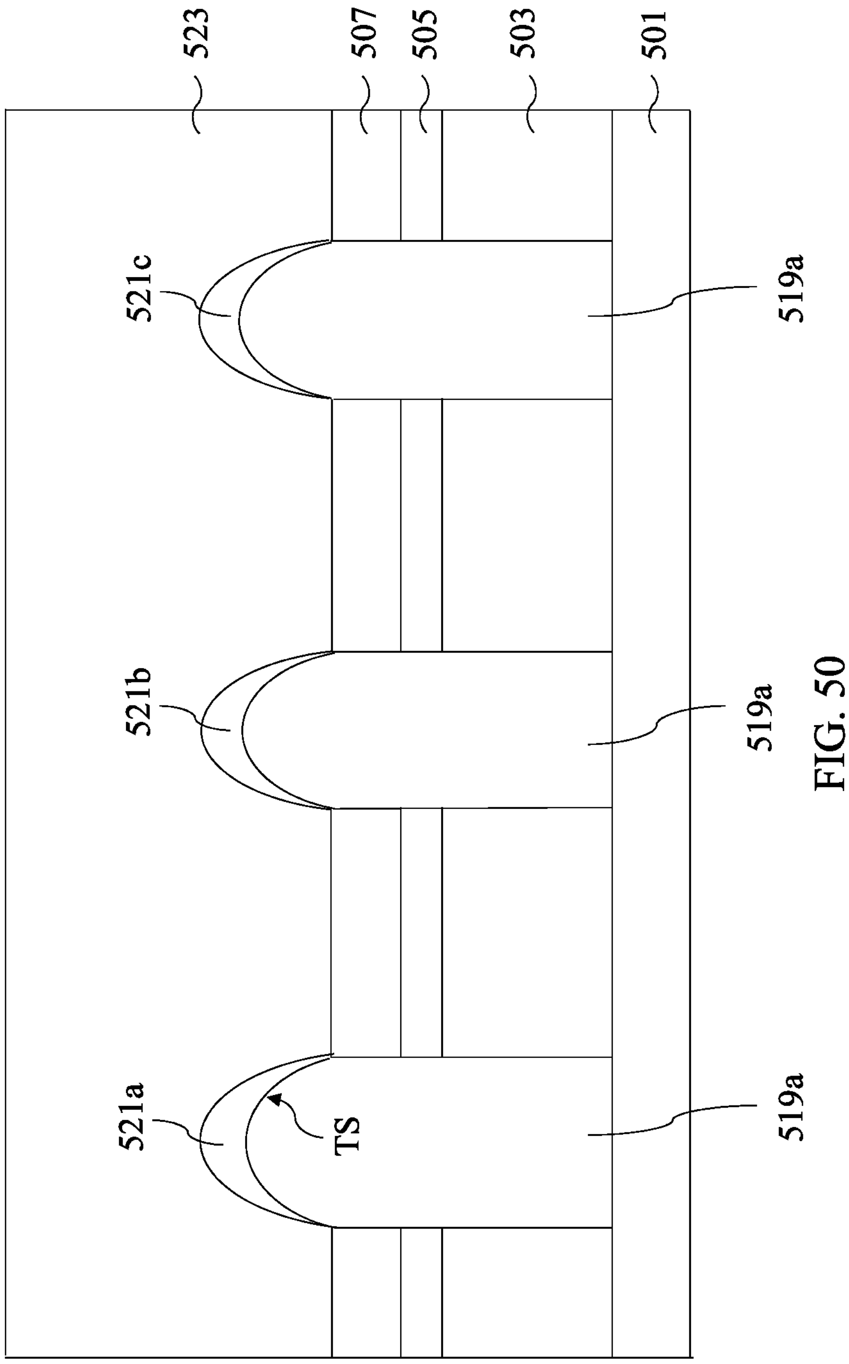

In FIG. 50, the third dielectric layer 523 is formed to cover the second dielectric layer 507 and the silicide layers 521*a*, 521*b*, and 521*c*. The top surface TS is separated from the third dielectric layer 523 by the silicide layers 521*a*, 521*b*, and 521*c*. Some materials and processes used to form the third dielectric layer 523 are similar to, or the same as, those used to form the first dielectric layer 503, and descriptions thereof are not repeated herein. In some embodiments, the material of the third dielectric layer 523 is different from the material of the etch stop layer 505.

Figure 51:
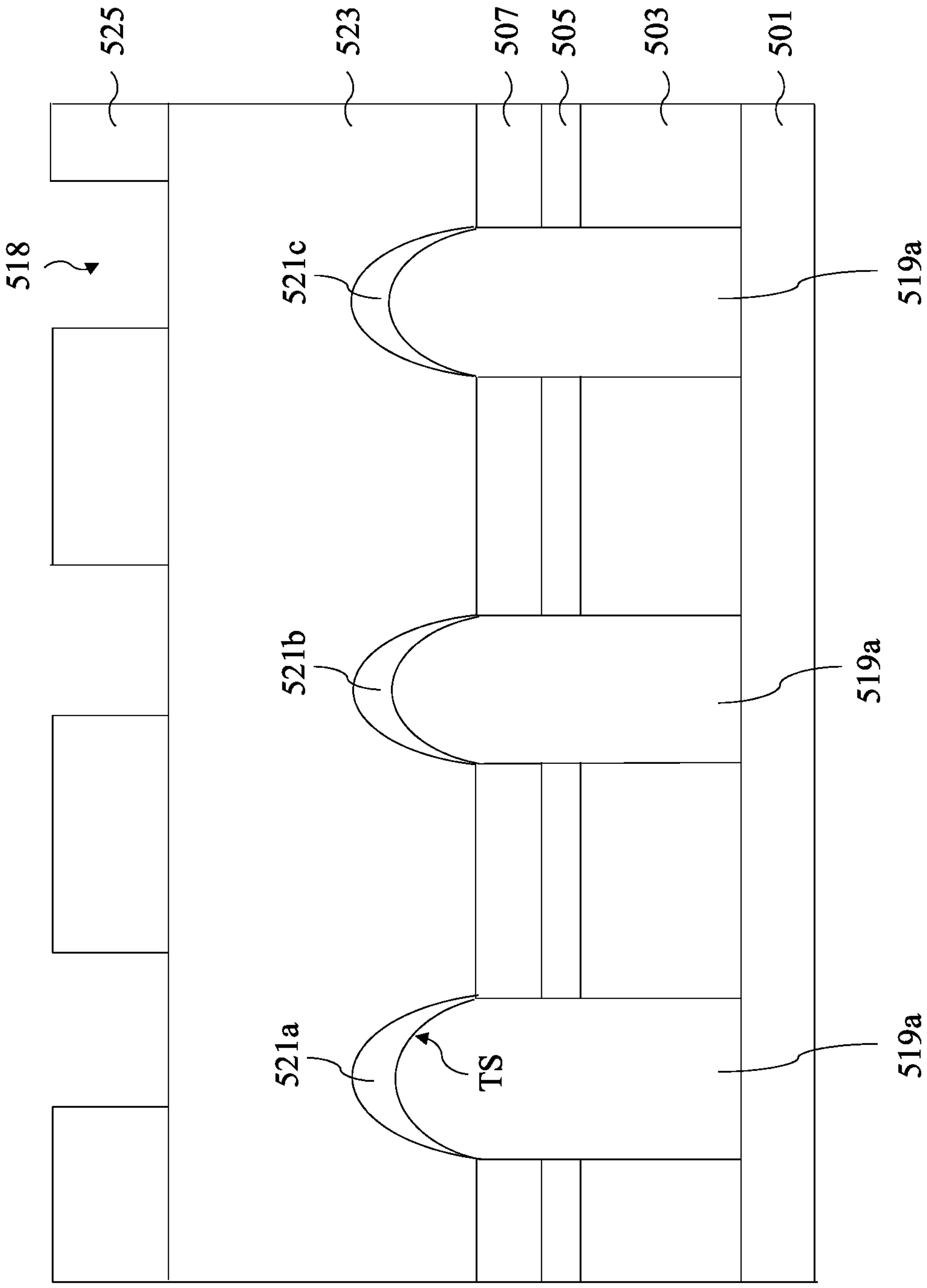

In FIG. 51, a photoresist pattern 525 with openings 528 is disposed over the third dielectric layer 523, and the third dielectric layer 523 is exposed by the openings 528. Some materials and processes used to form the photoresist pattern 525 are similar to, or the same as, those used to form the photoresist pattern 509, and descriptions thereof are not repeated herein.

Figure 52:
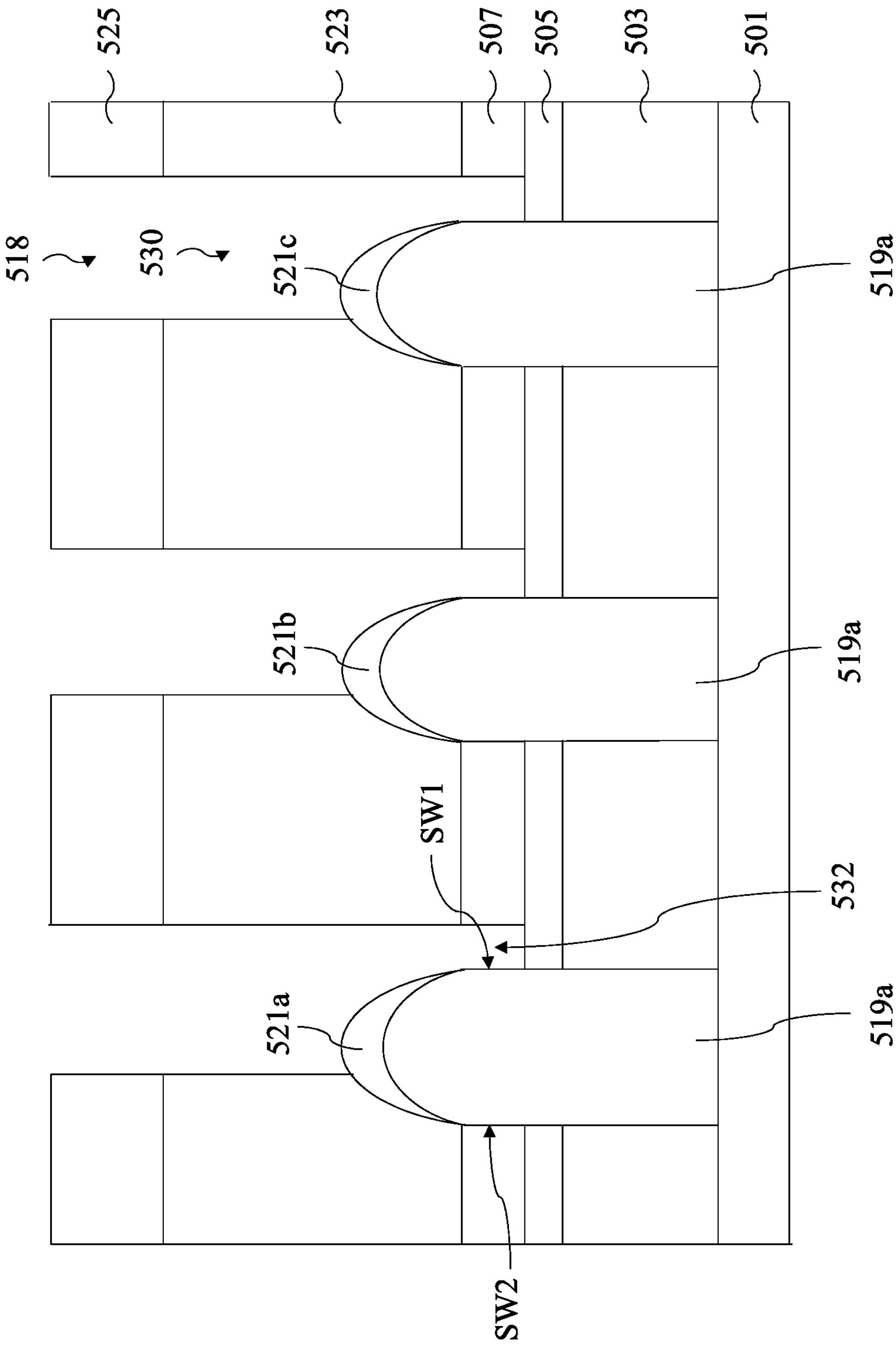

In FIG. 52, an etching process is performed on the structure by using the photoresist pattern 525 as a mask. The etching process is performed until the silicide layers 521*a*, 521*b*, and 521*c* or the first metal plugs 519*a*, 519*b*, and 519*c* are exposed. Openings 530 are formed in the remaining third dielectric layer 523, and gaps 532 are formed in the remaining second dielectric layer 507. In addition, the etching process may be a dry etching process, a wet etching process, or a combination thereof.

In some embodiments, the positions of the openings 518, which is over the second dielectric layer 523, cause the openings 530 to expose portions of the second dielectric layer 507 during the etching process, and the exposed portions of the second dielectric layer 507 are removed to form the gaps 532. The top surface 505T of the etch stop layer 505 is exposed by the gaps 532, in accordance with some embodiments. As mentioned above, the etch stop layer 505 can protect the underlying electronic components from being exposed during the etching process.

Moreover, each of the first metal plugs 519*a*, 519*b*, and 519*c* has the first sidewall SW1 and the second sidewall SW2 opposite to the first sidewall SW1. In some embodiments, the first sidewalls SW1 are exposed by the gaps 532, and the second sidewalls SW2 remain covered by the second dielectric layer 507. In some embodiments, portions of the silicide layers 521*a*, 521*b*, and 521*c* are sandwiched between the third dielectric layer 523 and the respective first metal plugs after the openings 530 and the gaps 532 are formed.

Figure 53:
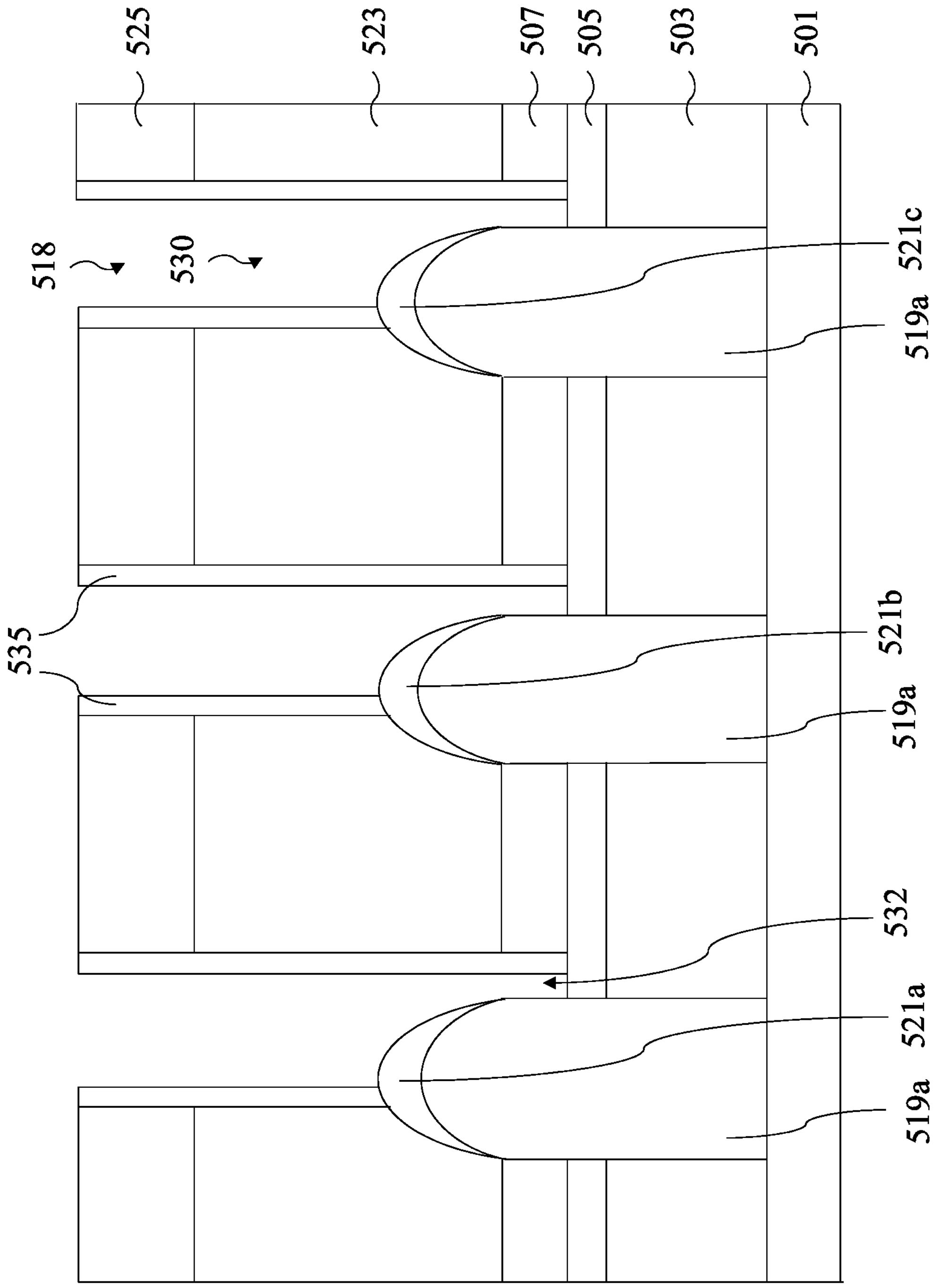

In FIG. 53, an energy-removable material 535 is disposed over sidewalls of the openings 518, sidewalls of the openings 530, and sidewalls of the gaps 532. Because the energy-removable material 535 occupies a portion of the openings 528 and the opening 530*s*, the spaces of the openings 528 and the openings 530 are reduced.

In some embodiments, the energy-removable material 535 includes a thermal-decomposable material. In some other embodiments, the energy-removable material 535 includes a photonic-decomposable material, an e-beam decomposable material, or another suitable energy-decomposable material. Specifically, in some embodiments, the energy-removable material 535 includes a base material and a decomposable porogen material that is substantially removed upon exposure to an energy source (e.g., heat).

In some embodiments, the base material includes hydrogen silsesquioxane (HSQ), methylsilsesquioxane (MSQ), porous polyarylether (PAE), porous SiLK, or porous silicon oxide (SiO2), and the decomposable porogen material includes a porogen organic compound, which can, in the subsequent processes, provide porosity to the space previously occupied by the energy-removable material 535.

In some embodiments, the energy-removable material 535 is formed by a deposition process and an etching process. In some embodiments, the deposition process includes CVD, PVD, ALD, spin coating, or another suitable process, and the etching process includes a reactive ion etching (RIE) process, which is used to remove the excess portions over the photoresist pattern 525.

Figure 54:
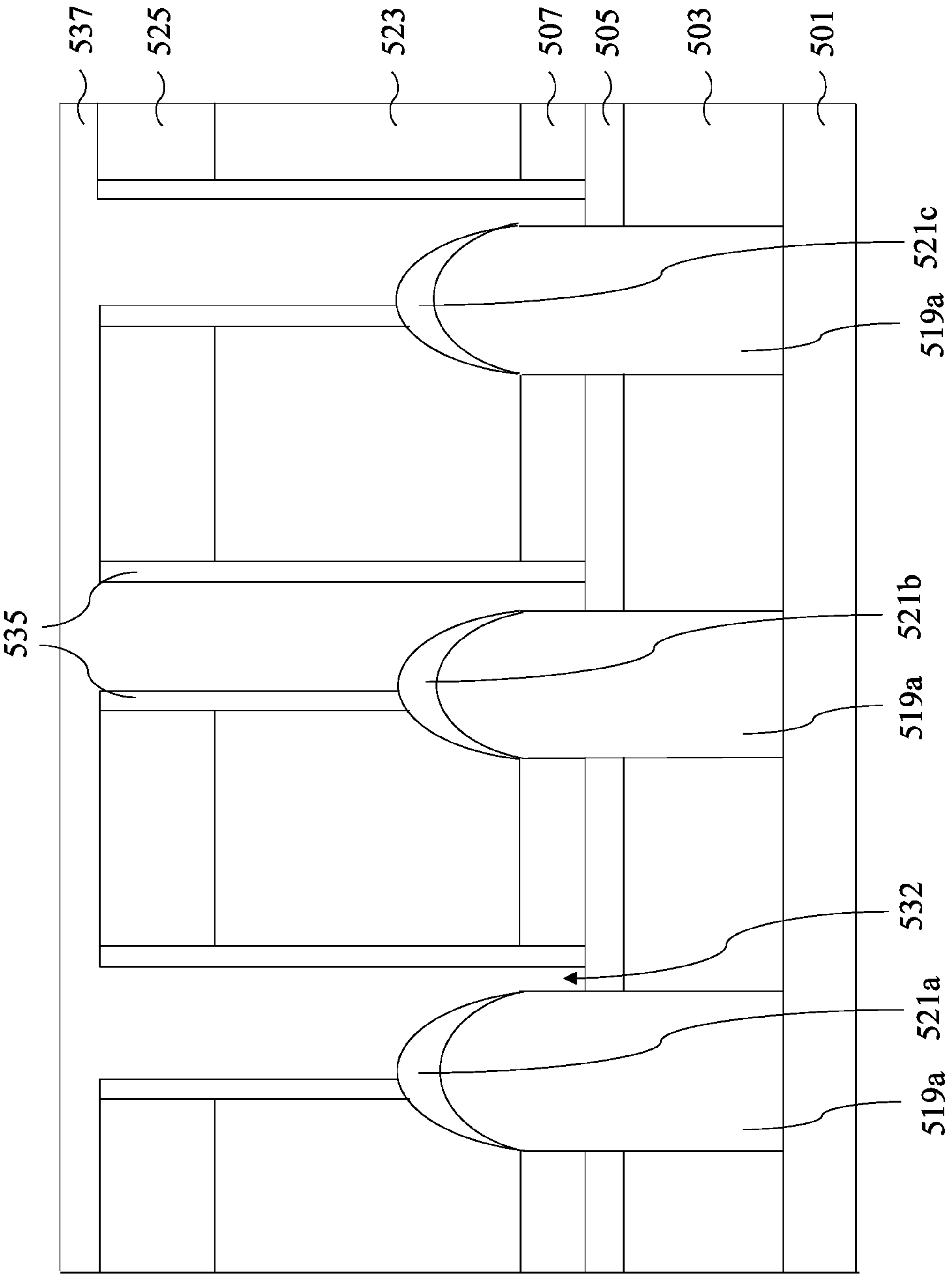

In FIG. 54, the openings 518, the openings 530, and the gaps 532 are filled by a metal layer 537, and the metal layer 537 extends onto the photoresist pattern 525. The metal layer 537 is in direct contact with the first metal plugs 519*a*, 519*b*, 519*c* and the etch stop layer 505.

In some embodiments, the metal layer 537 is made of copper (Cu). In some other embodiments, the metal layer 537 is made of tungsten (W), cobalt (Co), titanium (Ti), aluminum (Al), tantalum (Ta), or another applicable material. Moreover, in some embodiments, the metal layer 537 is formed by a CVD process, a PVD process, an ALD process, a plating (e.g., electroplating) process, a sputtering process, or another suitable process.

Figure 55:
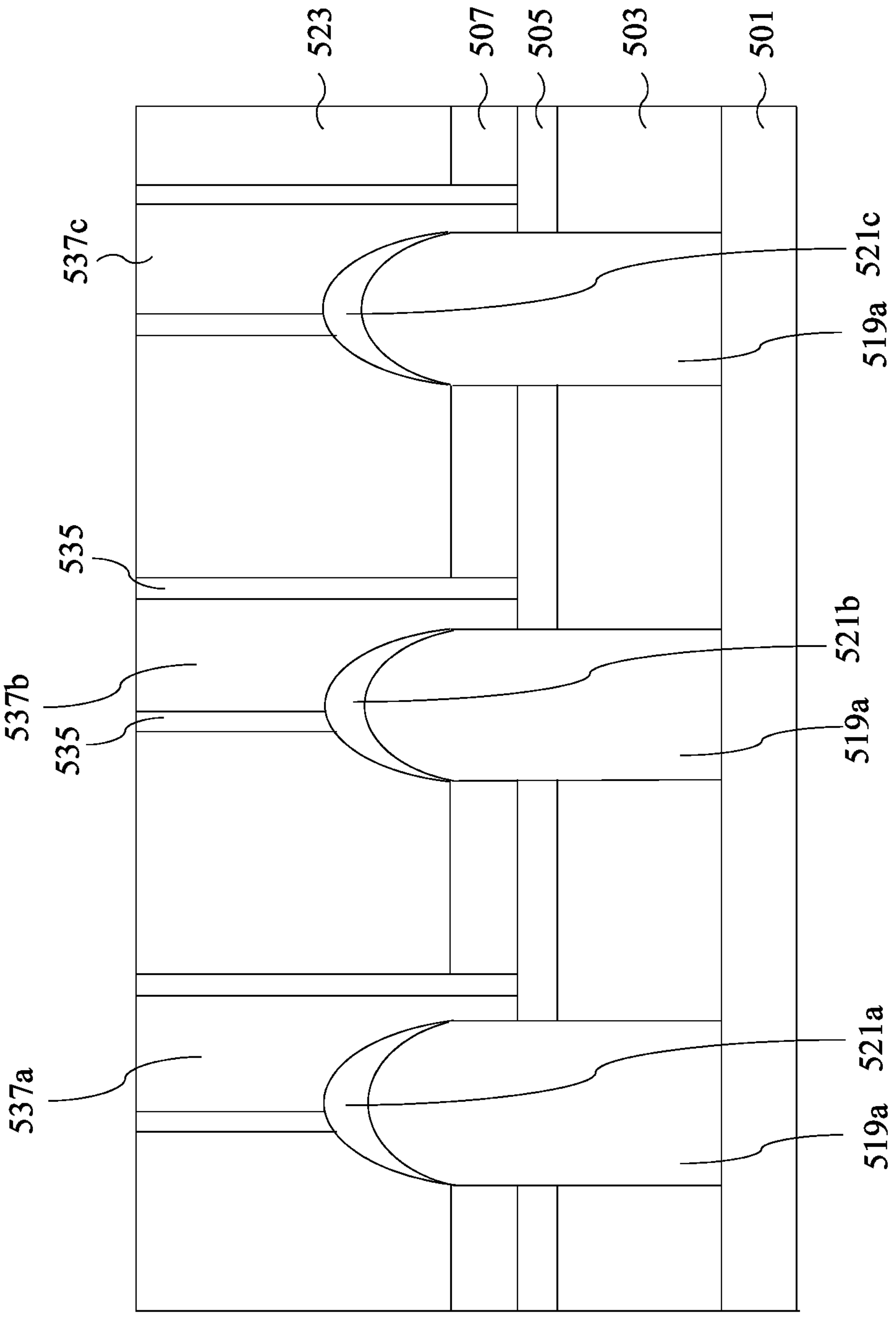

In FIG. 55, a planarization process is performed to remove the photoresist pattern 525, the excess portions of the metal layer 537, and the energy-removable material 535 above the third dielectric layer 523. The planarization process may be a CMP process.

Figure 56:
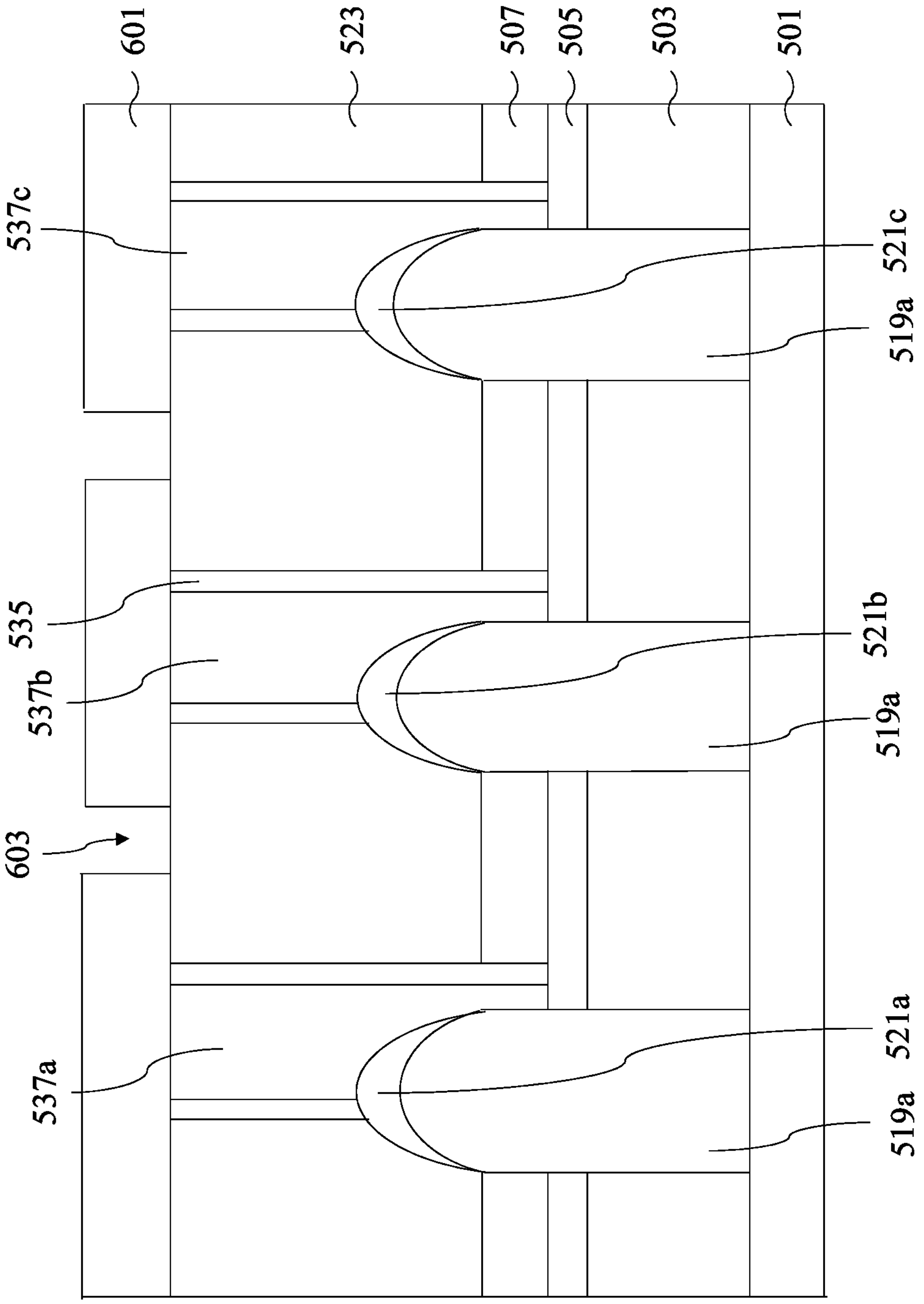

In FIG. 56, a patterned mask 601 with a plurality of openings 603 is formed over the third dielectric layer 523, the metal layer 537, and the energy-removable material 535. The third dielectric layer 523 is partially exposed by the openings 603. In some embodiments, the third dielectric layer 523 and the patterned mask 601 include different materials so that the etching selectivities may be different in the subsequent etching process.

Figure 57:
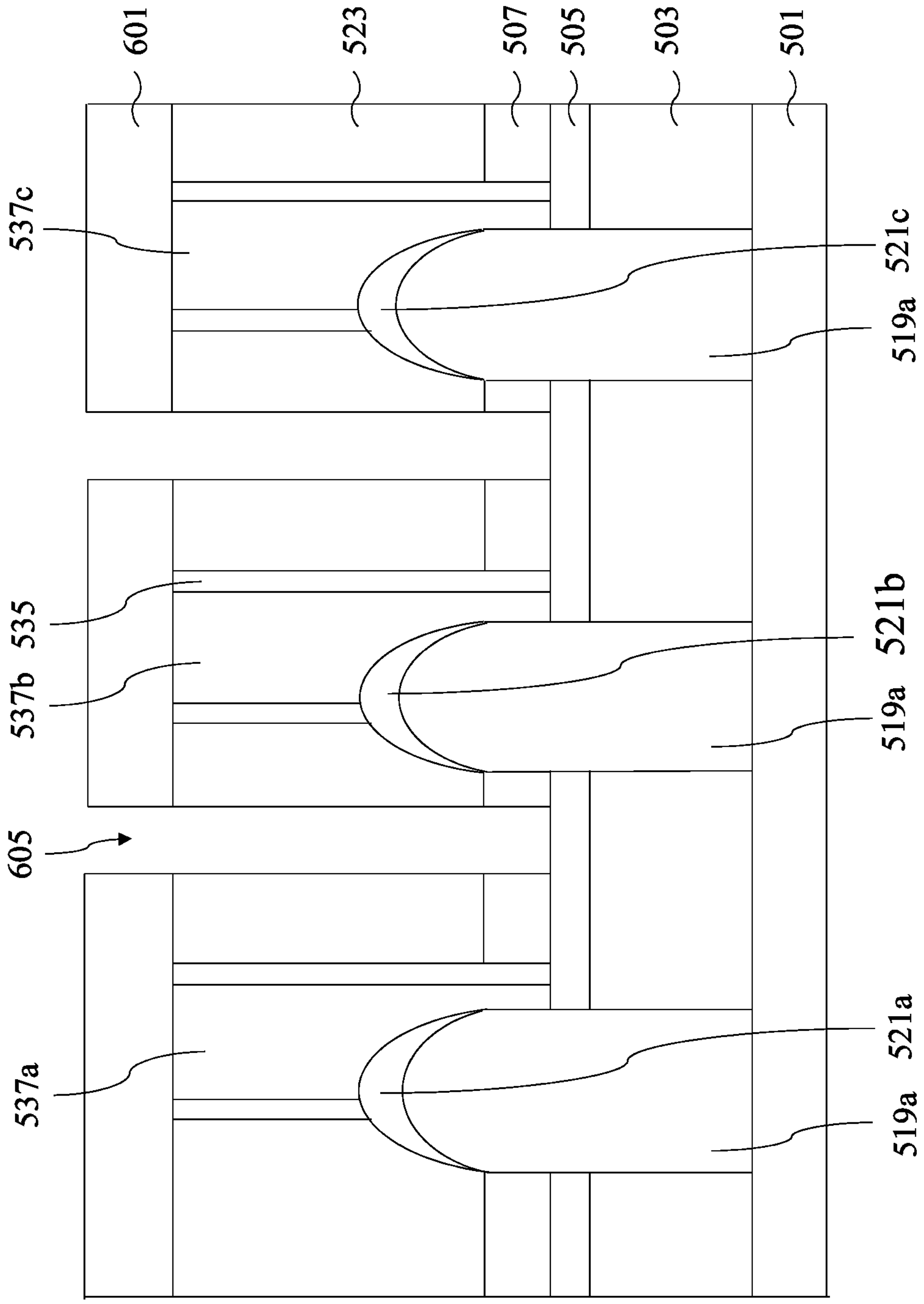

In FIG. 57, an etching process is performed using the patterned mask 601 as an etching mask, such that openings 605 are formed penetrating through the third dielectric layer 523 and the second dielectric layer 507. The etch stop layer 505 is partially exposed by the openings 605. In some embodiments, the etching process for forming the openings 605 includes a wet etching process, a dry etching process, or a combination thereof.

Figure 58:
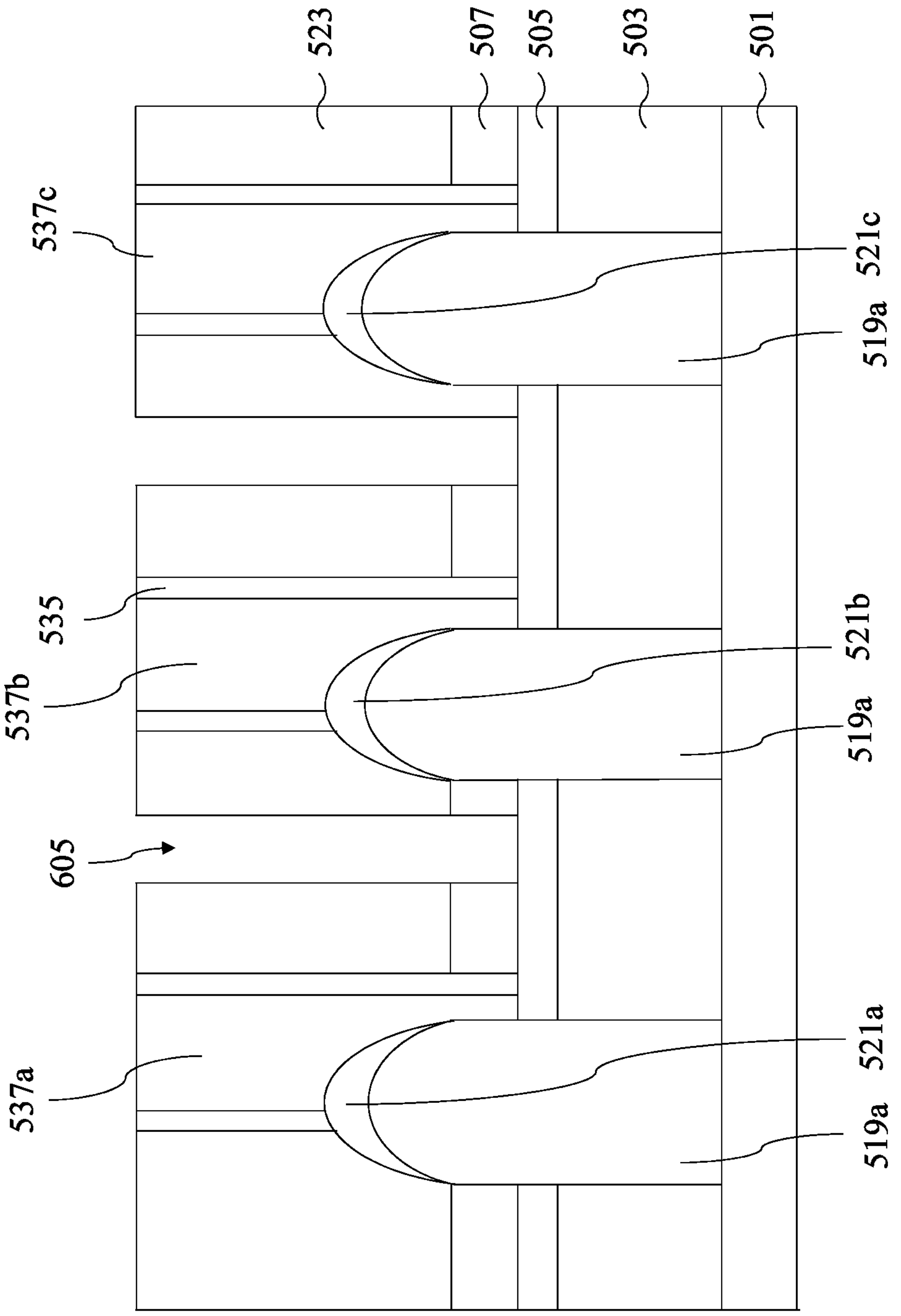

In FIG. 58, the patterned mask 601 is removed. In some embodiments, the patterned mask 601 is removed by a stripping process, an ashing process, an etching process, or another suitable process. After the patterned mask 601 is removed, the top surfaces of the third dielectric layer 523, the metal layer 537, and the energy-removable material 535 are exposed.

Figure 59:
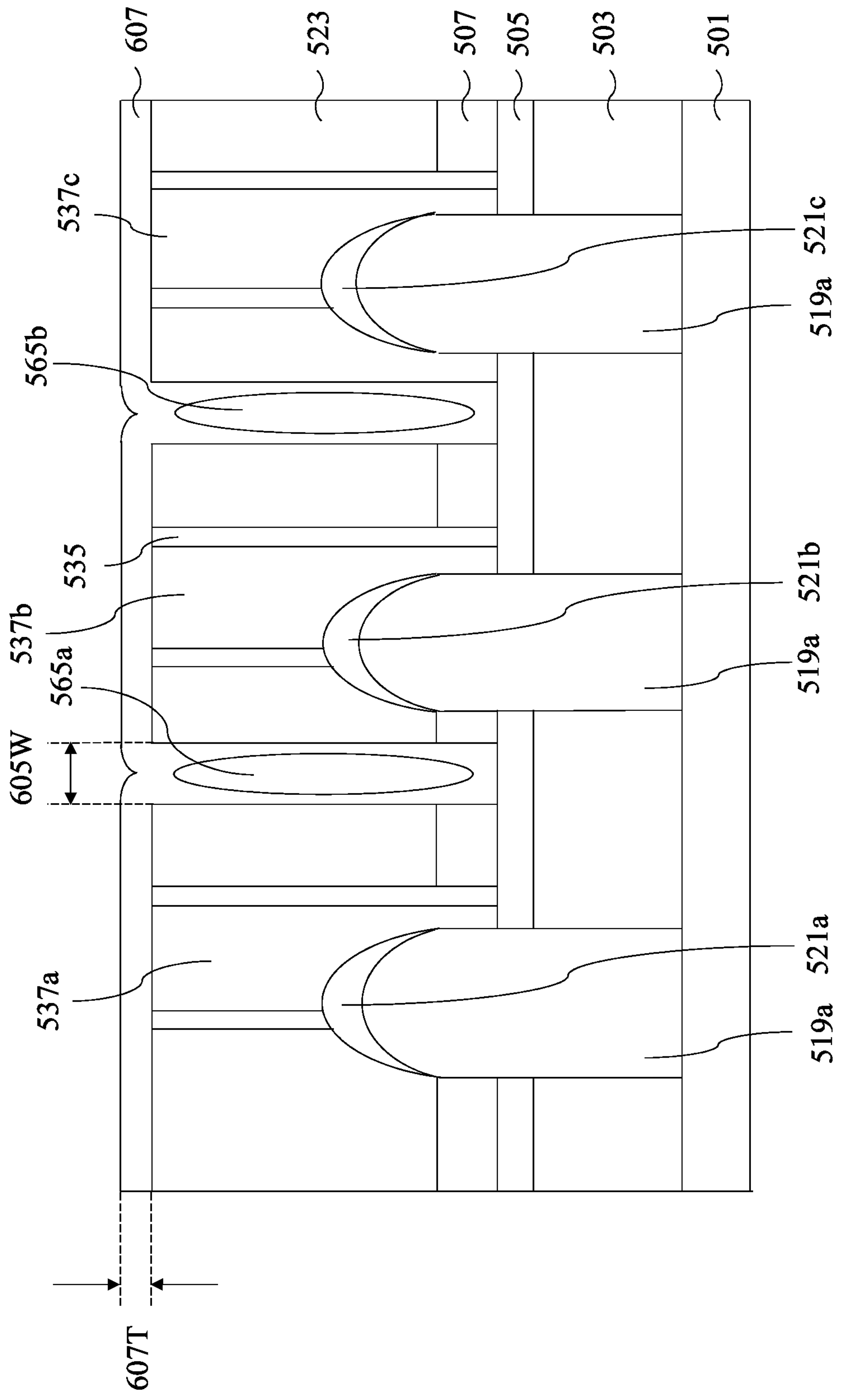

In FIG. 59, a dielectric liner layer 607 is conformally formed in the openings 605 and over the top surfaces of the etch stop layer 505, the third dielectric layer 523, the metal layer 537, and the energy-removable material 535.

In some embodiments, a thickness 607T of the dielectric liner layer 607 is adjusted such that an air gap 565*a* and an air gap 565*b* are enclosed in the portion of the dielectric liner layer 607 filled in the openings 605. In some embodiments, a width 605W of the opening 605 is less than two times of the thickness 607T of the dielectric liner layer 607.

Moreover, in some embodiments, the dielectric liner layer 607 is made of or includes boron carbonitride (BCN). However, any other suitable dielectric materials may be utilized. The dielectric liner layer 607 may be formed by a deposition process, such as a CVD process, a PVD process, an ALD process, a spin-on coating process, or another suitable method. In some embodiments, the air gap 565*a* and the air gap 565*b* are enclosed (or sealed) in the portion of the dielectric liner layer 607 filled in the opening 605. In other words, the air gaps 565*a* and 565*b* are not exposed.

Figure 60:
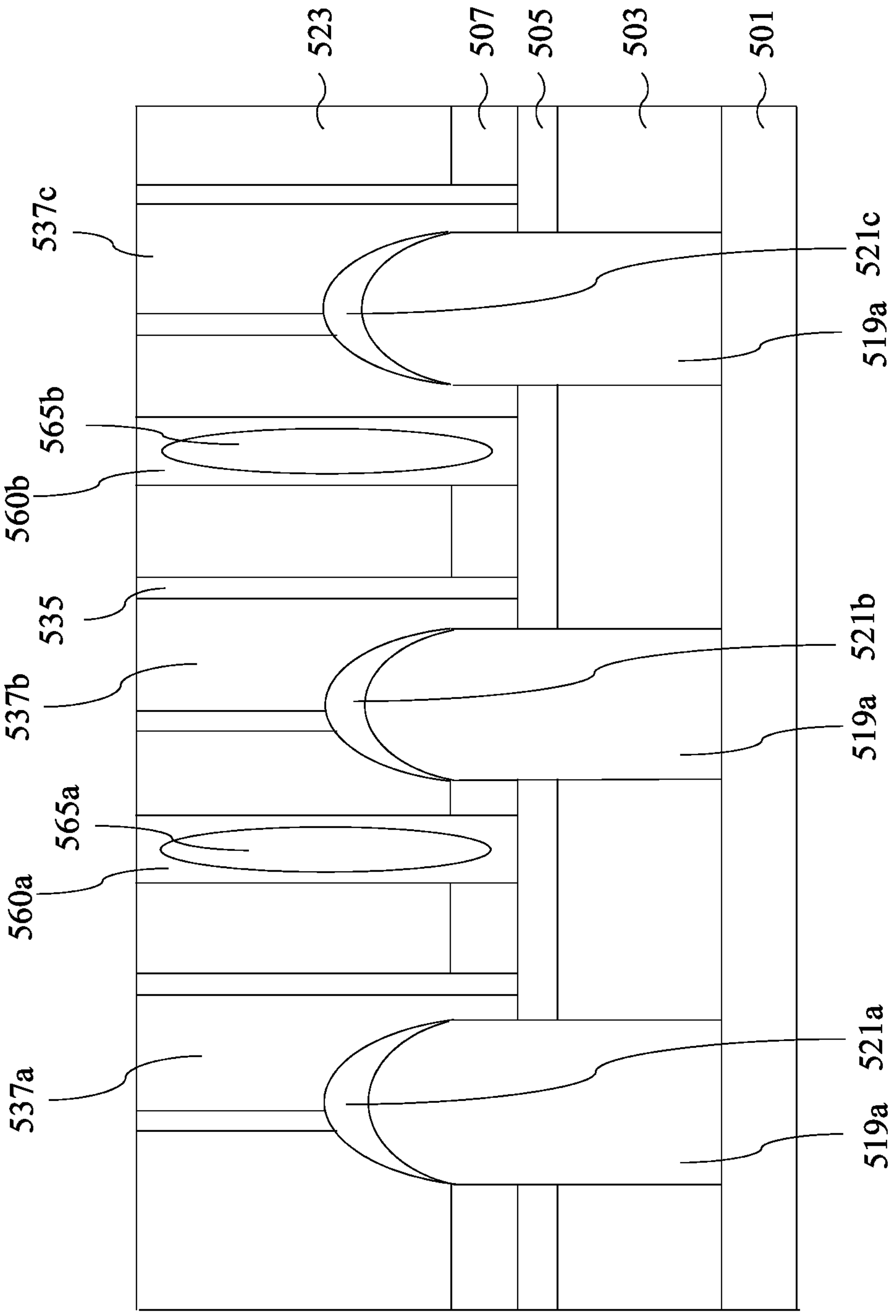

In FIG. 60, the dielectric liner layer 607 is partially removed to be a liner structure 560*a* and a liner structure 560*b*. In some embodiments, the dielectric liner layer 607 is removed by a planarization process, an etch-back process, or a combination thereof. The planarization process may include a chemical mechanical polishing (CMP) process. It should be noted that the air gaps 565*a* and 565*b* do not protrude from the top surface of the third dielectric layer 523, therefore, the air gaps 565*a* and 565*b* are still respectively enclosed (or sealed) by the liner structures 560*a* and 560*b* after the planarization process and/or the etch-back process.

Figure 61:
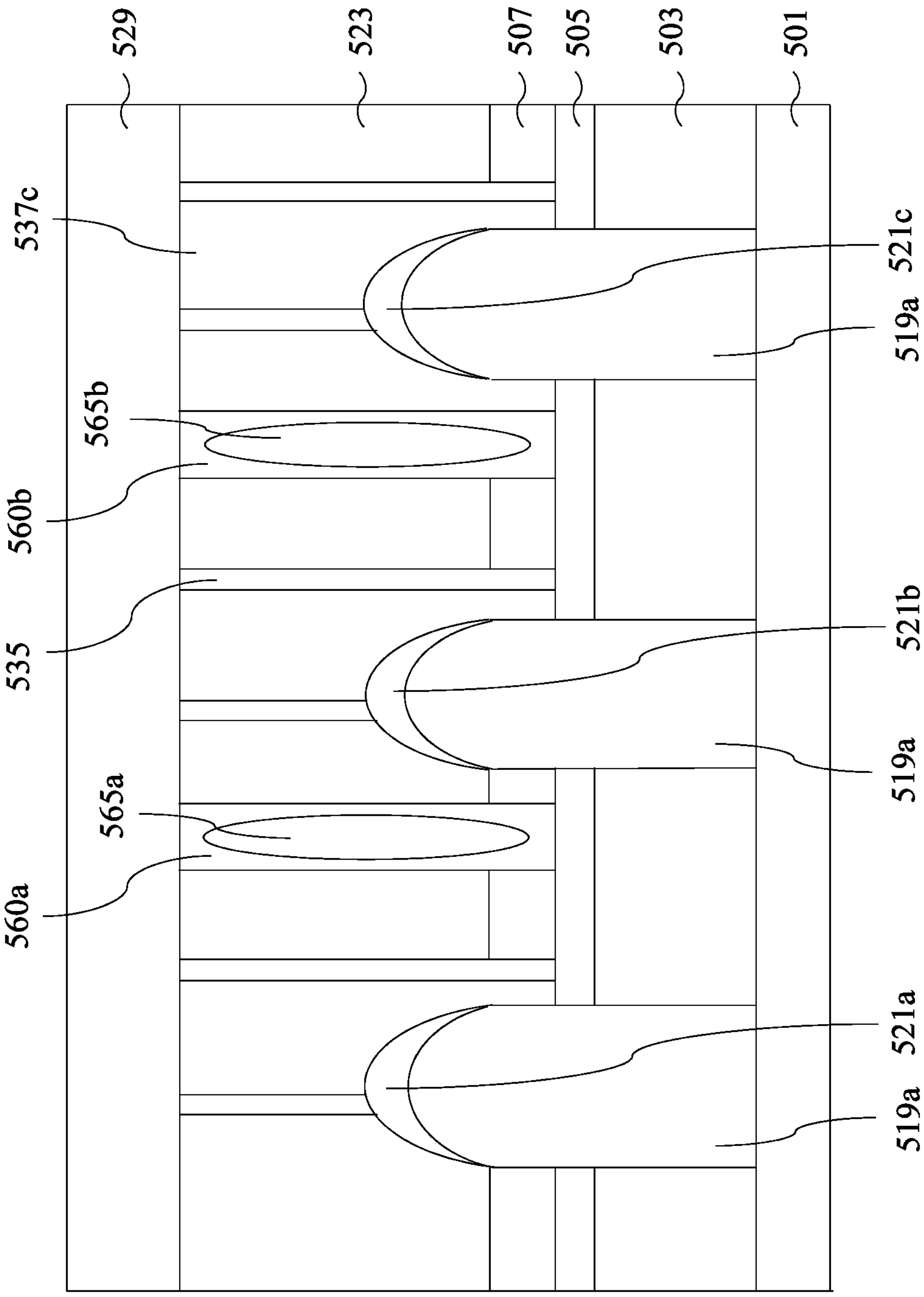

In FIG. 61, a fourth dielectric layer 539 is formed covering the third dielectric layer 523, the energy-removable layers 535, the second metal plug 537*a*, the second metal plug 537*b*, the second metal plug 537*c*, the liner structure 560*a* and the liner structure 560*b*. Some materials and processes used to form the fourth dielectric layer 539 are similar to, or the same as, those used to form the first dielectric layer a, and descriptions thereof are not repeated herein.

After the fourth dielectric layer 539 is formed, the bit lines 550*a*, 550*b*, and 550*c* are formed in the fourth dielectric layer 539. In some embodiments, the bit lines 550*a*, 550*b*, and 550*c* by a photolithography process for defining positions of the bit lines, a deposition position for forming the material of bit lines on the positions defined by the photolithography process, and a CMP process for planarizing the top surface of the bit lines 550*a*, 50*b*, and 550*c*.

After the bit lines 550*a*, 550*b*, and 550*c* are formed, a heat treatment is used to remove the decomposable porogen material of the energy-removable layers 535 to generate pores, and the pores are filled by air such that the air gaps 536*a*1, 536*a*2, 536*b*1, 536*b*2, 536*c*1, 536*c*2 are obtained between the second metal plugs 537*a*, 537*b*, 537*c* and the third dielectric layer 523 as illustrated in FIG. 42*a*.

In some other embodiments, the heat treatment process can be replaced by a light treatment process, an e-beam treatment process, a combination thereof, or another applicable energy treatment process. For example, an ultraviolet (UV) light or laser light may be used to remove the decomposable porogen material of the energy-removable layers 535, such that the air gaps 536*a*1, 536*a*2, 536*b*1, 536*b*2, 536*c*1, 536*c*2 are obtained.

As described previously, since the dielectric constant of air is relatively low, the parasitic capacitance between the second metal plugs 537*a*, 537*b*, 537*c* may be reduced by applying the air gaps (such as air gaps 536*a*1, 536*a*2, 536*b*1, 536*b*2, 536*c*1, 536*c*2, 565*a* and 565*b*) into the semiconductor device 500, thereby improving the operation speed of the semiconductor device 500. In some other embodiments, the energy-removable layers 535 and the air gaps 536*a*1, 536*a*2, 536*b*1, 536*b*2, 536*c*1, 536*c*2 are not formed. In these cases, the second metal plugs 537*a*, 537*b*, 537*c* may be in direct contact with the third dielectric layer 523.

Because the first metal plugs 519*a*, 519*b*, and 519*c* have rounded (or curved) top surfaces TS, the contact areas between the first metal plugs 519*a*, 519*b*, 519*c* and the second metal plugs 537*a*, 537*b*, 537*c* (or the contact areas between the silicide layers 521*a*, 521*b*, 521*c* and the second metal plugs 537*a*, 537*b*, 537*c*) are increased, compared with arrangements in which the first metal plugs have flat top surfaces and the second metal plugs are perfectly aligned with the first metal plugs. The increased contact areas of the rounded top surfaces TS may cause a corresponding decrease of the resistances between the first metal plugs 519*a*, 519*b*, 519*c* and the second metal plugs 537*a*, 537*b*, 537*c*, thereby improving the overall device performance.

Moreover, the electric field strengths on the rounded top surfaces TS of the first metal plugs 519*a*, 519*b*, 519*c* are evenly distributed, since the first metal plugs 519*a*, 519*b*, 519*c* have no sharp portions. Therefore, the lifespan of the semiconductor devices 500 may be extended significantly, and the performance and reliability of the devices may be improved.

Furthermore, because the etch stop layer 505 adjoins sidewalls of the first metal plugs 519*a*, 519*b*, 519*c*, the underlying electronic components can be prevented from being exposed during the processes for forming the second metal plugs 537*a*, 537*b*, 537*c*, and the issues caused by misalignment between the first metal plugs 519*a*, 519*b*, 519*c* and the second metal plugs 537*a*, 537*b*, 537*c* may be prevented or reduced.

In one embodiment of the present disclosure, a semiconductor device is provided. The semiconductor device includes a substrate, a contact, a landing pad, a bit line, and an air gap. The contact is disposed over the substrate. The landing pad is disposed over the contact. The landing pad includes a plug, a first spacer, and a second spacer. The plug is disposed over and in contact with the contact. The first spacer is disposed over the plug. The second spacer is sandwiching a protruding portion of the plug. The bit line is disposed over the substrate. The air gap is disposed between the contact and the bit line.

In another embodiment of the present disclosure, a semiconductor device is provided. The semiconductor device includes a substrate, an etch stop layer, a first lower plug, a second lower plug, a first upper plug, a second upper plug, and an air gap. The etch stop layer is disposed over the substrate. The first lower plug and a second lower plug are disposed over the substrate and protruding from a top surface of the etch stop layer. The first upper plug and a second upper plug are disposed over the first lower plug and the second lower plug, respectively. The air gap is disposed between the first upper plug and the second upper plug. A top surface of the first lower plug is rounded. The first upper plug is in contact with a first sidewall of the first lower plug.

In yet another embodiment of the present disclosure, a method for fabricating a semiconductor device, including: providing a substrate; forming a contact over the substrate; forming a bit line over the substrate; forming a liner structure enclosing an air gap, wherein the liner structure is formed between the contact and the bit line; and forming a landing pad over the contact, comprising: forming a barrier layer; forming a plug in contact with the contact; and forming a first spacer and a second spacer over the plug. The first spacer is disposed over the plug, and the second spacer sandwiches a protruding portion of the plug.

The embodiments of the present disclosure have some advantageous features. In some embodiment, the semiconductor device structure includes a first dielectric liner portion and a second dielectric liner portion disposed adjacent to a first interconnect structure and a second interconnect structure, respectively. The semiconductor device structure also includes a filling portion surrounded by the second dielectric liner portion, and an air gap is enclosed in the first dielectric liner portion, which helps to reduce the capacitive coupling between adjacent interconnect structures, and RC delay can be decreased. As a result, performance and reliability of the semiconductor device structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:

providing a substrate;

forming a contact over the substrate;

forming a bit line over the substrate;

forming a liner structure enclosing an air gap, wherein the liner structure is formed between the contact and the bit line; and forming a landing pad over the contact, comprising:

forming a barrier layer;

forming a plug in contact with the contact;

forming a first spacer and a second spacer over the plug, forming a first insulating film over the substrate;

forming a second insulating film over the first insulating film; and forming a third insulating film over the second insulating film, wherein the bit line is formed in the third insulating film;

wherein the first spacer is disposed over the plug, and the second spacer sandwiches a protruding portion of the plug;

wherein forming the liner structure comprises:

forming a third opening penetrating through the third insulating film and the second insulating film;

depositing a dielectric layer in the third opening and over the contact, wherein the third opening is partially filled with the dielectric layer so as to form the air gap enclosed by the dielectric layer; and partially removing the dielectric layer to form the liner structure.

2. The method of claim 1, wherein the plug is formed within the barrier layer, and the second spacer is formed to be in contact with the barrier layer.

3. The method of claim 2, wherein the second spacer is in contact with the barrier layer, and the second spacer is higher than the first spacer.

4. The method of claim 1, wherein forming the contact comprises:

forming a first opening penetrating the first insulating film, the second insulating film, and the third insulating film;

forming a neck portion of the contact in the first opening;

partially removing the third insulating film to form a second opening over the neck portion; and forming a head portion of the contact in the second opening.

5. The method of claim 4, wherein the head portion is formed to have a curved sidewall, and the head portion is wider than the plug.

6. The method of claim 5, wherein the head portion has tapered profile.

7. The method of claim 1, wherein the dielectric layer is deposited to have a thickness over the contact, wherein two times of the thickness is greater than a width of the third opening.

8. The method of claim 1, further comprising:

forming a fourth insulating film over the contact, the bit line, and the liner structure, wherein the plug is formed in the fourth insulating film.

9. The method of claim 8, wherein forming the landing pad further comprises:

partially remove the fourth insulating film so as to form the protruding portion of the plug.

10. The method of claim 9, wherein forming the first spacer and the second spacer comprises:

depositing a liner layer over the fourth insulating film, the barrier layer, and the protruding portion of the plug; and performing a thermal process to form the first spacer and the second spacer.

11. The method of claim 10, wherein performing the thermal process to form the first spacer and the second spacer comprises an alicidation process.

12. The method of claim 1, wherein the first spacer includes silicide, and the second spacer includes silicide.

* * * * *